(12) United States Patent
Kitagawa et al.

(10) Patent No.: US 8,520,171 B2
(45) Date of Patent: Aug. 27, 2013

(54) OPTICAL DISPLAY DEVICE HAVING POLARIZING FILM

(71) Applicant: Nitto Denko Corporation, Ibaraki (JP)

(72) Inventors: Takeharu Kitagawa, Ibaraki (JP); Shusaku Goto, Ibaraki (JP); Minoru Miyatake, Ibaraki (JP); Tomohiro Mori, Ibaraki (JP); Takashi Kamijo, Ibaraki (JP); Kentaro Yoshida, Ibaraki (JP); Satoru Kunikata, Ibaraki (JP)

(73) Assignee: Nitto Denko Corporation, Ibaraki-shi, Osaka (JP)

( * ) Notice: Subject to any disclaimer, the term of this patent is extended or adjusted under 35 U.S.C. 154(b) by 0 days.

(21) Appl. No.: 13/709,932

(22) Filed: Dec. 10, 2012

(65) Prior Publication Data

US 2013/0100529 A1    Apr. 25, 2013

Related U.S. Application Data

(63) Continuation of application No. 13/225,038, filed on Sep. 2, 2011.

(30) Foreign Application Priority Data

| Sep. 3, 2010 | (JP) | ................. | 2010-197413 |
| Dec. 2, 2010 | (JP) | ................. | 2010-269002 |
| Mar. 25, 2011 | (JP) | ................. | 2011-068512 |

(51) Int. Cl.
*G02F 1/1335* (2006.01)
*G02B 5/30* (2006.01)

(52) U.S. Cl.
USPC ..................... 349/96; 359/487.02

(58) Field of Classification Search
USPC ..................... 349/96; 359/487.02; 428/1.31
See application file for complete search history.

(56) References Cited

U.S. PATENT DOCUMENTS

| 4,659,523 A | 4/1987 | Rogers et al. |
| 4,895,769 A | 1/1990 | Land et al. |

(Continued)

FOREIGN PATENT DOCUMENTS

| JP | 8-12296 | 2/1996 |
| JP | 10288709 | 10/1998 |

(Continued)

OTHER PUBLICATIONS

H.W. Siesler; Rheo-Optical Fourier-Transform Infared Spectroscopy; Advanced Polymeric Science; 1984; pp. 9-15.

(Continued)

*Primary Examiner* — Michael Caley
(74) *Attorney, Agent, or Firm* — Lowe Hauptman & Ham LLP

(57) ABSTRACT

Provided is an optical display device using a polarizing film which has a thickness of 10 μm or less and exhibits high optical characteristics. The optical display device comprises a continuous web of polarizing film which is made of a polyvinyl alcohol type resin having a molecularly oriented dichroic material, and formed through stretching to have a thickness of 10 μm or less and satisfy conditions expressed by the following formulas: $P > -(10^{0.929T-42.4}-1) \times 100$ (where $T < 42.3$); and $P \geq 99.9$ (where $T \geq 42.3$), wherein T is a single layer transmittance, and P is a polarization rate. The polarizing film may be prepared by subjecting a laminate comprising a non-crystallizable ester type thermoplastic resin substrate and a polyvinyl alcohol type resin layer formed on the substrate to by 2-stage stretching consisting of preliminary in-air stretching and in-boric-acid-solution stretching.

20 Claims, 43 Drawing Sheets

200: OPTICAL DISPLAY DEVICE
205: WINDOW
204: PROTECTIVE LAYER
203: FIRST POLARIZING FILM
202: ADHESIVE LAYER
201: OPTICAL DISPLAY PANEL

(56) References Cited

U.S. PATENT DOCUMENTS

| | | |
|---|---|---|
| 7,413,766 B2 | 8/2008 | Satake et al. |
| 7,759,442 B2 | 7/2010 | Okada et al. |
| 8,154,694 B2 | 4/2012 | Bitou et al. |
| 2003/0137732 A1* | 7/2003 | Sugino et al. ............ 359/491 |
| 2004/0095335 A1 | 5/2004 | Oh et al. |
| 2005/0019530 A1 | 1/2005 | Merrill et al. |
| 2005/0073633 A1 | 4/2005 | Satake et al. |
| 2006/0110549 A1 | 5/2006 | Wang et al. |
| 2006/0177606 A1 | 8/2006 | Lo et al. |
| 2007/0128370 A1 | 6/2007 | Takada et al. |
| 2008/0274272 A1 | 11/2008 | Satake et al. |
| 2010/0053510 A1 | 3/2010 | Bitou et al. |
| 2010/0304135 A1 | 12/2010 | Okada et al. |

FOREIGN PATENT DOCUMENTS

| | | |
|---|---|---|
| JP | 2001-343521 | 12/2001 |
| JP | 2002-258269 | 9/2002 |
| JP | 2003-043257 | 2/2003 |
| JP | 2003043257 | 2/2003 |
| JP | 2003279748 | 10/2003 |
| JP | 2004020629 | 1/2004 |
| JP | 2004-078143 | 3/2004 |
| JP | 2004-338379 | 12/2004 |
| JP | 2005-248173 | 9/2005 |
| JP | 2007-171892 | 7/2007 |
| JP | 4279944 | 6/2009 |
| JP | 2009244465 | 10/2009 |
| JP | 2011-002759 | 1/2011 |
| KR | 20040042468 | 5/2004 |
| KR | 20090091743 | 8/2009 |
| KR | 20100075321 | 7/2010 |
| TW | 200630681 | 9/2006 |
| WO | 2011/125958 | 10/2011 |

OTHER PUBLICATIONS

Y. Iwamoto et al.; Improvement of Transmitted Light Efficiency in SH-LCDs Using Quarter-Wave Retardation Films; SID Digest of Tech. Papers; 2000; pp. 902-905.

Kenji Matsuhiro; "Xpol and its Application to 3D-TV"; Ekisho; vol. 14; No. 4, 2010; pp. 219-232 (17 pages total).

Hiroyuki Mori et al.; "Development of WideView SA, a film product Widening the Viewing Angle of LCDs"; Fujifilm Research & Development (No. 46-2001); pp. 51-55 (7 pages total).

European Office Action for 11 179 959.9 dated Oct. 25, 2012.

Partial European Search Report for 11179959 dated Dec. 6, 2011.

Official Action and International Search Report issued Jul. 10, 2012 for Taiwanese Patent Application No. 100131728.

Korean Office Action for 10-2011-0088898 dated Oct. 25, 2012.

Korean Office Action for application No. 10-2011-08898 issued on Apr. 25, 2013, citing the above reference(s).

* cited by examiner

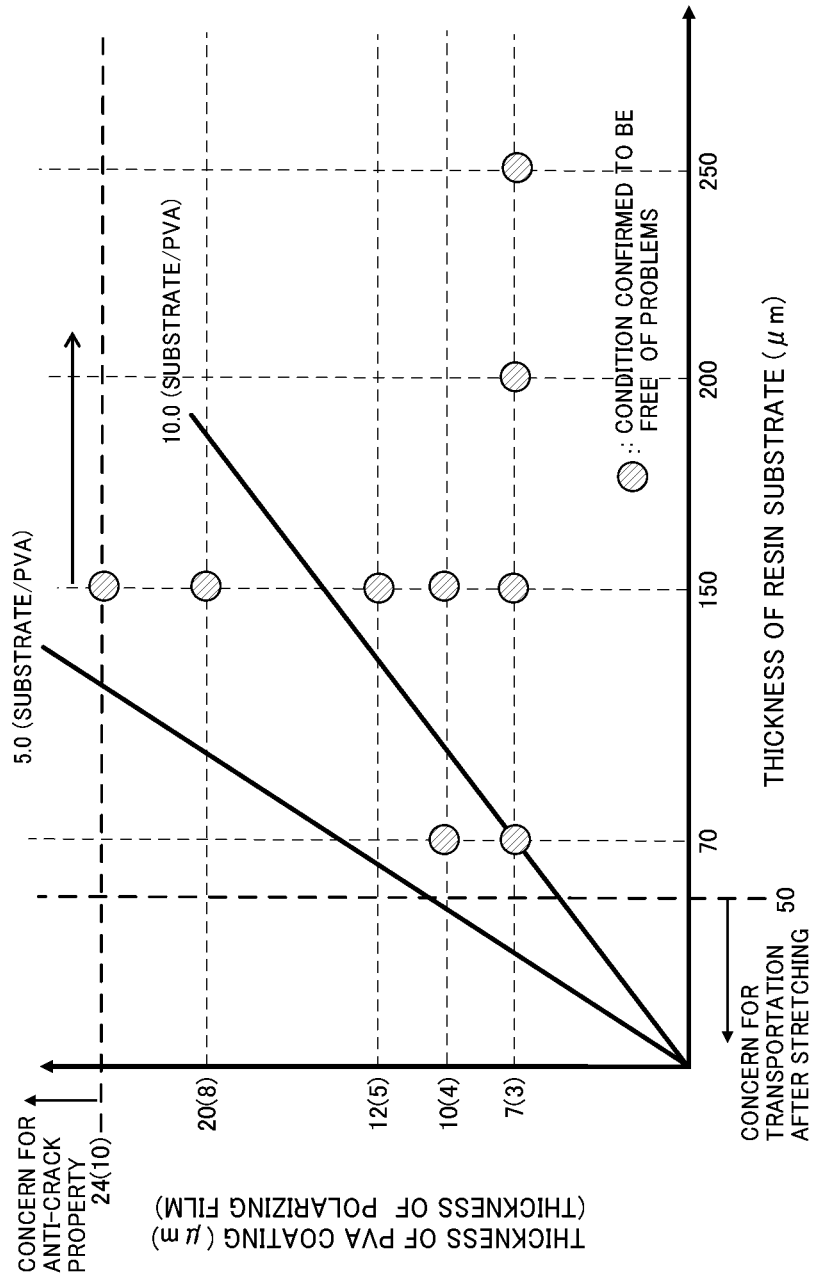

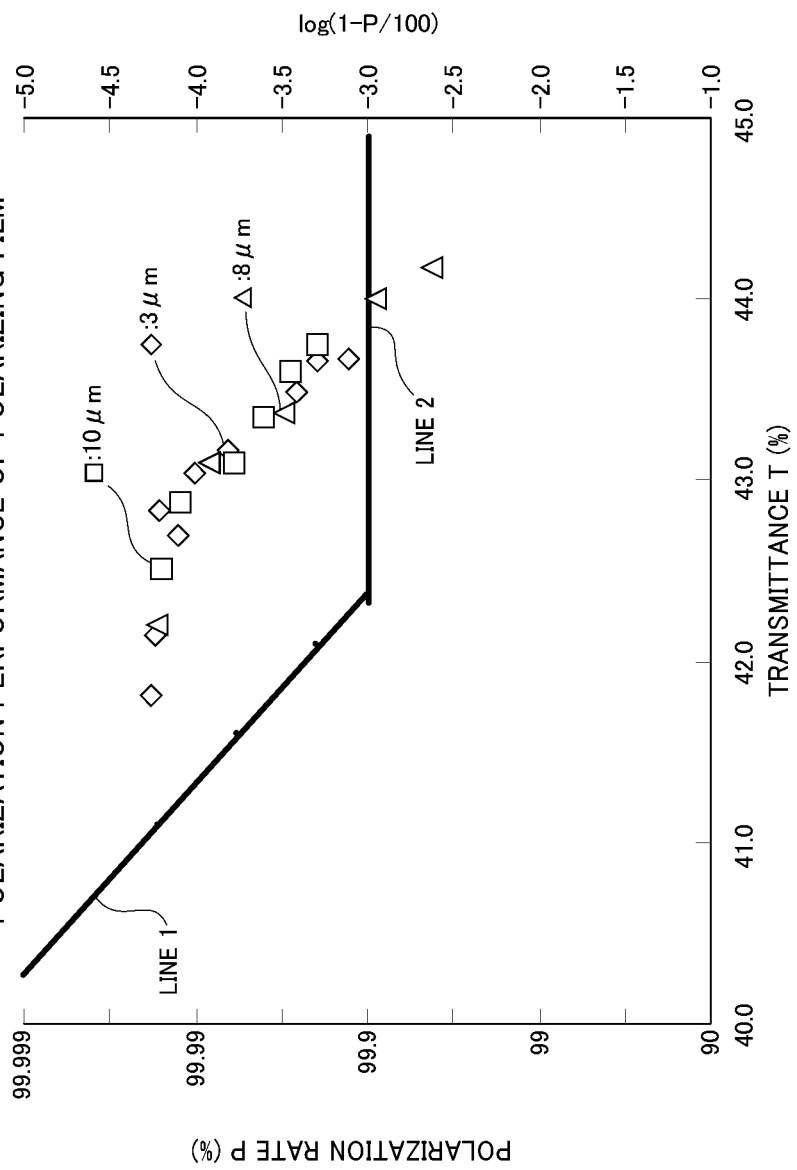

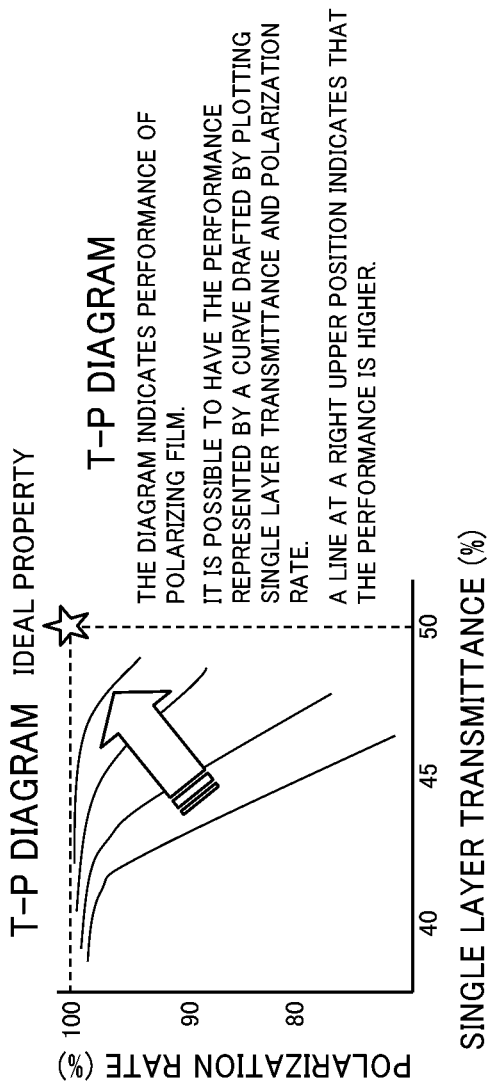

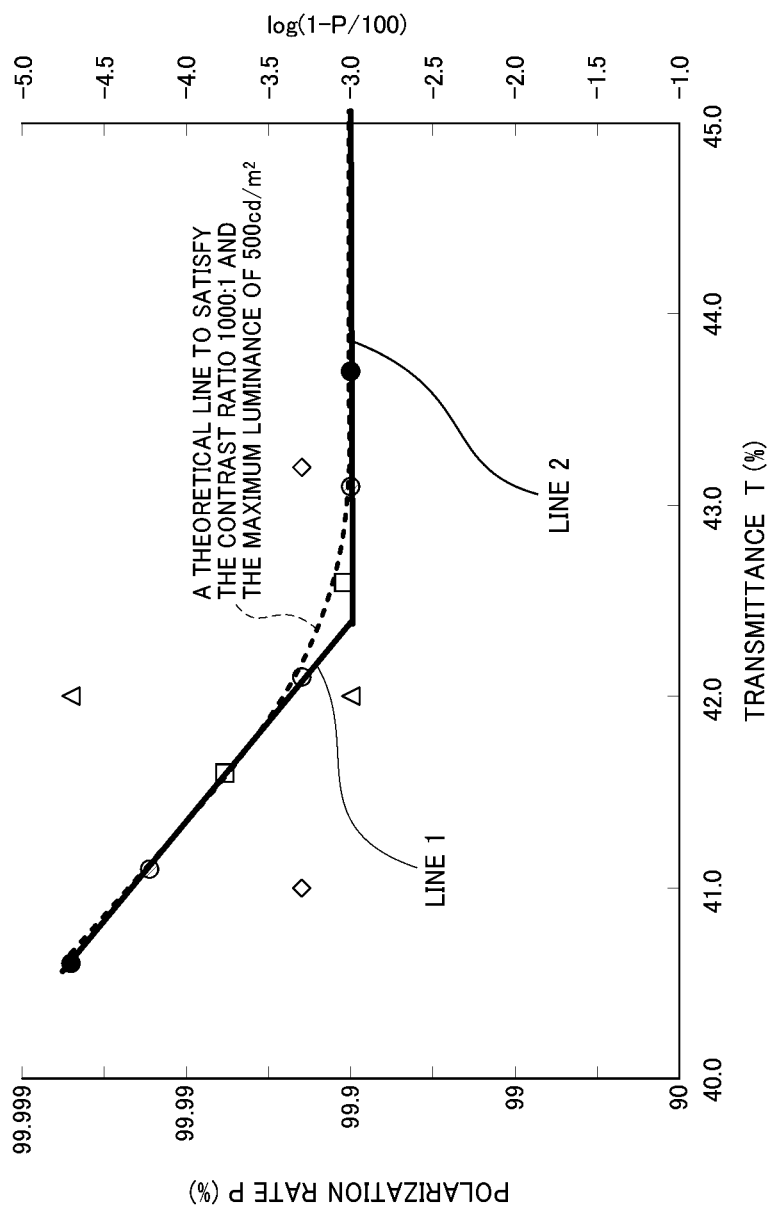

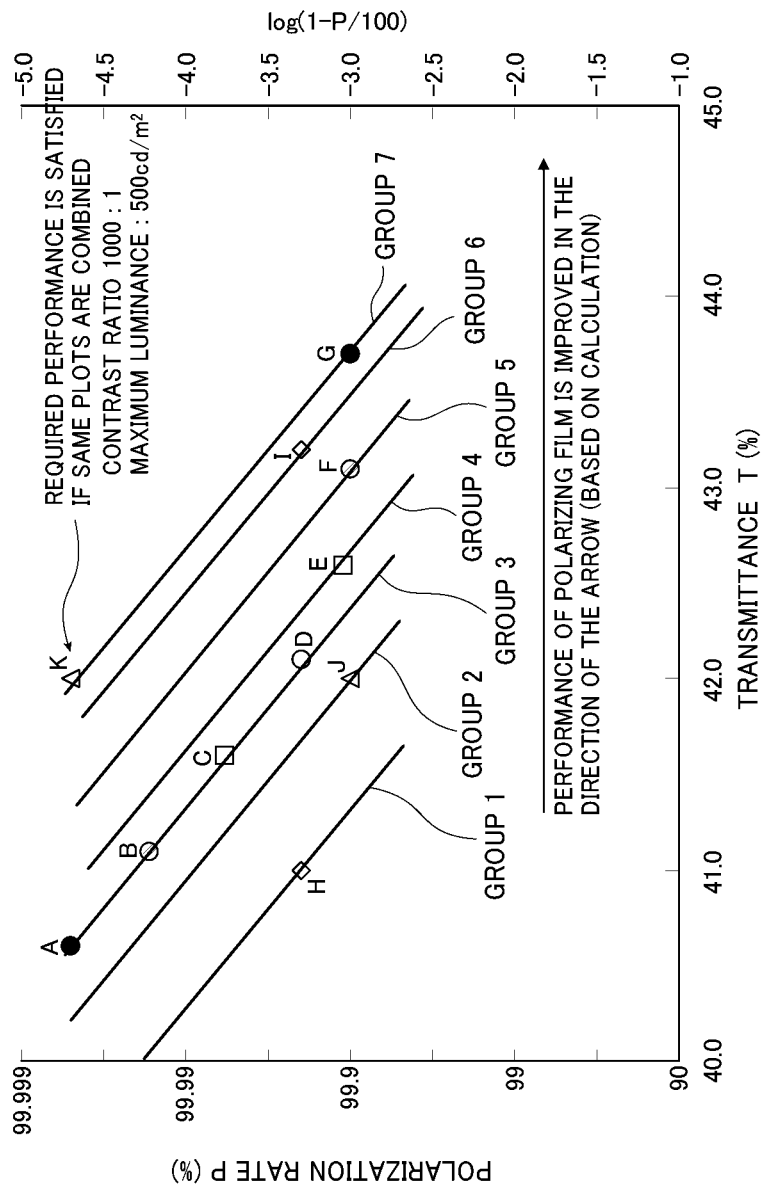

FIG.6

| CONDITIONS | IODINE CONCENTRATION IN DYEING POOL (wt%) | | | | |
|---|---|---|---|---|---|
| | 0.10 | 0.15 | 0.20 | 0.25 | 0.30~ |
| EXPERIMENTAL RESULTS | × PVA DISSOLVED IN DYEING POOL | × PVA DISSOLVED IN DYEING POOL | × PVA DISSOLVED IN DYEING POOL | × PVA DISSOLVED IN DYEING POOL | ○ PVA NOT DISSOLVED |

⟨ CONDITIONS FOR EXPERIMENT ⟩

※ RESIN SUBSTRATE : ISOPHTHALIC ACID COPOLYMERIZED PET

※ THICKNESS OF PVA TYPE RESIN LAYER : 7 μm

※ CONDITIONS FOR ELEVATED TEMPERATURE IN-AIR STRETCHING : STRETCHING TEMPERATURE 130°C, STRETCHING RATIO 1.8

※ WITHOUT FIRST INSOLUBILIZATION PROCESS

※ CONDITIONS FOR DYEING PROCESS : SOLUTION TEMPERATURE 30°C, IODINE CONCENTRATION 0.1wt% ~ 1.0wt%

※ WITH CROSS-LINKING PROCESS INCLUDING SECOND INSOLUBILIZATION

※ CONDITIONS FOR IN-BORIC ACID SOLUTION STRETCHING : SOLUTION TEMPERATURE 75°C, STRETCHING RATIO 3.3

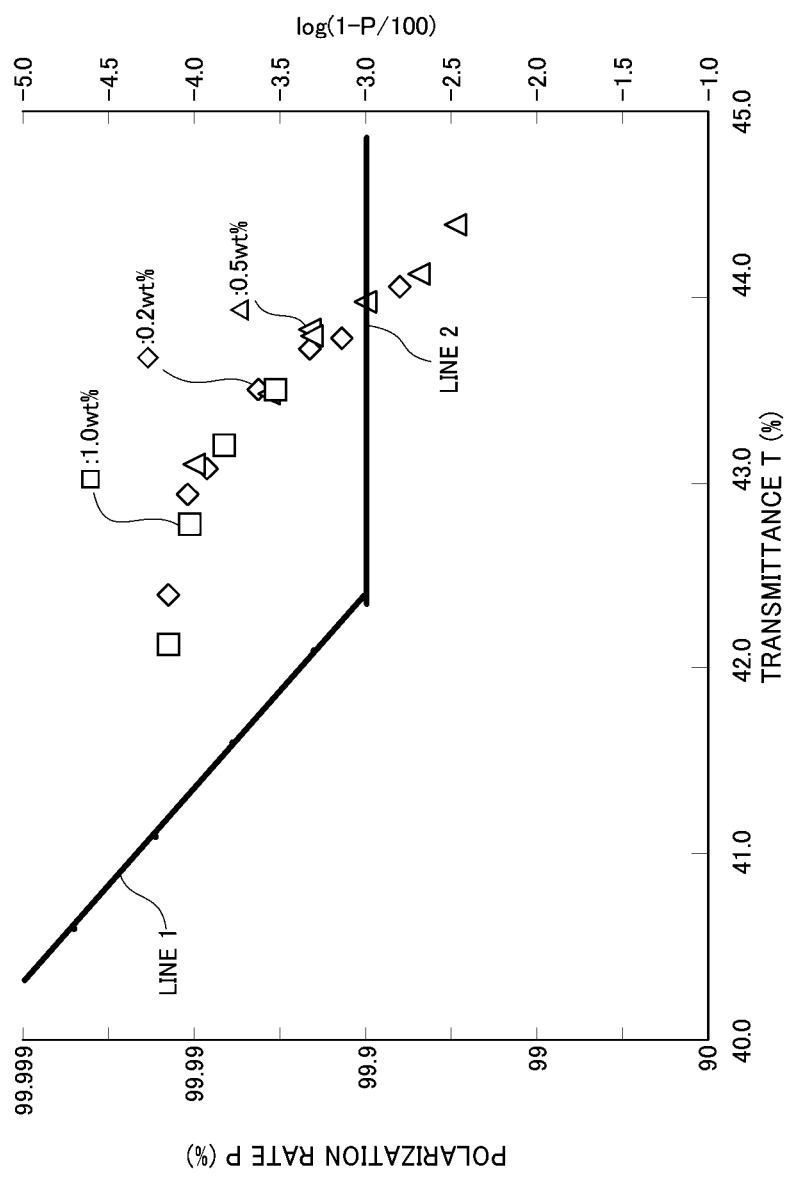

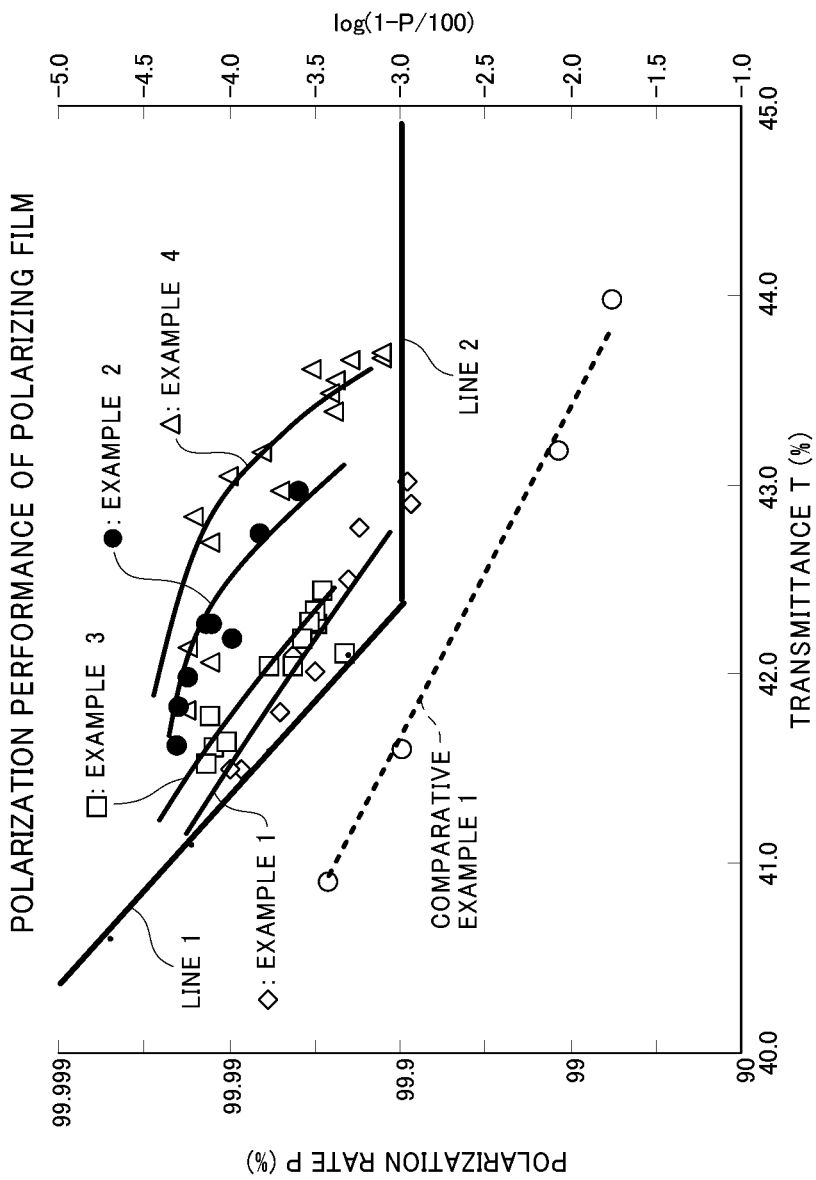

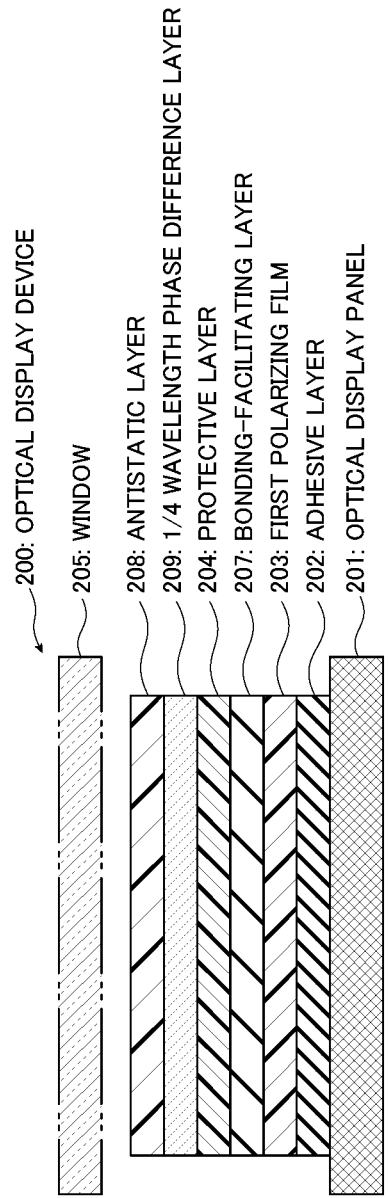

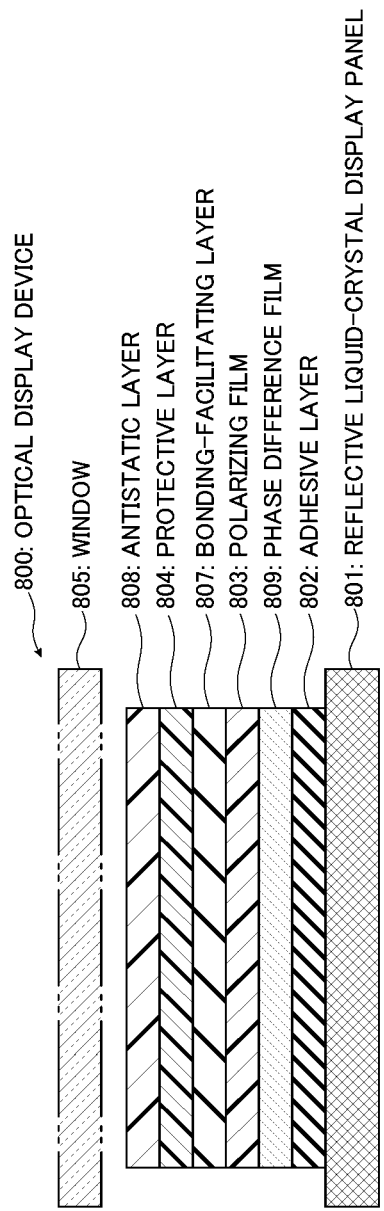

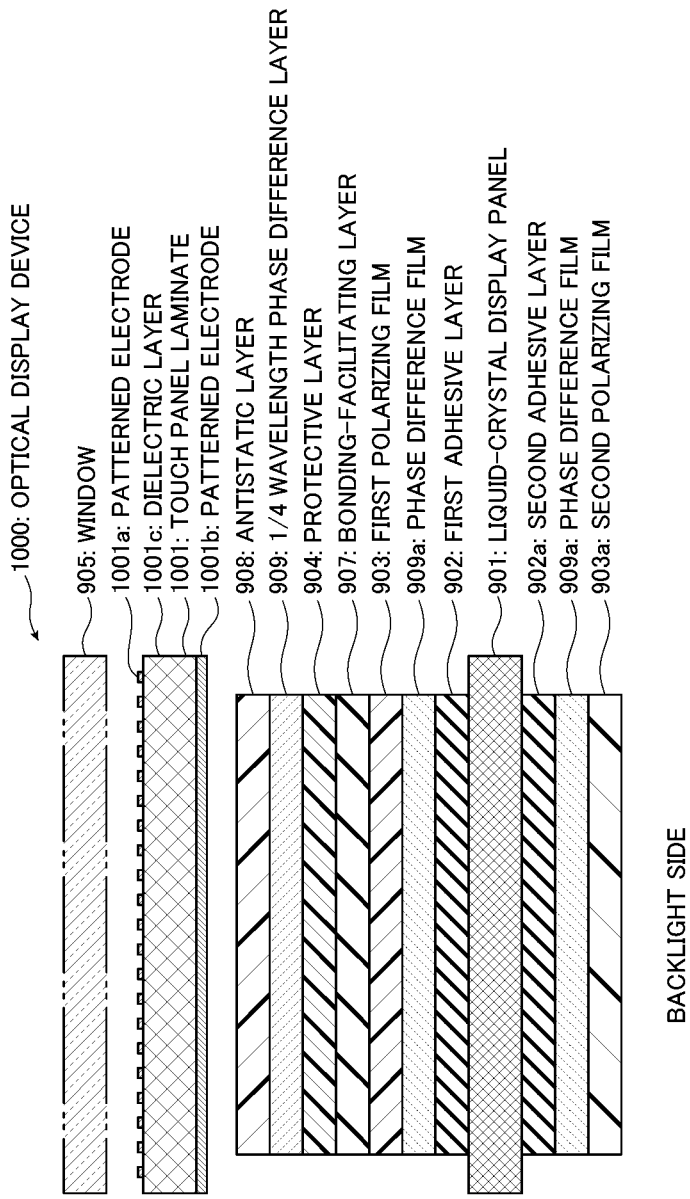

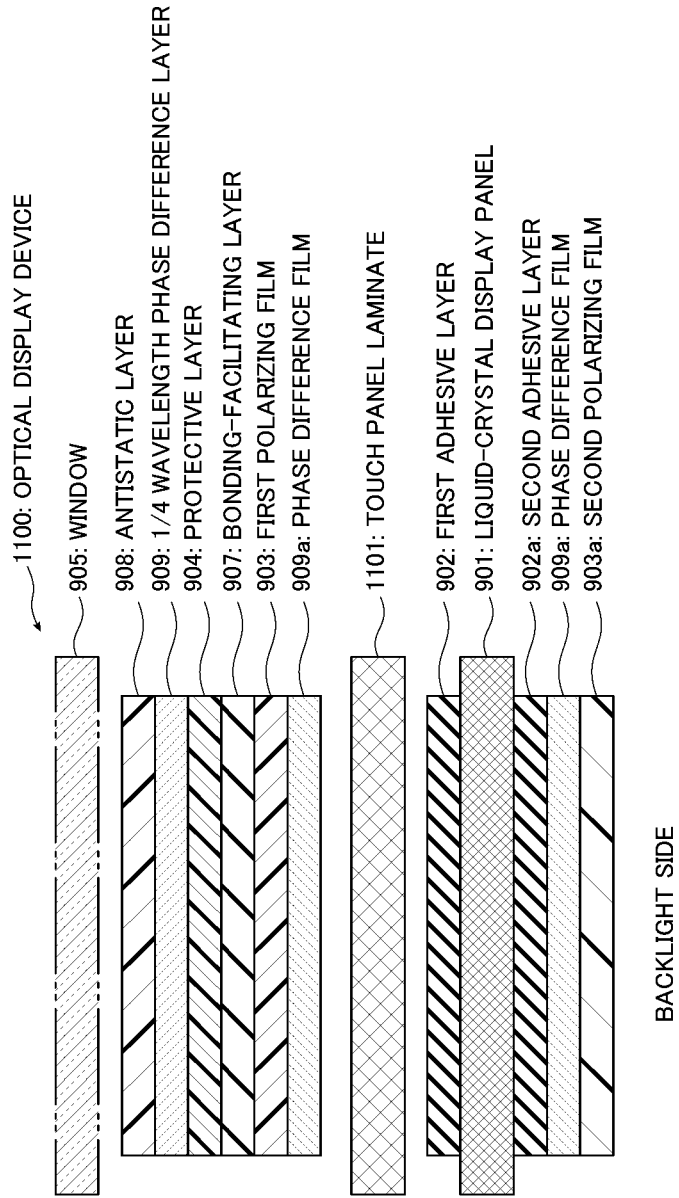

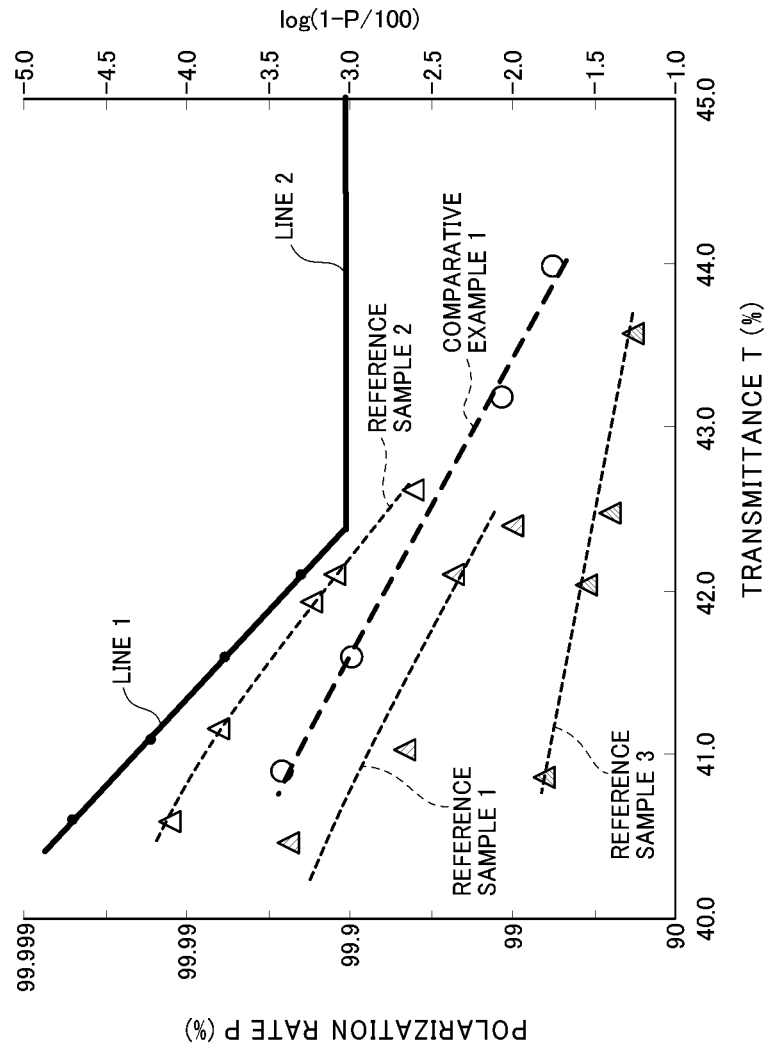

FIG.27

| EXAMPLE NO. | VARIATION | COPOLYMERIZED PET SUBSTRATE | THICKNESS OF PVA (μm) | HIGH TEMPERATURE MIDAIR STRETCHING TEMPERATURE (°C) | HIGH TEMPERATURE MIDAIR STRETCHING RATIO | HIGH TEMPERATURE MIDAIR STRETCHING METHOD | HIGH TEMPERATURE MIDAIR STRETCHING WIDTH AFTER/BEFORE STRETCHING (%) | THICKNESS OF PVA (μm) | FIRST INSOLUBILIZATION | IODIDE CONCENTRATION IN DYEING PROCESS (wt%) | SECOND INSOLUBILIZATION | IN-BORIC ACID SOLUTION STRETCHING TEMPERATURE (°C) | IN-BORIC ACID SOLUTION STRETCHING RATIO | TOTAL STRETCHING RATIO | THICKNESS OF POLARIZER (μm) |
|---|---|---|---|---|---|---|---|---|---|---|---|---|---|---|---|
| 1 | INSOLUBILIZATION PROCESS | ISOPHTHALIC ACID | 7 | 130 | 1.8 | END-FREE | 65 | 5 | W/O | 0.3 | W/O | 65 | 3.3 | 5.94 | 3 |
| 2 | INSOLUBILIZATION PROCESS | ISOPHTHALIC ACID | 7 | 130 | 1.8 | END-FREE | 65 | 5 | W/O | 0.3 | WITH | 75 | 3.3 | 5.94 | 3 |
| 3 | REFERENCE | ISOPHTHALIC ACID | 7 | 130 | 1.8 | END-FREE | 65 | 5 | WITH | 0.12-0.25 | W/O | 65 | 3.3 | 5.94 | 3 |
| 4 | REFERENCE | ISOPHTHALIC ACID | 7 | 130 | 1.8 | END-FREE | 65 | 5 | WITH | 0.12-0.25 | WITH | 75 | 3.3 | 5.94 | 3 |
| 5 | THICKNESS | ISOPHTHALIC ACID | 12 | 130 | 1.8 | END-FREE | 65 | 9 | WITH | 0.12-0.25 | WITH | 75 | 3.3 | 5.94 | 5 |
| 6 | SUBSTRATE | CHDM | 7 | 130 | 1.8 | END-FREE | 65 | 5 | WITH | 0.12-0.25 | WITH | 75 | 3.3 | 5.94 | 3 |
| 7 | HIGH TEMPERATURE MIDAIR STRETCHING RATIO | ISOPHTHALIC ACID | 7 | 130 | 1.2 | END-FREE | 85 | 6 | WITH | 0.12-0.25 | WITH | 75 | 4.9 | 5.88 | 3 |
| 8 | HIGH TEMPERATURE MIDAIR STRETCHING RATIO | ISOPHTHALIC ACID | 7 | 130 | 1.5 | END-FREE | 75 | 6 | WITH | 0.12-0.25 | WITH | 75 | 4.0 | 6.0 | 3 |
| 9 | HIGH TEMPERATURE MIDAIR STRETCHING RATIO | ISOPHTHALIC ACID | 7 | 130 | 2.5 | END-FREE | 55 | 4 | WITH | 0.12-0.25 | WITH | 75 | 2.4 | 6.0 | 3 |
| 10 | HIGH TEMPERATURE MIDAIR STRETCHING TEMPERATURE | ISOPHTHALIC ACID | 7 | 95 | 1.8 | END-FREE | 75 | 5 | WITH | 0.12-0.25 | WITH | 75 | 3.3 | 5.94 | 3 |

FIG.28

| | | | | HIGH TEMPERATURE MIDAIR STRETCHING TEMPERATURE | | | IN-BORIC ACID SOLUTION STRETCHING RATIO | | FIXED-END STRETCHING RATIO | | | | |
|---|---|---|---|---|---|---|---|---|---|---|---|---|---|
| 11 | ISOPHTHALIC ACID | 7 | 110 | 1.8 | END-FREE | 70 | 5 | WITH | 0.12-0.25 | WITH | 75 | 3.3 | 5.94 | 3 |
| 12 | ISOPHTHALIC ACID | 7 | 150 | 1.8 | END-FREE | 65 | 5 | WITH | 0.12-0.25 | WITH | 75 | 3.3 | 5.94 | 3 |
| 13 | ISOPHTHALIC ACID | 7 | 130 | 1.8 | END-FREE | 65 | 5 | WITH | 0.12-0.25 | WITH | 75 | 2.8 | 5.04 | 3 |
| 14 | ISOPHTHALIC ACID | 7 | 130 | 1.8 | END-FREE | 65 | 5 | WITH | 0.12-0.25 | WITH | 75 | 3.1 | 5.58 | 3 |
| 15 | ISOPHTHALIC ACID | 7 | 130 | 1.8 | END-FREE | 65 | 5 | WITH | 0.12-0.25 | WITH | 75 | 3.6 | 6.48 | 3 |
| 16 | ISOPHTHALIC ACID | 7 | 130 | 1.8 | END-FIXED | 100 | 4 | WITH | 0.12-0.25 | WITH | 75 | 3.3 | 5.94 | 2 |
| 17 | ISOPHTHALIC ACID | 7 | 130 | 1.8 | END-FIXED | 100 | 4 | WITH | 0.12-0.25 | WITH | 75 | 3.9 | 7.02 | 2 |
| 18 | ISOPHTHALIC ACID | 7 | 130 | 1.8 | END-FIXED | 100 | 4 | WITH | 0.12-0.25 | WITH | 75 | 4.4 | 7.92 | 2 |

FIG.29

| EXAMPLE NO. | COPOLYMERIZED PET SUBSTRATE | HIGH TEMPERATURE MIDAIR STRETCHING | | ORIENTATION FUNCTION OF PET |
|---|---|---|---|---|
| | | TEMPERATURE (°C) | STRETCHING RATIO | |
| EXAMPLE 1 | ISOPHTHALIC ACID | 130 | 1.8 | 0.02 |
| EXAMPLE 2 | ISOPHTHALIC ACID | 130 | 1.8 | 0.01 |
| EXAMPLE 3 | ISOPHTHALIC ACID | 130 | 1.8 | 0.01 |
| EXAMPLE 4 | ISOPHTHALIC ACID | 130 | 1.8 | 0.01 |
| EXAMPLE 5 | ISOPHTHALIC ACID | 130 | 1.8 | 0.01 |
| EXAMPLE 6 | CHDM | 130 | 1.8 | 0.01 |
| EXAMPLE 7 | ISOPHTHALIC ACID | 130 | 1.2 | 0.01 |
| EXAMPLE 8 | ISOPHTHALIC ACID | 130 | 1.5 | 0.01 |
| EXAMPLE 9 | ISOPHTHALIC ACID | 130 | 2.5 | 0.01 |
| EXAMPLE 10 | ISOPHTHALIC ACID | 95 | 1.8 | 0.10 |
| EXAMPLE 11 | ISOPHTHALIC ACID | 110 | 1.8 | 0.05 |
| EXAMPLE 12 | ISOPHTHALIC ACID | 150 | 1.8 | 0.01 |
| EXAMPLE 13 | ISOPHTHALIC ACID | 130 | 1.8 | 0.01 |
| EXAMPLE 14 | ISOPHTHALIC ACID | 130 | 1.8 | 0.01 |
| EXAMPLE 15 | ISOPHTHALIC ACID | 130 | 1.8 | 0.01 |
| EXAMPLE 16 | ISOPHTHALIC ACID | 130 | 1.8 | 0.01 |
| EXAMPLE 17 | ISOPHTHALIC ACID | 130 | 1.8 | 0.01 |
| EXAMPLE 18 | ISOPHTHALIC ACID | 130 | 1.8 | 0.01 |

| REFERENCE SAMPLE NO. | THERMOPLASTIC RESIN SUBSTRATE | HIGH TEMPERATURE MIDAIR STRETCHING | | ORIENTATION FUNCTION OF PET |
|---|---|---|---|---|
| | | TEMPERATURE (°C) | STRETCHING RATIO | |
| REFERENCE SAMPLE 1 | CRYSTALLIZABLE PET | 110 | 4.0 | 0.51 |
| REFERENCE SAMPLE 2 | CRYSTALLIZABLE PET | 100 | 4.5 | 0.78 |
| REFERENCE SAMPLE 3 | CRYSTALLIZABLE PET | 90 | 4.5 | 0.79 |

OPTICAL DISPLAY DEVICE HAVING POLARIZING FILM

CROSS REFERENCE TO RELATED APPLICATION

This application is a Continuation of patent application Ser. No. 13/225,038, filed on Sep. 2, 2011, which claims the priority of Japanese Patent Application No. 2010-197413 filed on Sep. 3, 2010, Japanese Patent Application No. 2010-269002 filed on Dec. 2, 2010, and Japanese Patent Application No. 2011-068512 filed on Mar. 25, 2011 in the JPO (Japan Patent Office), the disclosure of which is incorporated herein in their entirety by reference.

TECHNICAL FIELD

The present invention relates to an optical display device having a polarizing film. In particular, the present invention relates to an optical display device having a polarizing film comprised of a polyvinyl alcohol type resin including a dichroic material impregnated therein in a molecularly oriented state, and has a thickness of 10 μm or less.

BACKGROUND ART

There has been widely known a method in which a single layer made of a polyvinyl alcohol type resin (hereinafter referred to as "PVA type resin") and formed in a film shape is subjected to dyeing and stretching to produce a polarizing film comprising a PVA type resin layer, wherein molecules of the PVA type resin are oriented in a direction of the stretching, and a dichroic material is impregnated in the PVA type resin in a molecularly oriented state. The polarizing film to be obtained by the above conventional method using a PVA type resin single layer film usually has a thickness in the range of about 15 to 35 μm. The conventional method makes it possible to obtain a polarizing film having the optical characteristics of a single layer transmittance of 42% or more; and a polarization rate of 99.95% or more. Currently, polarizing films produced by the conventional method are used in optical display devices for televisions, and other appliances.

It should however be noted that a PVA type resin is hydrophilic and highly hygroscopic, so that a polarizing film produced using the PVA type resin is sensitive to changes in temperature and humidity, and more likely to expand and contract due to changes in surrounding environments and is liable to be subjected to occurrence of cracks. Moreover, the expansion and contraction caused by environmental changes during use will produce stress applied to an adjacent member to which the polarizer film is joined, and thereby cause deformation, such as warp, in the adjacent member.

Thus, in order to suppress such expansion and contraction of a polarizer film to thereby reduce the influence of changes in temperature and humidity, it has been a usual practice to employ, in the case of a polarizing film for use in televisions, a laminate prepared by laminating a triacetylcellulose (TAC) film having a thickness of 40 to 80 μm and serving as a protection film, on each of opposite surfaces of a polarizing film. However, even in such a structure, in cases where a single layer polarizing film is used therein, because of a limit in reducing the thickness of the polarizing film, expansion and contraction forces produced in the polarizing film are of a level which cannot be ignored, so that it is difficult to completely avoid the influence of expansion and contraction of the polarizing film, and a certain level of expansion and contraction will inevitably occur in the optical film laminate including the polarizing film. If expansion or contraction occurs in such an optical film laminate including a polarizing film, stress arising from the expansion or contraction will cause deformation, such as warp, in an adjacent member. This deformation, even if it is small, leads to the occurrence of non-uniformity of display in a liquid-crystal display device. Thus, in order to suppress the occurrence of non-uniformity of display, it is necessary to make design considerations, for example, to carefully select a material for each member to be used in the optical film laminate including the polarizing film. Further, the stress produced by the contraction of the polarizing film will cause the optical film laminate being peeled off the liquid-crystal display panel, so that there will be a need to use an adhesive having a high adhesive power to join the optical film laminate to the liquid-crystal display panel. However, the use of such a high-power adhesive gives rise to a problem of difficulty in re-working which is an operation of, when the presence of an optical defect is found in a polarizing film of an optical film laminate laminated to a liquid-crystal display panel through a subsequent inspection, peeling the optical film laminate from the liquid-crystal display panel and laminating another optical film laminate to the liquid-crystal display panel. This is a technical problem encountered in a polarizing film produced by the conventional method using a single layer of a PVA type resin formed in a film shape.

Thus, there is a need for a new method of producing a polarizing film, as an alternative to the conventional polarizing film production method using a PVA type resin single layer, which is incapable of reducing the thickness of a polarizing film to a sufficient level due to the aforementioned problem. Specifically, it is practically impossible to produce a polarizing film having a thickness of 10 μm or less by the conventional method using a PVA type resin single layer formed in a film shape. This is because, in producing a polarizing film using a single layer of a film-shaped PVA type resin, if the thickness of the PVA type resin single layer is excessively reduced, dissolution and/or breaking is likely to occur in the PVA type resin layer in the dyeing step and/or the stretching step, so that it becomes impossible to form a polarizing film having a uniform thickness.

In order to cope with this problem, there has been proposed a method designed such that a PVA type resin layer is applied and formed on a thermoplastic resin substrate, and the PVA type resin layer formed on the resin substrate is stretched together with the resin substrate, and subjected to dyeing, so as to produce a polarizing film significantly thinner than the polarizing film obtained by the conventional method. This polarizing film production method using a thermoplastic resin substrate is noteworthy in that it provides a possibility of producing a polarizing film more uniformly than the polarizing film production method using a PVA type resin single layer.

For example, Japanese Patent JP 4279944B (Patent Document 1) discloses a polarizing plate production method which comprises steps of forming a polyvinyl alcohol resin layer having a thickness of 6 μm to 30 μm, on one of opposite surfaces of a thermoplastic resin film by a coating process, stretching the polyvinyl alcohol resin layer at a stretching ratio of 2.0 to 5.0 in such a manner that the polyvinyl alcohol resin layer is formed as a transparent coating element layer to thereby form a composite film consisting of two layers, the thermoplastic resin film and the transparent coating element layer; laminating an optical transparent resin film layer on the side of the transparent coating element layer of the composite film consisting of the two layers, through a bonding agent, peeling and removing the thermoplastic resin film, and dyeing and fixing the transparent coating element layer in such a manner that the transparent coating element layer is formed as a polarizing element layer. A polarizing plate to be obtained by this method has a two-layer structure consisting of the optical transparent resin film layer and the polarizing element layer. According to the description of the Patent Document 1, the polarizing element has a thickness of 2 to 4 µm.

The method disclosed in the Patent Document 1 is designed to perform stretching under an elevating temperature by a uniaxial stretching process, wherein the stretching ratio is restricted to the range of 2.0 to 5.0, as mentioned above. As for the reason why the stretching ratio is restricted to 5.0 or less, the Patent Document 1 explains that stretching at a high stretching ratio of greater than 5.0 makes it extremely difficult to maintain stable production. Specifically, there is described that the ambient temperature during stretching is set to 55° C. in cases where ethylene-vinyl acetate copolymer is used as the thermoplastic resin film, to 60° C. in cases where non-stretched polypropylene is used as the thermoplastic resin film, or to 70° C. in cases where non-stretched nylon is used as the thermoplastic resin film. The method disclosed in the Patent Document 1 employs a uniaxial stretching process in air under an elevated temperature. Further, as described in the Patent Document 1, the stretching ratio is restricted to 5.0 or less. Thus, a polarizing film having an extremely small thickness of 2 to 4 µm, to be obtained by this method, is not enough to satisfy optical characteristics desired for a polarizing film to be used, for example, in an optical display device such as a liquid-crystal television.

The method of forming a polarizing film with steps of forming a PVA type resin layer on a thermoplastic resin substrate by a coating process, and stretching the PVA type resin layer together with the substrate is also disclosed in Japanese Patent Laid-Open Publication JP 2001-343521A (Patent Document 2) and Japanese Patent Laid-Open Publication JP 2003-043257A (Patent Document 3). The methods disclosed in the Patent Documents 2 and 3 are designed such that a laminate consisting of a thermoplastic resin substrate and a PVA type resin layer applied on the substrate is subjected to uniaxial stretching at a temperature of 70° C. to 120° C., in cases where the substrate is made of a non-crystallizable polyester resin. Then, the PVA type resin layer molecularly oriented by the stretching is subjected to dyeing to allow a dichroic material to be impregnated therein. In the Patent Document 2, there is described that the uniaxial stretching may be longitudinal uniaxial stretching or may be transverse uniaxial stretching. Differently, in the Patent Document 3, a method is described in which transverse uniaxial stretching is performed, and, during or after the transverse uniaxial stretching, contracting the length in a direction perpendicular to a direction of the stretching by a specific amount. In both of the Patent Documents 2 and 3, there is described that the stretching ratio is typically set to about 4.0 to 8.0. Further, there is described that the thickness of a polarizing film to be obtained is in the range of 1 to 1.6 µm.

In the Patent Documents 2 and 3, although there is described that the stretching ratio is typically set to 4.0 to 8.0, since the Patent Documents 2 and 3 adopts an elevated temperature in-air stretching process, it is considered that the stretching ratio will be limited to 5 as described, for example, in the Patent Document 1. None of the Patent Documents 2 and 3 describes a specific technique for achieving a stretching ratio of greater than 5.0 by the elevated temperature in-air stretching process. In fact, in Examples described in the Patent Documents 2 and 3, only a stretching ratio of 5.0 and a stretching ratio of 4.5 are described, respectively. Through additional tests on the methods disclosed in the Patent Documents 2 and 3, the inventors of the present invention have ascertained that it is impossible to adequately perform stretching at a stretching ratio of greater than 5.0 by the methods disclosed therein. Therefore, it should be understood that only a stretching ratio of 5.0 or less is substantially disclosed in the Patent Documents 2 and 3. As with the Patent Document 1, the polarizing film to be obtained by the method disclosed in each of the Patent Documents 2 and 3 is not enough to satisfy optical characteristics desired for a polarizing film to be used, for example, in an optical display device such as a liquid-crystal television, etc.

U.S. Pat. No. 4,659,523 (Patent Document 4) discloses a polarizing film production method which comprises subjecting a PVA type resin layer coated on a polyester film to uniaxial stretching together with the polyester film. This method disclosed in the Patent Document 4 is intended to form the polyester film serving as a substrate of the PVA type resin layer in such a manner as to have optical characteristics allowing the polyester film to be used together with a polarizing film, but it is not intended to produce a polarizing film comprising a PVA type resin layer and having a small thickness and excellent optical characteristic. Specifically, the method disclosed in the Patent Document 4 is no more than a technique of improving optical characteristics of a polyester resin film to be stretched together with a PVA type resin layer to be formed as a polarizing film. A polarizer material production method having the same object is also disclosed in Japanese Patent Publication JP 08-012296B (Patent Document 5).

LIST OF PRIOR ART DOCUMENTS

Patent Documents

Patent Document 1: Japanese Patent JP 4279944B
Patent Document 2: Japanese Laid-Open Patent Publication JP 2001-343521A
Patent Document 3: Japanese Laid-Open Patent Publication JP 2003-043257A
Patent Document 4: U.S. Pat. No. 4,659,523
Patent Document 5: Japanese Patent Publication JP 08-012296B
Patent Document 6: Japanese Laid-Open Patent Publication JP 2002-258269A
Patent Document 7: Japanese Laid-Open Patent Publication JP 2004-078143A
Patent Document 8: Japanese Laid-Open Patent Publication JP 2007-171892A
Patent Document 9: Japanese Laid-Open Patent Publication JP 2004-338379A
Patent Document 10: Japanese Laid-Open Patent Publication JP 2005-248173A
Patent Document 11: Japanese Laid-Open Patent Publication JP 2011-002759A Non-Patent Documents Non-Patent Document 1: K. Matsuhiro, "Xpol and its application to 3D-TV", "EKISHO", Vol. 14, No. 4, 2010, pp 219-232
Non-Patent Document 2: Y. Mori, et al., "Development of FUJI FILM WV Film Wide View SA", FUJIFILM RESEARCH & DEVELOPMENT (No. 46-2001), pp 51-55
Non-Patent Document 3: Y. Iwamoto, et al., "Improvement of Transmitted Light Efficiency in SH-LCDs Using Quarter-Wave Retardation Films", SID Digest of Tech. Papers, 2000, pp 902-905
Non-Patent Document 4: H, W. Siesler, Adv. Polym. Sci., 65, 1 (1984)

DISCLOSURE OF THE INVENTION

Problem to be Solved by the Invention

As disclosed in the Patent Documents 1 to 5, a method has already been known in which a PVA type resin layer is formed on a thermoplastic resin substrate by a coating process, and the PVA type resin layer is stretched together with the thermoplastic resin substrate to produce a polarizing film. However, it has not been practically realized to obtain a highly-functional polarizing film usable in a display device satisfying the optical characteristics of a contrast ratio of 1000:1 or more, and a maximum luminance (brightness) of 500 cd/m$^2$ or more, which are required for a display device, typically, for liquid-crystal televisions.

It is therefore an object of the present invention to provide an optical display device having a polarizing film which is extremely thin as compared with conventional polarizing films, and capable of achieving the required optical characteristics.

Means for Solving the Problem

The inventors have successfully obtained a novel polarizing film by stretching a non-crystallizable ester type thermoplastic resin substrate and a PVA type resin layer applied and formed on the substrate together through 2-stage stretching consisting of preliminary in-air stretching and in-boric-acid-solution stretching, and subjecting the PVA type resin layer to dyeing using a dichroic dyeing material, wherein the polarizing film has a thickness of 10 μm or less, and optical characteristics of the polarizing film represented by a single layer transmittance T and a polarization rate P can satisfy characteristics required for polarizing films for use in optical display devices, and have accomplished the present invention. As desired characteristics of a polarizing film when it is used in an optical display device such as a liquid-crystal television, the inventors have set conditions represented by the formulas:

$$P > -(10^{0.929T-42.4}-1) \times 100 \text{ (where } T<42.3\text{); and}$$
$$P \geq 99.9 \text{ (where } T \geq 42.3\text{),}$$

wherein T is a single layer transmittance, and P is a polarization rate. The present invention provides an optical display device using a polarizing film which has a thickness of 10 μm or less and the optical characteristics represented in terms of the single layer transmittance T and the polarization rate P satisfying the above conditions. The polarizing film having such optical characteristics can be produced through the aforementioned 2-stage stretching consisting of preliminary in-air stretching and in-boric-acid-solution stretching, and the dyeing.

Specifically, an optical display device having a basic feature of the present invention comprises a first polarizing film which is made of a polyvinyl alcohol type resin having a molecularly oriented dichroic material, and formed through stretching to have a thickness of 10 μm or less and satisfy conditions expressed by the formulas:

$$P > -(10^{0.929T-42.4}-1) \times 100 \text{ (where } T<42.3\text{); and}$$
$$P \geq 99.9 \text{ (where } T \geq 42.3\text{),}$$

wherein T is a single layer transmittance, and P is a polarization rate, the first polarizing film being joined at a surface thereof to a one surface of a display panel through an optically transparent adhesive layer, the other surface of the first polarizing film being joined to a protective layer made of a transparent resin material.

In the aforementioned structure, the optical display device may comprise a window disposed on an outer side of the protective layer. Further, a diffusion layer may be disposed in at least one of a position between the protective layer and the first polarizing film and a position between the first polarizing film and the display panel. A bonding-facilitating layer may be disposed between the first polarizing film and the protective layer to facilitate bonding between the first polarizing film and the protective layer. An antistatic layer may be formed on the protective layer. The protective layer may be formed as a ¼ wavelength phase difference layer.

According to a first aspect of the present invention, the display panel may be in the form of a liquid-crystal display panel, wherein a second polarizing film equivalent to the first polarizing film may be joined to the other surface of the display panel through an optically transparent adhesive layer. In this case, the display panel can be formed as a transmission type liquid-crystal display panel, and in this structure, the optical display device is used with the second polarizing film located on the side of the backlight. Alternatively, the display panel may be formed as a reflection type liquid-crystal display panel, and in this structure, a mirror is disposed on an outer side of the second polarizing film to reflect at least a part of light transmitted through the liquid-crystal display panel. The mirror may be a half mirror adapted to transmit at least a part of light transmitted through the liquid-crystal display panel, and in this structure, the backlight is disposed on a side opposite to the liquid-crystal display panel with respect to the half mirror. Further, a second protective layer may be disposed on the surface of the second polarizing film opposite to the display panel. There may be provided a bonding-facilitating layer between the second polarizing film and the second protective layer to facilitate bonding between the second polarizing film and the second protective layer. An antistatic layer may be formed on the second protective layer. A ¼ wavelength phase difference layer may be disposed on at least one of a position between the first polarizing film and the display panel and a position between the display panel and the second polarizing film.

According to another aspect of the present invention, the display panel is configured as an organic EL display panel or a reflection type liquid-crystal display panel. In the case of this structure, there is disposed a phase difference film between the first polarizing film and the display panel. In this case, the phase difference film may be a biaxial phase difference film satisfying the relationship of nx>nz>ny, wherein nx and ny are refractive indexes in in-plane x-axis and y-axis directions, respectively and nz is a refractive index in a thicknesswise direction. The phase difference film may be a ¼ wavelength phase difference film.

According to a further aspect of the present invention, the first polarizing film may be of a type which is formed by subjecting a polyvinyl alcohol type resin layer formed on a substrate made of an ester type thermoplastic resin material to stretching based on the 2-stage stretching, together with the thermoplastic resin substrate, and the protective layer made of a transparent resin material may be composed of the thermoplastic resin substrate stretched together with the polyvinyl alcohol type resin layer. In this case, a non-crystallizable PET may be used as the ester type thermoplastic resin material.

Further, according to one mode of the present invention, the protective layer of a transparent resin material may be comprised of a cellulosic material or an acrylic resin material.

In the aspect of the present invention having the second polarizing plate, the second polarizing film may be of a type which is formed by subjecting a polyvinyl alcohol type resin layer formed on a substrate made of an ester type thermoplastic resin material to stretching based on the 2-stage stretching, together with the thermoplastic resin substrate, and the protective layer of a transparent resin material may be composed of the thermoplastic resin substrate stretched together with the polyvinyl alcohol type resin layer. The protective layer of a transparent resin material may comprise a patterning phase difference layer used in a display device for a 3-D TV. As an example of the patterning phase difference layer, there is a pattern retarder disclosed in the Non-Patent Document 1 (K. Matsuhiro, "Xpol and its application to 3D-TV", "EKISHO", Vol. 14, No. 4, 2010, pp 219-232).

In the aspect of the present invention using a transmission type liquid-crystal display panel, the transmission type liquid-crystal display panel may be comprised of an in-plane switching (IPS) mode liquid-crystal display panel, and in this structure, there are disposed an optically transparent adhesive layer and a phase difference film in at least one of a position between the first polarizing film and the display panel and a position between the display panel and the second polarizing film. In this case, the phase difference film may be of a type having a relationship of nx>nz>ny, wherein nx and ny are refractive indexes in in-plane x-axis and y-axis directions, respectively and nz is a refractive index in a thickness direction. Alternatively, the phase difference film may be of a type having a two-layer structure consisting of a first phase difference layer having a relationship of nx>nz>ny, and a second phase difference layer having a relationship of nx>ny>nz, wherein nx and ny are refractive indexes in in-plane x-axis and y-axis directions, respectively and nz is a refractive index in a thickness direction.

In the aspect of the present invention using a transmission type liquid-crystal display panel, the transmission type liquid-crystal display panel may be comprised of a vertical alignment (VA) mode liquid-crystal display panel. In this structure, a phase difference film disposed between the display panel and each of the first and second polarizing films may be formed to satisfy the following relationship: nx>ny>nz, wherein: nx and ny are refractive indexes in in-plane x-axis and y-axis directions, respectively; and nz is a refractive index in a thickness direction.

In the aspect of the present invention using a transmission type liquid-crystal display panel, the transmission type liquid-crystal display panel may be comprised of a twisted nematic (TN) mode liquid-crystal display panel, and in this structure, the phase difference film disposed between the display panel and each of the first and second polarizing films may be comprised of an obliquely oriented phase difference film for viewing angle compensation in an ON state of TN liquid crystal. An example of the obliquely oriented phase difference film which may be used for the purpose is disclosed in the Non-Patent Document 2 (Y. Mori, et al., "Development of FUJI FILM WV Film Wide View SA", FUJIFILM RESEARCH & DEVELOPMENT (No. 46-2001), pp 51-55)

According to another aspect of the present invention, the optical display panel may be comprised of a reflection type liquid-crystal display panel, and there may be disposed a phase difference film between the first polarizing film and the display panel to convert a linearly polarized light from the first polarizing film to a circularly-polarized light.

According to a further aspect of the present invention, the optical display device may be comprised of a transmission type liquid-crystal display panel, and there may be disposed a phase difference film in at least one of a position between the first polarizing film and the display panel and a position between the display panel and the second polarizing film, for performing at least one of an internal reflection-blocking function and a viewing angle compensation function. In this structure, the display panel may be provided on at least one of a position between the first polarizing film and the display panel and a position between the display panel and the second polarizing film with an optically transparent adhesive layer.

In the optical display device of the present invention, there may be disposed a touch panel laminate having a touch sensing function on a viewing side with respect to the display panel. In this structure, the touch panel laminate may be of a capacitive type touch panel having a plurality of patterned pairs of transparent electrodes with a dielectric layer disposed therebetween.

Preferably, in this case, the touch panel laminate is disposed between the polarizing film and a viewing-side outermost member of the optical display device. Alternatively, the touch panel laminate may be disposed between the polarizing film and the display panel. Further, the touch panel laminate may be comprised of a resistance type touch panel configured such that a patterned transparent electrode is disposed to be opposed to a counter electrode through an air gap, and in this structure, the touch panel laminate is disposed between the polarizing film and the display panel, or between the polarizing film and a viewing-side outermost member of the optical display device.

Effect of the Invention

According to the present invention, it is possible to obtain an optical display device using a polarizing film which is extremely reduced in thickness as compared with conventional polarizing films, and having required optical characteristics. Specifically, it is possible to obtain an optical display device using a polarizing film made of a polyvinyl alcohol type resin having a molecularly oriented dichroic material impregnated therein and formed to have a thickness of 10 μm or less while exhibiting required optical characteristics.

As mentioned above, the inventors cannot find any case, in prior art documents, of using a thermoplastic resin substrate and subjecting a PVA type resin layer formed on the substrate to uniaxial stretching to attain a stretching ratio of 5.0 or more.

Representative examples of a polarizing film production method which may be used in the present invention, and an optical display device according to embodiments of the present invention, will be specifically described below with reference to the accompanying drawings.

BRIEF DESCRIPTION OF THE DRAWINGS

FIG. 1 is a diagram illustrating an appropriate thickness of a resin substrate with respect to a thickness of a PVA type resin layer (or a thickness of a polarizing film).

FIG. 2 is a comparative graph illustrating respective polarization performances of polarizing films having thicknesses of 3 μm, 8 μm and 10 μm.

FIG. 3 is a graph illustrating a relationship between the single layer transmittance T and the polarization rate P.

FIG. 4 is a graph illustrating a range of optical performance required for a polarizing film for use in an optical display device.

FIG. 5 is a graph illustrating theoretical values of polarization performances of polarizing films 1 to 7 based on dichroic ratio.

FIG. 6 is a comparative table comparatively illustrating the presence or absence of dissolution of a PVA type resin layer depending on a difference in iodine concentration of a dyeing bath.

FIG. 7 is a comparative graph illustrating a relationship between an iodine concentration of a dyeing bath and polarization performance of a polarizing film formed by a PVA type resin layer.

FIG. 8 is a graph illustrating respective polarization performances of polarizing films in inventive examples.

FIG. 11f is a sectional view illustrating yet still another example of the modification of the optical display device according to the first embodiment.

FIG. 12g is a sectional view illustrating an optical display device according to a seventh embodiment of the present invention.

FIG. 12i is a sectional view illustrating an optical display device according to a ninth embodiment of the present invention.

FIG. 12j is a sectional view illustrating an optical display device according to a tenth embodiment of the present invention.

FIG. 26 is a graph illustrating polarization performance of an example of a polarizing film which is not included in the scope of the present invention.

FIG. 27 is a table illustrating conditions for producing a polarizing film or an optical film laminate including the polarizing film, in each Example.

FIG. 28 is a table illustrating conditions for producing a polarizing film or an optical film laminate including the polarizing film, in each Example.

FIG. 29 is a comparative table illustrating values of the orientation function in Examples.

DESCRIPTION OF EMBODIMENTS

Technical Background of Polarizing Films

Figure 9:
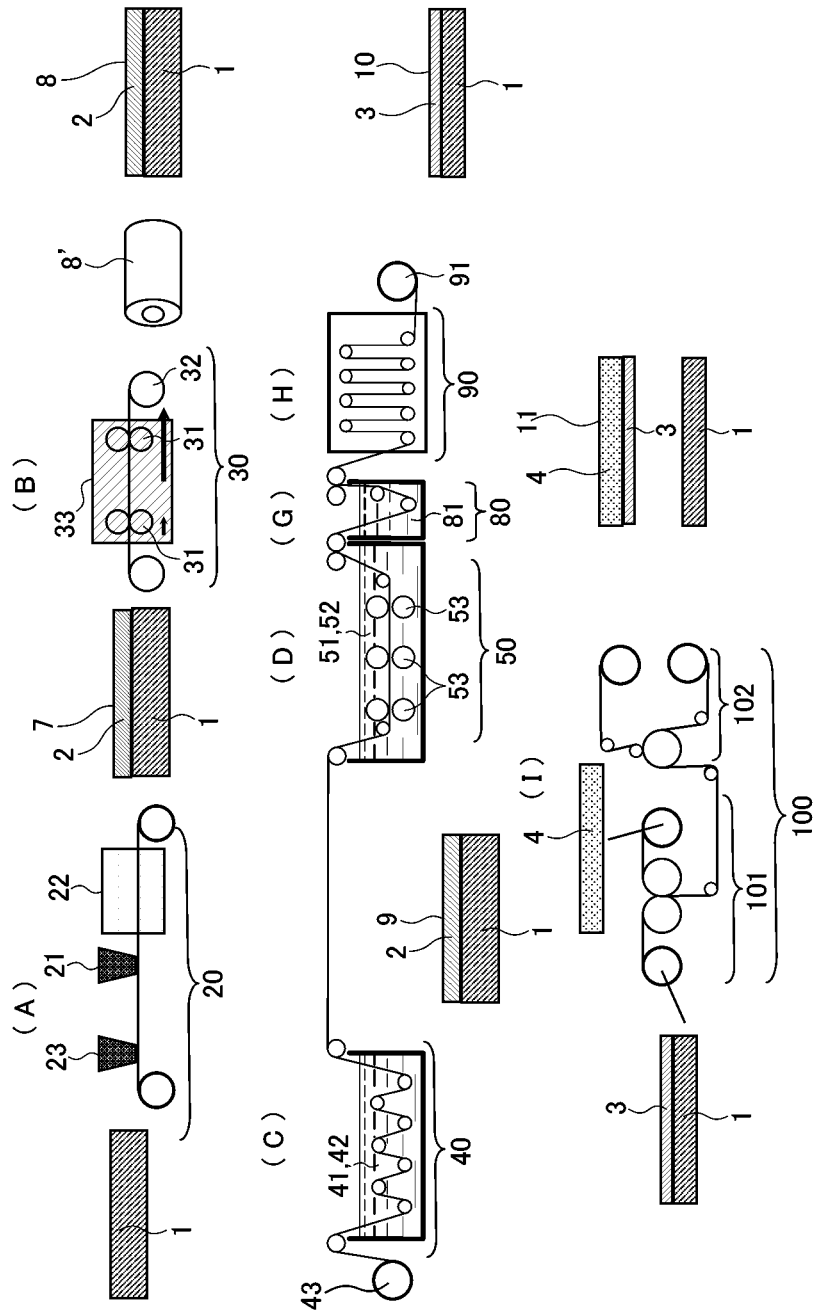
FIG. 9 is a schematic diagram illustrating a production process for producing an optical film laminate, wherein the process does not include any insolubilization treatment.

As the background art of polarizing films, descriptions will be made on optical characteristics represented by material characteristics of a thermoplastic resin substrate to be used in the present invention and polarization performance of a polarizing film.

Firstly, descriptions will be made briefly on general material characteristics of a thermoplastic resin suitable for use in the present invention.

Thermoplastic resins are roughly classified into two types, one being the type which is in a state in which polymer molecules are orderly oriented, and the other being the type which is in a state in which molecules are not orderly oriented or only a small portion of polymer molecules are orderly oriented. The former state is called "crystallized state", and the latter state is called "amorphous or non-crystallized state. Correspondingly, one type of thermoplastic resin having a property capable of being transformed from a non-crystallized state into a crystallized state depending on conditions is called "crystallizable resin", and the other type of thermoplastic resin which does not have such a property is called "non-crystallizable resin". On the other hand, regardless of whether a crystallizable resin or a non-crystallizable resin, a resin which is not in a crystallized state or has not been transformed into a crystallized state, is called "amorphous or non-crystalline resin". The term "amorphous or non-crystalline" will be used herein in distinction from the term "non-crystallizable" which means a property incapable of transformation into a crystallized state.

For example, the crystallizable resin may include olefin type resins such as polyethylene (PE) and polypropylene (PP), and ester type resins such as polyethylene terephthalate (PET) and polybutylene terephthalate (PBT). One feature of the crystallizable resin is that, based on heating and/or stretching/orienting, polymer molecules are orderly arranged, and crystallization is progressed. Physical properties of the resin vary according to the degree of crystallization. On the other hand, even in the crystallizable resin, such as polypropylene (PP) or polyethylene terephthalate (PET), it is possible to suppress crystallization by inhibiting polymer molecules from being orderly oriented which may otherwise be caused by heating or stretching/orienting. Such crystallization-inhibited polypropylene (PP) and polyethylene terephthalate (PET) will hereinafter be referred to respectively as "non-crystallizable polypropylene" and "non-crystallizable polyethylene terephthalate", and referred to respectively and collectively as "non-crystallizable olefin type resin" and "non-crystallizable ester type resin", respectively.

For example, in the case of polypropylene (PP), the resin may be made to have an atactic structure having no stereoscopic regularity to thereby produce a crystallization-inhibited non-crystallizable polypropylene (PP). Further, for example, in the case of polyethylene terephthalate (PET), it is possible to produce a crystallization-inhibited non-crystallizable polyethylene terephthalate (PET) by copolymerizing isophthalic acid or a modifier group such as 1,4-cyclohexanedimethanol, as a polymerizing monomer, or by copolymerizing a molecule which inhibits crystallization of polyethylene terephthalate (PET).

Secondly, brief description will be made on optical characteristics of a polarizing film usable in a large-sized liquid-crystal display element.

Basically, the term "optical characteristic" of a polarizing film is used to mean a polarization performance represented by a polarization rate P and a single layer transmittance T. In general, the polarization rate P and the single layer transmittance T of a polarizing film are in a trade-off relationship. The two optical characteristic values can be expressed by a T-P graph. In the T-P graph, it can be interpreted that a polarizing filma has a better polarization performance if a plotted line for the polarizing film is located on a higher side in terms of the single layer transmittance and on a higher side in terms of the polarization rate.

Referring to FIG. 3 illustrating such T-P graph, an ideal optical characteristic is a state in which P becomes 100% when T is 50%. As see in FIG. 3, it is easy to increase the value of P in the range where T has a lower value, and it is difficult to have the P value increased in the range where T has a higher value. Further, referring to FIG. 4 illustrating the polarization performance of a polarizing film based on the relationship between the transmittance T and the polarization rate P, it is noted that, in a range defined as a region above the line 1 and the line 2, the single layer transmittance T and the polarization rate P of the polarizing film have values satisfying the "required performance" which would be required for an optical display device, wherein a liquid-crystal display device using this polarizing film will have a contrast ratio of 1000:1 or more, and a maximum luminance of 500 cd/m$^2$ or more. This required performance is considered to be optical characteristics required as performance of a polarizing film for a large-sized optical display element or the like, currently or even in future. An ideal value of the single layer transmittance T is 50%. However, when light transmits through a polarizing film, a phenomenon occurs that a part of light is reflected at an interface between the polarizing film and air. Considering this reflection phenomenon, the single layer transmittance T is reduced by an amount corresponding to the reflection, and an actually attainable maximum value of the single layer transmittance T is in the range of about 45 to 46%.

On the other hand, the polarization rate P can be converted to a contrast ratio (CR) of a polarizing film. For example, a polarization rate P of 99.95% corresponds to a contrast ratio of a polarizing film of 2000:1. In a display device prepared by using this polarizing film in each of opposite sides of a liquid-crystal display panel for a liquid-crystal television, the contrast ratio will be 1050:1. As above, the contrast ratio of the display device is less than that of the polarizing film, because depolarization occurs within the display panel. The depolarization occurs because of a phenomenon wherein, when light transmitted through the polarizing film on a backlight side transmits through the display panel, the light is scattered and/or reflected by pigments in a color filter, a liquid-crystal molecule layer and a thin-film transistor (TFT), so that the polarization state of a part of the light is changed. As the contrast ratio of each of the polarizing film and the display panel becomes larger, the liquid-crystal television has better contrast and better visibility.

Meanwhile, the contrast ratio of a polarizing film is defined as a value obtained by dividing a parallel transmittance (Tp) by a cross transmittance (Tc). On the other hand, the contrast ratio of a display device is defined as a value obtained by dividing a maximum luminance by a minimum luminance. The minimum luminance is a luminance in a black screen. In a liquid-crystal television designed assuming a typical viewing environment, the minimum luminance is set to 0.5 cd/m$^2$ or less as a reference required value. If the minimum luminance is greater than this value, color reproducibility will be deteriorated. The maximum luminance is a luminance in a white screen. In a liquid-crystal television designed for a typical viewing environment, a display having a maximum luminance ranging from 450 to 550 cd/m$^2$ is used. If the maximum luminance is less than this range, visibility of the liquid-crystal television will be decreased because display becomes dark.

Performance required for a display device of a liquid-crystal television using a large-sized display element includes a display contrast ratio of 1000:1 or more and a maximum luminance of 500 cd/m$^2$ or more. This may be considered as a "required performance". The line 1 (T<42.3%) and the line 2 (T≧42.3%) in FIG. 4 denote limit values of the polarization performance of a polarizing film necessary to achieve the required performance of the display device. These lines have been determined by the following simulation, based on a combination of a backlight-side polarizing film and a viewing-side polarizing film, illustrated in FIG. 5.

The contrast ratio and the maximum luminance of a display device for a liquid-crystal television can be calculated based on a light intensity of a light source (backlight), transmittances of two polarizing films disposed on backlight and viewing sides, a transmittance of a liquid-crystal display panel, polarization rates of the two backlight-side and viewing-side polarizing films, and a depolarization rate of the liquid-crystal display panel. The lines 1 and 2 in FIG. 4 satisfying the required performance can be derived by preparing a plurality of combinations of two polarizing films different in polarization performance and calculating a contrast ratio and a maximum luminance of a display device for a liquid-crystal television for each of the combinations, using basic values of a light intensity (10,000 cd/m$^2$) of a light source of a typical liquid-crystal television, a transmittance (13%) of a liquid-crystal display panel of the liquid-crystal television and a depolarization ratio (0.085%) of the liquid-crystal display panel. Specifically, if a polarizing film having performance below the line 1 and the line 2 is used, the contrast ratio becomes less than 1000:1, and the maximum luminance becomes less than 500 cd/m2. Formulas used for the calculation are as follows.

Formula (1) is used for deriving the contrast ratio of a display device. Formula (2) is used for deriving the maximum luminance of the display device. Formula (3) is used for deriving a dichroic ratio of a polarizing film.

$$CRD = Lmax/Lmin, \quad \text{Formula (1)}$$

$$Lmax = (LB \times Tp - (LB/2 \times k1B \times DP/100)/2 \times (k1F - k2F)) \times Tcell/100, \text{ and} \quad \text{Formula (2)}$$

$$DR = A_{k2}/A_{k1} = \log(k2)/\log(k1) = \log(Ts/100 \times (1 - P/100)/T_{PVA})/\log(Ts/100 \times (1 + P/100)/T_{PVA}), \quad \text{Formula (3)}$$

where:

$$Lmin = (LB \times Tc + (LB/2 \times k1B \times DP/100)/2 \times (k1F - k2F)) \times Tcell/100;$$

$$Tp = (k1B \times k1F + k2B \times k2F)/2 \times T_{PVA};$$

$$Tc = (k1B \times k2F + k2B \times k1F)/2 \times T_{PVA};$$

$$k1 = Ts/100 \times (1 + P/100)/T_{PVA}; \text{ and}$$

$$k2 = Ts/100 \times (1 - P/100)/T_{PVA},$$

wherein:
CRD: contrast ratio of the display device;
Lmax: maximum luminance of the display device;
Lmin: minimum luminance of the display device;
DR: dichroic ratio of the polarizing film;
Ts: single layer transmittance of the polarizing film;
P: polarization rate of the polarizing film;
k1: first primary transmittance;
k2: second primary transmittance;
k1F: k1 of the viewing-side polarizing film;
k2F: k2 of the viewing-side polarizing film;
k1B: k1 of the backlight-side polarizing film;
k2B: k2 of the backlight-side polarizing film;
$A_{k1}$: absorbance of the polarizing film in a direction of a transmission axis;
$A_{k2}$: absorbance of the polarizing film in a direction of an absorption axis;
LB: light intensity of the light source (10,000 cd/m$^2$);
Tc: cross transmittance of the polarizing films (combination of the viewing-side polarizing film and the backlight-side polarizing film);
Tp: parallel transmittance of the polarizing films (combination of the viewing-side polarizing film and the backlight-side polarizing film);

Tcell: transmittance of the cell (liquid-crystal display panel) (13%);
DP: depolarization rate of the cell (0.085%); and
$T_{PVA}$: transmittance of a PVA film having no iodine absorbed therein (0.92).

The line 1 in FIG. 4 (T<42.3%) is derived based on the polarization performance of polarizing films located on the straight line indicated "group 3" in FIG. 5. Among the polarizing films belonging to the group 3 in FIG. 5, the polarizing film D which is the plot D (white circle) represented by coordinates (T, P)=(42.1%, 99.95%) may be used on each of backlight and viewing sides of a display device for a liquid-crystal television. In this case, the required performance can be satisfied.

On the other hand, although the polarizing film A (T=40.6%, P=99.998%), the polarizing film B (T=41.1%, P=99.994%) and the polarizing film C (T=41.6%, P=99.98%) also belong to the group 3, they are located in a region having a lower single layer transmittance (darker). Thus, if one of these polarizing films is used on each of the backlight and viewing sides, the required performance cannot be satisfied. In cases where one of the polarizing films A, B and C is used on either one of the backlight and viewing sides, in order to achieve the required performance, it is necessary to use, as a polarizing film to be used on the other side, a polarizing film having a single layer transmittance greater than that of the polarizing films in the group 3 and excellent polarization performance, specifically, at least a polarization rate of 99.9% or more, such as the polarizing film E in the group 4, the polarizing film F in the group 5 or the polarizing film G in the group 7.

Respective polarization performances of the polarizing films belonging to the groups 1 to 7 are calculated in accordance with the Formula (3). The Formula (3) can be used to calculate the single layer transmittance T and the polarization rate P based on the dichroic ratio (DR) serving as an index of polarization performance of a polarizing film. The term "dichroic ratio" means a value obtained by dividing an absorbance in a direction of an absorption axis of a polarizing film by an absorbance in a direction of a transmission axis thereof. A higher value of the dichroic ratio indicates better polarization performance. For example, each polarizing film in the group 3 is calculated as a polarizing film having polarization performance in which the dichroic ratio is about 94. This means that any polarizing film having a dichroic ratio of less than this value does not achieve the required performance.

Further, in cases where a polarizing film having polarization performance inferior to those of the polarizing films in the group 3, such as the polarizing film H (41.0%, 99.95%) in the group 1 or the polarizing film J (42.0%, 99.9%) in the group 2, is used on either one of the backlight and viewing sides, in order to achieve the required performance, it is necessary to use, as a polarizing film to be used on the other side, a polarizing film having polarization performance better than those of the polarizing films in the group 3, such as the polarizing film I (43.2%, 99.95%) in the group 6 or the polarizing film K (42.0%, 99.998%) in the group 7, as is clear from the Formulas (1) and (2)

In order to achieve the required performance of a display device for a liquid-crystal television, the polarization performance of either one of the backlight-side and viewing-side polarizing films has to be better than those of the polarizing films in the group 3. The line 1 (T<42.3%) in FIG. 4 indicates the lower limit of the polarization performance. On the other hand, the line 2 (T≧42.3%) indicates the lower limit of the polarization rate P. If a polarizing film having a polarization rate P of 99.9% or less is used on either one of the backlight and viewing sides, the required performance cannot be satisfied even if a polarizing film having the best possible polarization performance is used on the other side.

In conclusion, a desired condition for achieving polarization performance required for a display device of a liquid-crystal television using a large-sized display element is that either one of the backlight-side and viewing-side polarizing films has polarization performance better than that of the polarizing film in a region beyond at least the threshold represented by the line 1 (T<42.3%) and the line 2 (T≧42.3%), more specifically, polarization performance better than those of the polarizing films in the group 3, and a polarization rate of 99.9% or more.

[Examples on Production of Polarizing Film]

Examples 1 to 18 will be described as specific examples of a polarizing film for use in an optical display device according to the present invention. FIGS. 27 and 28 illustrate conditions for producing polarizing films in the Examples. Further, as comparative examples, reference samples and comparative examples have also been prepared. FIG. 29 illustrates a value of orientation function of a PET resin substrate of a stretched laminate in each of the Examples 1 to 18 and of reference samples 1 to 3, after completion of first-stage elevated temperature in-air stretching.

Example 1

A continuous web of substrate was prepared as a non-crystallizable ester type thermoplastic resin substrate comprising isophthalic acid-copolymerized polyethylene terephthalate copolymerized with 6 mol % of isophthalic acid (hereinafter referred to as "non-crystallizable PET"). The non-crystallizable PET has a glass transition temperature of 75° C. A laminate comprising the continuous web of non-crystallizable PET substrate and a polyvinyl alcohol (hereinafter referred to as "PVA") layer was prepared in the following manner. By the way, PVA has a glass transition temperature of 80° C.

A non-crystallizable PET substrate having a thickness of 200 μm was prepared, and a PVA aqueous solution having a PVA concentration of 4 to 5 wt % was also prepared by dissolving a PVA powder having a polymerization degree of 1000 or more and a saponification degree of 99% or more in water. Then, the PVA aqueous solution was applied to the 200 μm-thick non-crystallizable PET substrate, and dried at a temperature of 50 to 60° C., to form a PVA layer having a thickness of 7 μm on the non-crystallizable PET substrate. This product will hereinafter be referred to as a "laminate comprising the non-crystallizable PET substrate and the 7 μm-thick PVA layer formed on the non-crystallizable PET substrate", or as a "laminate including the 7 μm-thick PVA layer", or simply as a "laminate".

The laminate including the 7 μm-thick PVA layer was subjected to the following steps including a 2-stage stretching step consisting of preliminary in-air stretching and in-boric-acid-solution stretching, to produce a polarizing film having a thickness of 3 μm. Through the first-stage preliminary in-air stretching, the laminate including the 7 μm-thick PVA layer was stretched together with the non-crystallizable PET substrate to form a stretched laminate including a 5 μm-thick PVA layer. This product will hereinafter be referred to as a "stretched laminate". Specifically, the stretched laminate was obtained by placing the laminate including the 7 μm-thick PVA layer into a stretching apparatus arranged in an oven set to a stretching temperature environment of 130° C., to stretch the laminate in an end-free uniaxial manner to attain a stretching ratio of 1.8. Through this stretching step, the PVA layer in the stretched laminate was converted into a 5 μm-thick PVA layer in which PVA molecules are oriented.

Subsequently, the stretched laminate was subjected to a dyeing step to form a dyed laminate in which iodine is absorbed (impregnated) in the 5 μm-thick PVA layer having the oriented PVA molecules. This product will hereinafter be referred to as a "dyed laminate". Specifically, the dyed laminate was obtained by immersing the stretched laminate in a dyeing solution having a temperature of 30° C. and containing iodine and potassium iodide, for an arbitrary time, to cause iodine to be absorbed in the PVA layer included in the stretched laminate, so as to allow the PVA layer for making up a target polarizing film (to a polarizing film to be finally formed) to have a single layer transmittance of 40 to 44%. In this step, the dyeing solution was prepared by adjusting a concentration of iodine and a concentration of potassium iodide to fall within the range of 0.12 to 0.30 wt % and the range of 0.7 to 2.1 wt %, respectively, using water as a solvent. A ratio of the concentration of iodine to the concentration of potassium iodide is 1:7.

By the way, it is necessary to use potassium iodide to allow iodine to be dissolved in water. More specifically, the stretched laminate was immersed in a dyeing solution having an iodine concentration of 0.30 wt % and a potassium iodide concentration of 2.1 wt %, for 60 seconds, to form a dyed laminate in which iodine is absorbed in the 5 μm-thick PVA layer having the oriented PVA molecules. In the Example 1, various dyed laminates different in single layer transmittance and polarization rate were formed by changing an immersion time of the stretched laminate in the dyeing solution having an iodine concentration of 0.30 wt % and a potassium iodide concentration of 2.1 wt %, to adjust an amount of iodine to be absorbed, so as to allow a target polarizing film to have a single layer transmittance of 40 to 44%.

Further, through the second-stage in-boric-acid-solution stretching, the dyed laminate was further stretched together with the non-crystallizable PET substrate to form an optical film laminate including a PVA layer making up a 3 μm-thick polarizing film. This product will hereinafter be referred to as an "optical film laminate". Specifically, the optical film laminate was obtained by feeding the dyed laminate through a stretching apparatus arranged in treatment equipment having a boric acid aqueous solution containing boric acid and potassium iodide and having a temperature of 60 to 85° C., to subject the dyed laminate to an end-free uniaxial stretching to attain a stretching ratio of 3.3. More specifically, the temperature of the boric acid aqueous solution was 65° C. Further, the boric acid aqueous solution was set to contain 4 weight parts of boric acid with respect to 100 weight parts of water, and 5 weight parts of potassium iodide with respect to 100 weight parts of water.

In this step, the dyed laminate having iodine impregnated therein in an adjusted amount was first immersed in the boric acid aqueous solution for 5 to 10 seconds. Then, the dyed laminate was fed to directly pass between each of a plurality of set of rolls having different circumferential speeds and serving as the stretching apparatus arranged in the treatment equipment, and subjected to an end-free uniaxial stretching to attain a stretching ratio of 3.3 by taking a time of 30 to 90 seconds. Through this stretching, the PVA layer included in the dyed laminate is changed into a 3 μm-thick PVA layer in which absorbed iodine is highly oriented in one direction in the form of a polyiodide ion complex. This PVA layer makes up a polarizing film of an optical film laminate.

As above, in the Example 1, a laminate comprising a non-crystallizable PET substrate and a 7 μm-thick PVA layer formed on the substrate is first subjected to preliminarily in-air stretching at a stretching temperature of 130° C. to form a stretched laminate. Then, the stretched laminate is subjected to dyeing to form a dyed laminate. Then, the dyed laminate is subjected to in-boric-acid-solution stretching at a stretching temperature of 65° C., to form an optical film laminate including a 3 μm-thick PVA layer stretched together with the non-crystallizable PET substrate to attain a total stretching ratio of 5.94. Through the 2-stage stretching, it becomes possible to form an optical film laminate including a 3 μm-thick PVA layer in which PVA molecules in the PVA layer formed on the non-crystallizable PET substrate are highly oriented, and iodine absorbed through the dyeing is highly oriented in one direction in the form of a polyiodide ion complex.

Then, in a cleaning step although it is not essential in a production process of an optical film laminate, the optical film laminate was taken out of the boric acid aqueous solution, and boric acid deposited on a surface of the 3 μm-thick PVA layer formed on the non-crystallizable PET substrate was cleaned by a potassium iodide aqueous solution. Subsequently, in a drying step, the cleaned optical film laminate was dried by warm air at a temperature of 60° C. The cleaning step is designed to solve defective appearance due to deposition of boric acid.

Subsequently, in a lamination and/or transfer step, an 80 μm-thick triacetylcellulose (TAC) film was laminated to a surface of the 3 μm-thick PVA layer formed on the non-crystallizable PET substrate, while applying a bonding agent onto the surface of the 3 μm-thick PVA layer. Then, the non-crystallizable PET substrate was peeled to allow the 3 μm-thick PVA layer to be transferred to the 80 μm-thick triacetylcellulose (TAC) film.

Example 2

In the Example 2, as with the Example 1, a 7 μm-thick PVA layer was formed on a non-crystallizable PET substrate to form a laminate, and then the laminate including the 7 μm-thick PVA layer was subjected to preliminary in-air stretching and stretched at a stretching ratio of 1.8 to form a stretched laminate, whereafter the stretched laminate was immersed in a dyeing solution containing iodine and potassium iodide and having a temperature of 30° C. to form a dyed laminate including an iodine-absorbed PVA layer. Differently from the Example 1, a process in the Example 2 additionally comprises a cross-linking step. The cross-linking step is designed to immerse the dyed laminate in a cross-linking boric acid aqueous solution at a temperature of 40° C., for 60 seconds, so as to allow PVA molecules of the iodine-absorbed PVA layer to be subjected to cross-linking. The cross-linking boric acid aqueous solution in this step was set to contain 3 weight parts of boric acid with respect to 100 weight parts of water, and 3 weight parts of potassium iodide with respect to 100 weight parts of water.

The cross-linking step in the Example 2 is intended to expect at least three technical effects. The first is an insolubilization effect of preventing a thinned PVA layer included in the dyed laminate from being dissolved during subsequent in-boric-acid-solution stretching. The second is a dyeing stabilization effect of preventing elution of iodine absorbed in the PVA layer. The third is a node formation effect of forming nodes by cross-linking molecules of the PVA layer together.

In the Example 2, the cross-linked dyed laminate was immersed in an in-boric-acid-solution stretching bath at 75° C. which is higher than a stretching temperature of 65° C. in the Example 1, and stretched at a stretching ratio of 3.3 to form an optical film laminate, as with the Example 1. The process in the Example 2 further comprises a cleaning step, a drying step and a lamination and/or transfer step each of which is the same as that in the Example 1.

In order to further clarify the technical effects expected of the cross-linking step in advance of the in-boric-acid-solution stretching, a non-cross-linked dyed laminate in the Example 1 was immersed in the in-boric-acid-solution stretching bath at a stretching temperature of 70 to 75° C. In this case, the PVA layer included in the dyed laminate was dissolved in the in-boric-acid-solution stretching bath to preclude the stretching.

Example 3

In the Example 3, as with the Example 1, a 7 μm-thick PVA layer was formed on a non-crystallizable PET substrate to form a laminate, and then the laminate including the 7 μm-thick PVA layer was subjected to preliminary in-air stretching and stretched at a stretching ratio of 1.8 to form a stretched laminate. Differently from the Example 1, a process in the Example 3 additionally comprises an insolubilization step. The insolubilization step is designed to immerse the stretched laminate in a boric acid insolubilizing aqueous solution at a solution temperature of 30° C., for 30 seconds, so as to insolubilize a PVA layer included in the stretched laminate and having oriented PVA molecules. The boric acid insolubilizing aqueous solution in this step was set to contain 3 weight parts of boric acid with respect to 100 weight parts of water. A technical effect expected of the insolubilization step in the Example 3 is to prevent the PVA layer included in the stretched laminate from being dissolved at least during a subsequent dyeing step.

In the Example 3, as with the Example 1, the insolubilized stretched laminate was immersed in a dyeing solution containing iodine and potassium iodide and having a temperature of 30° C. to form a dyed laminate including an iodine-absorbed PVA layer. Subsequently, the dyed laminate was immersed in the in-boric-acid-solution stretching bath at 65° C. which is equal to the stretching temperature in the Example 1, and stretched at a stretching ratio of 3.3 in the same manner as that in the Example 1 to form an optical film laminate. The process in the Example 3 further comprises a cleaning step, a drying step and a lamination and/or transfer step each of which is the same as that in the Example 1.

In order to further clarify the technical effects expected of the insolubilization step in advance of the dyeing step, a non-insolubilized stretched laminate in the Example 1 was subjected to dyeing to form a dyed laminate, and the formed dyed laminate was immersed in the in-boric-acid-solution stretching bath at a stretching temperature of 70 to 75° C. In this case, the PVA layer included in the dyed laminate was dissolved in the in-boric-acid-solution stretching bath to preclude the stretching, as with the Example 2.

In another test, a dyeing solution was prepared using water as a solvent to set an iodine concentration in the range of 0.12 to 0.25 wt %, while keeping the remaining conditions unchanged. Then, the non-insolubilized stretched laminate in the Example 1 was immersed in the prepared dyeing solution. In this case, the PVA layer included in the stretched laminate was dissolved in the dyeing bath to preclude the dyeing. In contrast, when the insolubilized stretched laminate in the Example 3 was used, the dyeing to the PVA layer could be performed without dissolution of the PVA layer, even if the iodine concentration of the dyeing solution was in the range of 0.12 to 0.25 wt %.

In the Example 3 where the dyeing to the PVA layer can be performed even if the iodine concentration of the dyeing solution is in the range of 0.12 to 0.25 wt %, various dyed laminates different in single layer transmittance and polarization rate were formed by changing the iodine concentration and the potassium iodide concentration of the dyeing solution in the certain range in the Example 1, while keeping an immersion time of the stretched laminate in the dyeing solution constant, to adjust an amount of iodine to be absorbed, so as to allow a target polarizing film to have a single layer transmittance of 40 to 44%.

Example 4

In the Example 4, an optical film laminate was formed by a production process in which the insolubilization step in the Example 3 and the cross-linking step in the Example 2 are added to the production process in the Example 1. Firstly, a 7 μm-thick PVA layer was formed on a non-crystallizable PET substrate to form a laminate, and then the laminate including the 7 μm-thick PVA layer was subjected to preliminary in-air stretching based on an end-free uniaxial stretching process to attain a stretching ratio of 1.8 to thereby form a stretched laminate. In the Example 4, as with the Example 3, through the insolubilization step of immersing the formed stretched laminate in a boric acid insolubilizing solution at a temperature of 30° C. for 30 seconds, the PVA layer included in the stretched laminate and having oriented PVA molecules was insolubilized. Then, in the Example 4, as with the Example 3, the stretched laminate including the insolubilized PVA layer was immersed in a dyeing solution containing iodine and potassium iodide and having a temperature of 30° C. to form a dyed laminate including an iodine-absorbed PVA layer.

In the Example 4, as with the Example 2, through the cross-linking step of immersing the formed dyed laminate in a boric acid cross-linking solution at 40° C. for 60 seconds, PVA molecules of the iodine-absorbed PVA layer are cross-linked together. Then, in the Example 4, the cross-linked dyed laminate was immersed in an in-boric-acid-solution stretching bath at 75° C. which is higher than a stretching temperature of 65° C. in the Example 1, for 5 to 10 seconds, and subjected to an end-free uniaxial stretching to attain a stretching ratio of 3.3, in the same manner as that in the Example 2, to thereby form an optical film laminate. The process in the Example 4 further comprises a cleaning step, a drying step and a lamination and/or transfer step each of which is the same as that in each of the Examples 1 to 3.

As with the Example 3, the PVA layer in the Example 4 is never dissolved even if the iodine concentration of the dyeing solution is in the range of 0.12 to 0.25 wt %. In the Example 4, various dyed laminates different in single layer transmittance and polarization rate were formed by changing the iodine concentration and the potassium iodide concentration of the dyeing solution in the certain range in the Example 1, while keeping an immersion time of the stretched laminate in the dyeing solution constant, to adjust an amount of iodine to be absorbed, so as to allow a target polarizing film to have a single layer transmittance of 40 to 44%.

As above, in the Example 4, a 7 μm-thick PVA layer is formed on a non-crystallizable PET substrate to form a laminate, and then the laminate including the 7 μm-thick PVA layer is subjected to preliminarily in-air stretching based on an end-free uniaxial stretching process to attain a stretching ratio of 1.8 to thereby form a stretched laminate. The formed stretched laminate is immersed in a boric acid insolubilizing solution at a solution temperature of 30° C. for 30 seconds to insolubilize the PVA layer included in the stretched laminate. The stretched laminate including the insolubilized PVA layer is immersed in a dyeing solution containing iodine and potassium iodide and having a temperature of 30° C. to form a dyed laminate in which iodine is absorbed in the insolubilized PVA layer. The dyed laminate including the iodine-absorbed PVA layer is immersed in a boric acid cross-linking solution at 40° C. for 60 seconds to cross-link PVA molecules of the iodine-absorbed PVA layer together. The dyed laminate including the cross-linked PVA layer is immersed in an in-boric-acid-solution stretching bath containing iodine and potassium iodide and having a temperature of 75° C., for 5 to 10 seconds, and then subjected to in-boric-acid-solution stretching based on an end-free uniaxial stretching process to attain a stretching ratio of 3.3 to thereby form an optical film laminate.

In the Example 4, based on the 2-stage stretching consisting of the elevated temperature in-air stretching and the in-boric-acid-solution stretching, and pre-treatments consisting of the insolubilization in advance of the immersion into a dyeing bath and the cross-linking in advance of the in-boric-acid-solution stretching, it becomes possible to stably form an optical film laminate including a 3 μm-thick PVA layer making up a polarizing film, in which PVA molecules of the PVA layer formed on the non-crystallizable PET substrate are highly oriented, and iodine reliably absorbed in the PVA molecules through the dyeing is highly oriented in one direction in the form of a polyiodide ion complex.

Example 5

In the Example 5, an optical film laminate was produced under the same conditions as those in the Example 4, except the following difference. The difference is a thickness of the PVA layer formed on the non-crystallizable PET substrate. In the Example 4, the PVA layer initially had a thickness of 7 μm, and the PVA layer finally included in the optical film laminate had a thickness of 3 μm, whereas, in the Example 5, the PVA layer initially had a thickness of 12 μm, and the PVA layer finally included in the optical film laminate had a thickness of 5 μm.

Example 6

In the Example 6, an optical film laminate was produced under the same conditions as those in the Example 4, except the following difference. The difference is a polymerizing monomer used in the non-crystallizable PET substrate. In the Example 4, the non-crystallizable PET substrate was prepared by copolymerizing PET and isophthalic acid, whereas, in the Example 6, the non-crystallizable PET substrate was prepared by copolymerizing PET and 1,4-cyclohexanedimethanol serving as a modifier group.

Example 7

In the Example 7, an optical film laminate was produced under the same conditions as those in the Example 4, except the following difference. The difference is that a stretching ratio for each of the preliminary in-air stretching and the in-boric-acid-solution stretching was changed to allow a total stretching ratio to become equal to or close to 6.0. In the Example 4, the stretching ratios for the preliminary in-air stretching and the in-boric-acid-solution stretching were set, respectively, to 1.8 and 3.3, whereas, in the Example 7, the two stretching ratios were set, respectively, to 1.2 and 4.9. Meanwhile, the total stretching ratio in the Example 4 was 5.94, whereas the total stretching ratio in the Example 7 was 5.88. The reason is that, in the in-boric-acid-solution stretching, it was unable to perform the stretching at a stretching ratio of 4.9 or more.

Example 8

In the Example 8, an optical film laminate was produced under the same conditions as those in the Example 4, except the following difference. The difference is that a stretching ratio for each of the preliminary in-air stretching and the in-boric-acid-solution stretching was changed to allow a total stretching ratio to become equal to 6.0. In the Example 8, the stretching ratios for the preliminary in-air stretching and the in-boric-acid-solution stretching were set to 1.5 and 4.0, respectively.

Example 9

In the Example 9, an optical film laminate was produced under the same conditions as those in the Example 4, except the following difference. The difference is that a stretching ratio for each of the preliminary in-air stretching and the in-boric-acid-solution stretching was changed to allow a total stretching ratio to become equal to 6.0. In the Example 9, the stretching ratios for the preliminary in-air stretching and the in-boric-acid-solution stretching were set to 2.5 and 2.4, respectively.

Example 10

In the Example 10, an optical film laminate was produced under the same conditions as those in the Example 4, except the following difference. In the Example 4, a stretching temperature for the preliminary in-air stretching was set to 130° C., whereas, in the Example 10, the stretching temperature for the preliminary in-air stretching was set to 95° C.

Example 11

In the Example 11, an optical film laminate was produced under the same conditions as those in the Example 4, except the following difference. In the Example 4, the stretching temperature for the preliminary in-air stretching was set to 130° C., whereas, in the Example 11, the stretching temperature for the preliminary in-air stretching was set to 110° C.

Example 12

In the Example 12, an optical film laminate was produced under the same conditions as those in the Example 4, except the following difference. In the Example 4, the stretching temperature for the preliminary in-air stretching was set to 130° C., whereas, in the Example 12, the stretching temperature for the preliminary in-air stretching was set to 150° C.

Example 13

In the Example 13, an optical film laminate was produced under the same conditions as those in the Example 4, except the following difference. The difference is that the stretching ratio for the preliminary in-air stretching was set to 1.8, and the stretching ratio for the in-boric-acid-solution stretching was changed to 2.8. As a result, in the Example 13, the total stretching ratio was about 5.0 (accurately, 5.04), whereas, in the Example 4, the total stretching ratio was about 6.0 (accurately, 5.94).

Example 14

In the Example 14, an optical film laminate was produced under the same conditions as those in the Example 4, except the following difference. The difference is that the stretching ratio for the preliminary in-air stretching was set to 1.8, and the stretching ratio for the in-boric-acid-solution stretching was changed to 3.1. As a result, in the Example 14, the total stretching ratio was about 5.5 (accurately, 5.58), whereas, in the Example 4, the total stretching ratio was about 6.0 (accurately, 5.94).

Example 15

In the Example 15, an optical film laminate was produced under the same conditions as those in the Example 4, except the following difference. The difference is that the stretching ratio for the preliminary in-air stretching was set to 1.8, and the stretching ratio for the in-boric-acid-solution stretching was changed to 3.6. As a result, in the Example 15, the total stretching ratio was about 6.5 (accurately, 6.48), whereas, in the Example 4, the total stretching ratio was about 6.0 (accurately, 5.94).

Example 16

In the Example 16, an optical film laminate was produced under the same conditions as those in the Example 4, except the following difference. The difference is a stretching scheme in the preliminary in-air stretching. In the Example 4, the preliminary in-air stretching was performed based on an end-free uniaxial stretching process to attain a stretching ratio of 1.8, whereas, in the Example 16, the preliminary in-air stretching was performed based on an end-fixed uniaxial stretching process to attain a stretching ratio of 1.8.

Example 17

In the Example 17, an optical film laminate was produced under the same conditions as those in the Example 16, except the following difference. The difference is that the stretching ratio for the preliminary in-air stretching was set to 1.8, and the stretching ratio for the in-boric-acid-solution stretching was changed to 3.9. As a result, in the Example 17, the total stretching ratio was about 7.0 (accurately, 7.02), whereas, in the Example 16, the total stretching ratio was about 6.0 (accurately, 5.94).

Example 18

In the Example 18, an optical film laminate was produced under the same conditions as those in the Example 16, except the following difference. The difference is that the stretching ratio for the preliminary in-air stretching was set to 1.8, and the stretching ratio for the in-boric-acid-solution stretching was changed to 4.4. As a result, in the Example 18, the total stretching ratio was about 8.0 (accurately, 7.92), whereas, in the Example 16, the total stretching ratio was about 6.0 (accurately, 5.94).

Comparative Example 1

The comparative example 1 has been prepared, under the same conditions as those in the Example 4, by applying a PVA solution was applied to a 200 μm-thick non-crystallizable PET substrate, and drying to form a laminate comprising the non-crystallizable PET substrate and a 7 μm-thick PVA layer formed on the substrate. Then, the laminate including the 7 μm-thick PVA layer was subjected to elevated temperature in-air stretching at a stretching temperature of 130° C. based on an end-free uniaxial stretching process to attain a stretching ratio of 4.0 to thereby form a stretched laminate. Through the stretching, the PVA layer included in the stretched laminate was changed to a 3.5 µm-thick PVA layer having oriented PVA molecules.

Then, the stretched laminate was subjected to dyeing to form a dyed laminate in which iodine is absorbed in the 3.5 µm-thick PVA layer having the oriented PVA molecules. Specifically, the dyed laminate was obtained by immersing the stretched laminate in a dyeing solution having a temperature of 30° C. and containing iodine and potassium iodide, for an arbitrary time, to cause iodine to be absorbed in the PVA layer included in the stretched laminate, so as to allow the PVA layer for making up a target polarizing film to have a single layer transmittance of 40 to 44%. Various dyed laminates different in single layer transmittance and polarization rate were formed by adjusting an amount of iodine to be absorbed in the PVA layer having the oriented PVA molecules, in the above manner Further, the dyed laminated was subjected to cross-linking. Specifically, the dyed laminated was cross-linked in such a manner that it is immersed in a boric acid cross-linking solution containing 3 weight parts of boric acid with respect to 100 weight pars of water and 3 weight parts of potassium iodide with respect to 100 weight pars of water and having a temperature of 40° C., for 60 seconds. The cross-linked dyed laminate in the comparative example 1 corresponds to the optical film laminate in the Example 4. Thus, a cleaning step, a drying step and a lamination and/or transfer step in the comparative example 1 are the same as those in the Example 4.

Comparative Example 2

In the comparative example 2, in the laminates in accordance with the comparative example 1 have been stretched to stretching ratios of 4.5, 5.0 and 6.0, respectively. The following comparative table illustrates phenomena experienced in a 200 µm-thick non-crystallizable PET substrate and a PVA layer formed on the non-crystallizable PET substrate, including the comparative example 1 and 2. Based on the data, it has been verified that the stretching ratio during the elevated temperature in-air stretching at a stretching temperature of 130° C. has an upper limit of 4.0.

Technical Background Relating to Stretching

Figure 18:
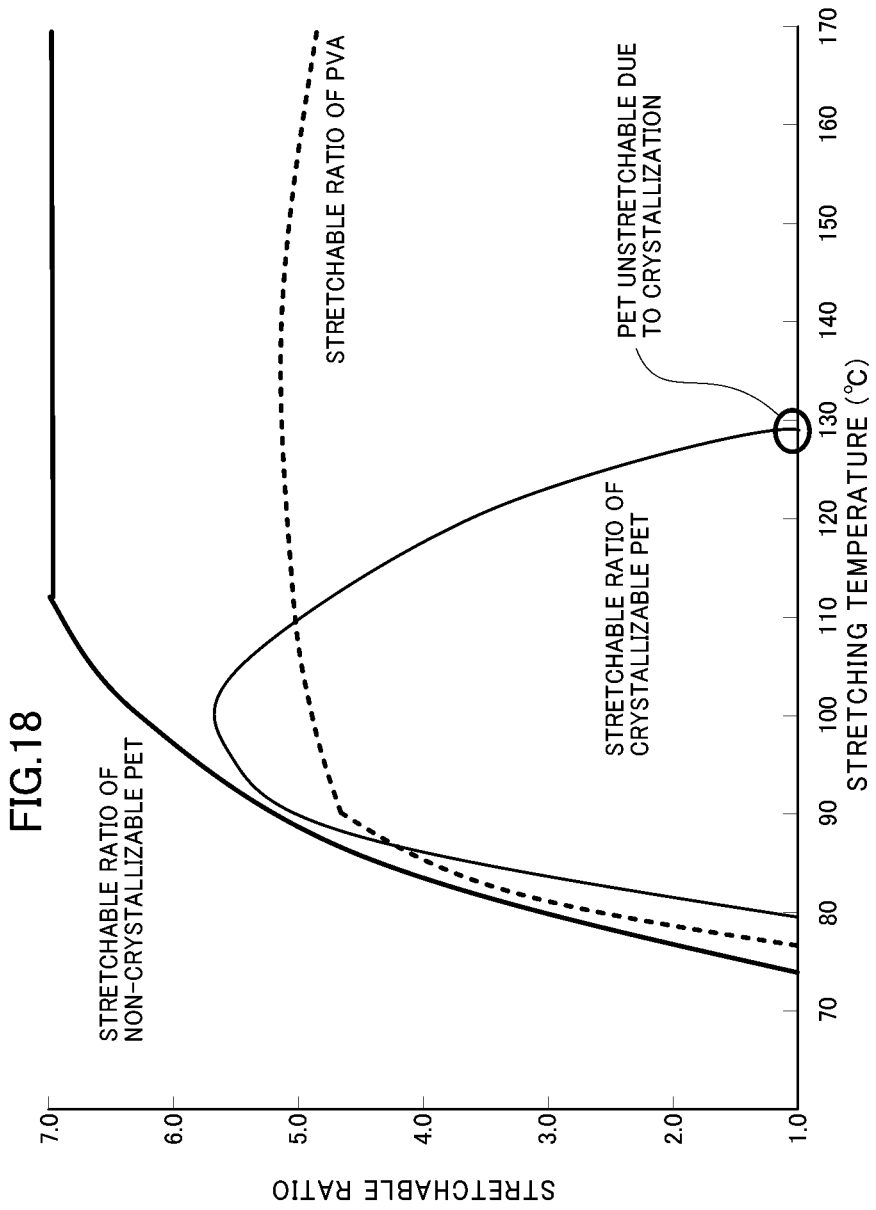
FIG. 18 is a graph illustrating a relative relationship between a stretching temperature and an attainable stretching ratio in each of crystallizable PET, non-crystallizable PET and PVA type resin.

FIGS. 18 to 22 show results derived from experimental tests. Referring first to FIG. 18, there is shown a graph illustrating a relative relationship between a stretching temperature and an attainable stretching ratio in each of a crystallizable PET, a non-crystallizable PET and a PVA type resin, based on experimental tests.

In FIG. 18, the thick solid line indicates a change in attainable stretching ratio in a non-crystallizable PET along with a change in stretching temperature. The non-crystallizable PET has a glass transition temperature Tg of about 75° C., and cannot be stretched at a temperature below this glass transition temperature Tg. As is evident from FIG. 18, a end-free uniaxial stretching process to be performed in air under an elevated temperature (elevated temperature in-air end-free uniaxial stretching) is capable of achieving a stretching ratio of 7.0 or more under a stretching temperature of about 110° C. or more. On the other hand, the thin solid line in FIG. 18 indicates a change in attainable stretching ratio in a crystallizable PET along with a change in stretching temperature. The crystallizable PET has a glass transition temperature Tg of about 80° C., and cannot be stretched under a temperature below this glass transition temperature Tg.

Figure 19:
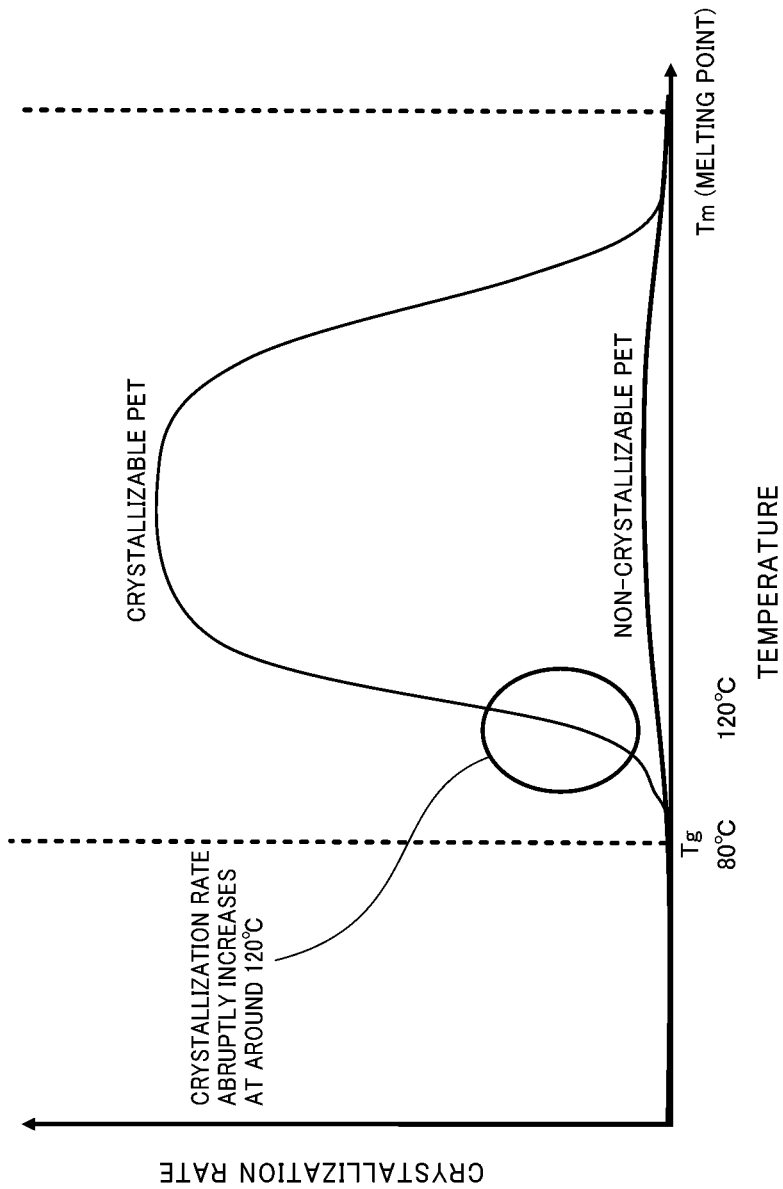
FIG. 19 is a graph illustrating a change in crystallization speed along with a change in temperature between a glass transition temperature Tg and a melting point Tm in each of the crystallizable PET and the non-crystallizable PET.

FIG. 19 illustrates a change in crystallization speed in each of the crystallizable PET and the non-crystallizable PET along with a change in temperature between a glass transition temperature Tg and a melting point Tm of polyethylene terephthalate (PET). FIG. 19 shows that the crystallizable PET in an amorphous state at a temperature of about 80 to 110° C. is rapidly crystallized at about 120° C.

As is clear from FIG. 18, in the crystallizable PET, an attainable stretching ratio during the elevated temperature in-air end-free uniaxial stretching has an upper limit of 4.5 to 5.5. In addition, an applicable stretching temperature is extremely limited, specifically, in the range of about 90° C. to about 110° C.

FIG. 29 illustrates an example where the elevated temperature in-air end-free uniaxial stretching is performed using a crystallizable PET, as reference samples 1 to 3. In each of the reference samples, a 3.3 µm-thick polarizing film was produced by forming a 7 µm-thick PVA layer on a 200 µm-thick crystallizable PET substrate to form a laminate, and stretching the laminate in air under an elevated temperature. There is a difference between the stretching temperatures of the reference samples. Specifically, the stretching temperatures are 110° C. in the reference sample 1, 100° C. in the reference sample 2 and 90° C. in the reference sample 3. It would be worthwhile to note the attainable stretching ratio. An upper limit of the attainable stretching ratio in the reference sample 1 is 4.0, and that of the attainable stretching ratio in each of the reference samples 2 and 3 is 4.5. It was impossible to perform stretching beyond the attainable stretching ratios, because laminates themselves in the reference samples 1 to 3 were finally broken. However, a possibility cannot be denied that the attainable stretching ratio of the PVA type resin layer itself formed on the crystallizable PET has an impact on the above result.

Referring to FIG. 18, the dotted line therein indicates an attainable stretching ratio of PVA belonging to a PVA type resin. A glass transition temperature Tg of the PVA type resin is in the range of 75 to 80° C., and a single layer made of the PVA type resin cannot be stretched at a temperature below the glass transition temperature Tg. As is clear from FIG. 18, the attainable stretching ratio of the single layer of the PVA type resin during the elevated temperature in-air end-free uniaxial stretching is limited to up to 5.0. Thus, the inventors have been able to clarify that, from the relationship between the stretching temperature and the attainable stretching ratio of each of a crystallizable PET and a PVA type resin, an attainable stretching ratio of a laminate comprising a crystallizable PET substrate and a PVA type resin layer formed on the substrate, during the elevated temperature in-air end-free uniaxial stretching, is limited to up to the range of 4.0 to 5.0 at a stretching temperature ranging from 90 to 110° C.

An example in which a laminate prepared by coating a PVA type resin layer on a non-crystallizable PET substrate is subjected to an end-free uniaxial stretching in air under elevated temperature is shown as comparative examples 1 and 2 in the following Table 1. In the non-crystallizable PET substrate, there is no constraint of stretching temperature. In the comparative example 1, a polarizing film was produced by forming a 7 µm-thick PVA type resin layer on a 200 µm-thick non-crystallizable PET substrate to form a laminate, and subjecting the laminate to the elevated temperature in-air end-free uniaxial stretching at a stretching temperature of 130° C. The stretching ratio in the comparative example 1 was 4.0.

Referring to Table 1, in the comparative example 2, as with the comparative example 1, polarizing films were prepared by forming a 7 µm-thick PVA type resin layer on a 200 µm-thick non-crystallizable PET substrate to form a laminate, and stretching the laminate to allow the stretching ratio to become 4.5, 5.0 and 6.0. As illustrated in Table 1, in each of the polarizing films, there has been observed non-uniform stretching or breaking in the film surfaces of the non-crystalline PET substrates, and breaking of the PVA type resin layer at a stretching ratio of 4.5. Based on the data, it has been verified that the stretching ratio of the PVA type resin layer during the elevated temperature in-air end-free uniaxial stretching at a stretching temperature of 130° C. is limited to up to 4.0.

001460. This is based on findings with a focus on a plasticizing function of water with which a laminate comprising a PET substrate and a PVA type resin layer formed on the substrate can be stretched even at a stretching temperature below a glass transition temperature Tg thereof. An example of a polarizing film produced by this process is shown as a comparative example 3 herein. In accordance with this method, the laminate comprising the PET substrate and the PVA type resin layer formed on the substrate can be stretched at a stretching ratio of up to 5.0.

TABLE 1

| | | Stretched film | |
|---|---|---|---|
| Stretching Temperature | Stretching Ratio | Non-crystallizable PET substrate (isophthalic acid-copolymerized PET) | Laminate of PVA type resin layer and non-crystallizable PET substrate |
| Comparative example 1 | 4.0 | ○ Uniformly stretched without breakage | ○ Uniformly stretched without breakage |
| Comparative example 2 | 4.5 | Δ No breakage but occurrence of non-uniform stretching | x Breakage of laminate of PVA type resin layer and non-crystallizable PET substrate |
| | 5.0 | Δ No breakage but occurrence of non-uniform stretching | Untested |
| | 6.0 | x Breakage | Untested |

In each of the reference samples 1 to 3, although there is a difference in stretching temperature, a dyed laminate was produced by steps of forming a PVA type resin layer on a crystallizable PET substrate to form a laminate, subjecting the laminate to stretching at a stretching ratio of 4.0 to 4.5 to allow PVA molecules to be oriented, and causing iodine to be absorbed in the thinned PVA type resin layer. Specifically, the stretched laminate was immersed in a dyeing solution containing iodine and potassium iodide under a temperature of 30° C., for an arbitrary time, to cause iodine to be absorbed in the PVA type resin layer included in the stretched laminate, so that the PVA type resin layer constituting a target polarizing film has a single layer transmittance of 40 to 44%. In addition, the amount of iodine to be impregnated in the PVA type resin layer was adjusted to produce various polarizing films having different single layer transmittance T and polarization rate P.

Referring to FIG. 26, the line 1 and the line 2 in FIG. 26 define optical characteristics required for a polarizing film for use in an optical display device, according to the present invention, wherein any polarizing film located above the line 1 or 2 in terms of the relationship between the polarization rate P and the transmittance T satisfies the required optical characteristics. In FIG. 26, respective optical characteristics of polarizing films in the reference samples 1 to 3 are illustrated in comparison with the lines 1 and 2. As seen in FIG. 26, none of the polarizing films in the reference samples 1 to 3 satisfies the required optical characteristics. The reason is because it is assumed that, although PVA molecules in the PVA type resin layer formed on the crystallizable PET substrate are oriented to a certain degree through the elevated temperature in-air stretching, the elevated temperature in-air stretching facilitates crystallization of the PVA molecules preventing non-crystalline portions of the molecules from being oriented.

Therefore, prior to the present invention, the inventors have developed a polarizing film and a production method therefor disclosed in the international application PCT/JP 2010/

Through subsequent researches, the inventors have ascertained that the stretching ratio is limited to up to 5.0 because the PET substrate is made of crystallizable PET. Previously, the inventors have considered that the stretching function would not largely be affected by the crystallizing property of the substrate, since a laminate comprising a PET substrate and a PVA type resin layer formed on the substrate was stretched in a boric acid aqueous solution at a temperature below a glass transition temperature Tg. However, it was found that, in cases where the PET substrate is made of non-crystallizable PET, the laminate can be stretched at a stretching ratio of up to 5.5. It is assumed that, in a polarizing film production method equivalent to the comparative example 3, the stretching ratio is limited to up to 5.5, due to the non-crystallizable PET substrate which poses a limit on the stretching ratio.

In the comparative example 1, various polarizing films having different single layer transmittance T and polarization rate P were prepared. Respective optical characteristics of the polarizing films are illustrated in FIG. 26 together with those in the reference samples 1 to 3.

Figure 20:
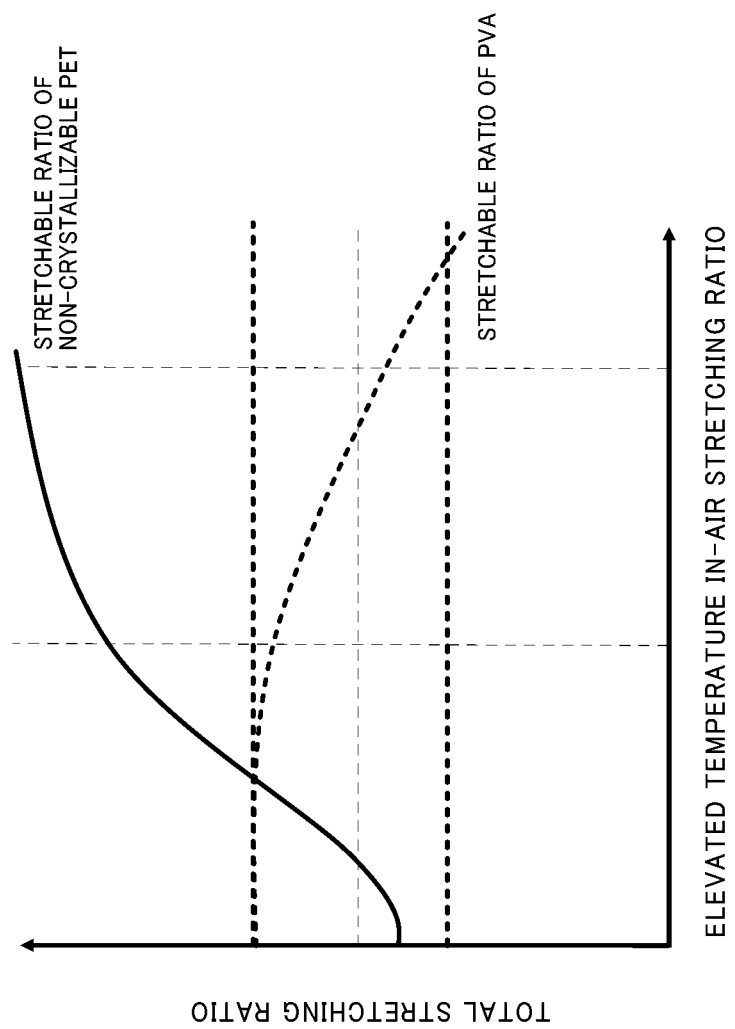
FIG. 20 is a graph illustrating a relationship between a stretching ratio during elevated temperature in-air stretching and a total stretching ratio, in the non-crystallizable PET and the PVA type resin.

FIG. 20 illustrates the relationship between the stretching ratio through the elevated temperature in-air stretching, and the overall or total stretching ratio (hereinafter referred to as "total stretching ratio") under the 2-stage stretching, which has been conceived based on the above inventors' research results, wherein the horizontal axis represents a stretching ratio under the elevated temperature in-air stretching at a stretching temperature of 130° C. carried out by an end-free uniaxial stretching process, and the vertical axis represents a total stretching ratio which indicates how many times an original length is finally stretched by the 2-stage stretching including the elevated temperature in-air stretching carried out by an end-free uniaxial stretching process on an assumption that the original length, i.e., a length before the elevated temperature in-air stretching, is 1. For example, in the cases where the stretching ratio under the elevated temperature in-air stretching at a stretching temperature of 130° C. is 2.0, and the stretching ratio under the second-stage stretching is 3.0, the total stretching ratio will be 6.0 (2.0×3.0=6). The second-stage stretching after the elevated temperature in-air stretching is a end-free uniaxial stretching process to be performed within a boric acid aqueous solution at a stretching temperature of 65° C. (the stretching through a boric acid aqueous solution immersion process will hereinafter be referred to as "in-boric-acid-solution stretching"). The result illustrated in FIG. 20 can be obtained by combining the two stretching processes.

The solid line in FIG. 20 indicates an attainable stretching ratio in a non-crystallizable PET. In the cases where the in-boric-acid-solution stretching is directly performed without performing the elevated temperature in-air stretching, i.e., the stretching ratio during the elevated temperature in-air stretching is 1, the total stretching ratio of the non-crystallizable PET is limited to up to 5.5. If stretching is performed beyond this value, the non-crystallizable PET will be broken. However, this value corresponds to the minimum stretching ratio of the non-crystallizable PET. The total stretching ratio of the non-crystallizable PET can be increased in accordance with an increase in the stretching ratio under the elevated temperature in-air stretching, and the attainable stretching ratio can be greater than 10.0.

On the other hand, the dotted line in FIG. 20 indicates an attainable stretching ratio of a PVA type resin layer formed on the non-crystallizable PET. In the cases where the in-boric-acid-solution stretching is directly performed without performing the elevated temperature in-air stretching, the total stretching ratio of the PVA type resin layer is 7.0, which is the maximum stretching ratio under this process. However, the total stretching ratio of the PVA type resin layer becomes smaller along with an increase in the stretching ratio under the elevated temperature in-air stretching. At a point where the elevated temperature in-air stretching ratio is 3.0, the total stretching ratio of the PVA type resin layer becomes less than 6.0. If it is attempted to increase the total stretching ratio of the PVA type resin layer up to 6.0, the PVA type resin layer will be broken. As is also clear from FIG. 20, depending on the level of the stretching ratio during the elevated temperature in-air stretching, a factor causing a laminate comprising a non-crystallizable PET substrate and a PVA type resin layer formed on the substrate to become unable to be stretched is changed from the non-crystallizable PET substrate to the PVA type resin layer. For reference, the stretching ratio of PVA under the elevated temperature in-air stretching is up to 4.0, and the PVA cannot be stretched beyond this value. It is assumed that this stretching ratio corresponds to the total stretching ratio of the PVA.

Figure 21:
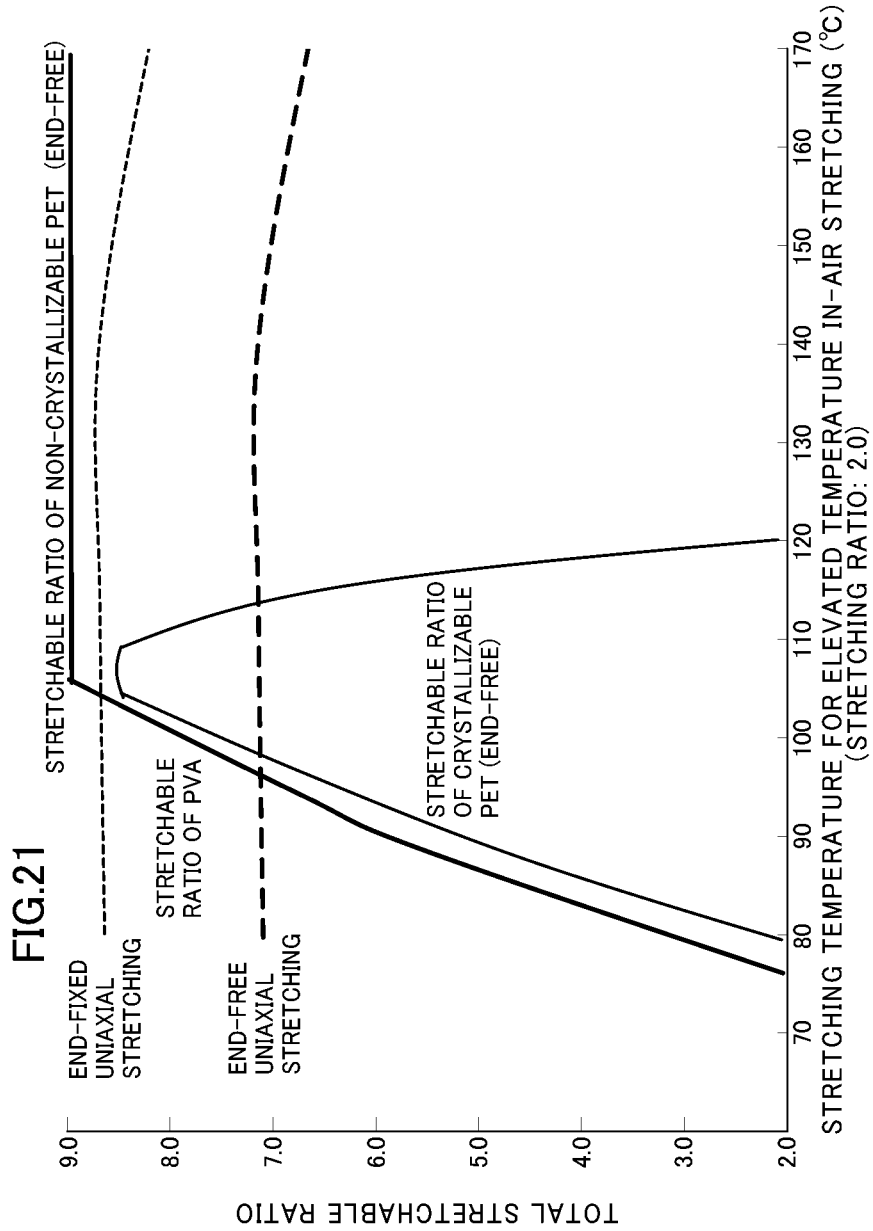
FIG. 21 is a graph illustrating a relative relationship between a stretching temperature during the elevated temperature in-air stretching and a total attainable stretching ratio, in each of the crystallizable PET, the non-crystallizable PET and the PVA type resin.

Referring now to FIG. 21, FIG. 21 is a graph indicating the relationship between the stretching temperature during the elevated temperature in-air stretching and the total attainable stretching ratio in the 2-stage stretching consisting of the elevated temperature in-air stretching and the in-boric-acid-solution stretching, in each of crystallizable PET, non-crystallizable PET and PVA type resin, wherein the graph is plotted based on experimental data. FIG. 18 illustrates characteristics of a crystallizable PET, a non-crystallizable PET and a PVA type resin, wherein the horizontal axis represents the stretching temperature under the elevated temperature in-air stretching, and the vertical axis represents an attainable stretching ratio under the elevated temperature in-air stretching. FIG. 21 is different from FIG. 18 in that the horizontal axis represents the stretching temperature when the stretching ratio under the elevated temperature in-air stretching ratio is 2.0, and the vertical axis represents the total attainable stretching ratio during the elevated temperature in-air stretching and the in-boric-acid-solution stretching.

The method of producing a polarizing film which can be used in the present invention comprises a combination of 2-stage stretching steps consisting of elevated temperature in-air stretching and in-boric-acid-solution stretching, as will be described later. The combination of 2-stage stretching steps is not the one which is simply conceivable. Through various long-term researches, the inventors have finally reached a surprising conclusion that the following two technical problems can be simultaneously solved only by the combination. In an attempt to produce a polarizing film by forming a PVA type resin layer on a thermoplastic resin substrate to form a laminate, and subjecting the laminate to stretching and dyeing, there are two technical problems which have been considered to be impossible to overcome.

The first technical problem is that the stretching ratio and the stretching temperature each having an impact on improvement in molecular orientation of a PVA type resin are largely restricted by the thermoplastic resin substrate on which the PVA type resin layer is formed.

The second technical problem is that, for example, even if the problem on restrictions to the stretching ratio and the stretching temperature can be overcome, stretching of the PVA type resin is restricted due to its crystallization because crystallization and stretchability of a crystallizable resin such as the PVA type resin and PET used for the thermoplastic resin substrate are incompatible physical properties.

The first technical problem will further be discussed in the followings. One of the restrictions in producing a polarizing film using a thermoplastic resin substrate is caused by the property of the PVA type resin wherein the stretching temperature is above the glass transition temperature Tg (about 75 to 80° C.) thereof and its attainable stretching ratio is in the range of 4.5 to 5.0. If a crystallizable PET is used as a material for the thermoplastic resin substrate, the stretching temperature is further restricted to 90 to 110° C. It has been considered that any polarizing film cannot be free from the above restriction as long as it is produced by a process of forming a PVA type rein layer on a thermoplastic resin substrate to form a laminate, and subjecting the laminate to the elevated temperature in-air stretching to have the PVA type rein layer included in the laminate decreased in thickness.

Therefore, with a focus on a plasticizing function of water, the inventors have proposed in-boric-acid-solution stretching capable of serving as an alternative to the elevated temperature in-air stretching. However, even in the in-boric-acid-solution stretching at a stretching temperature of 60 to 85° C., it has been difficult to overcome the restriction caused by the thermoplastic resin substrate, specifically, a restriction that the stretching ratio attainable in a crystallizable PET is limited to up to 5.0, and the stretching ratio attainable in a non-crystallizable PET is limited to up to 5.5. These facts cause a restriction on improvement in orientation of PVA molecules, which leads to a restriction to optical characteristics of the thinned polarizing film of a reduced thickness. This is the first technical problem.

Figure 22:
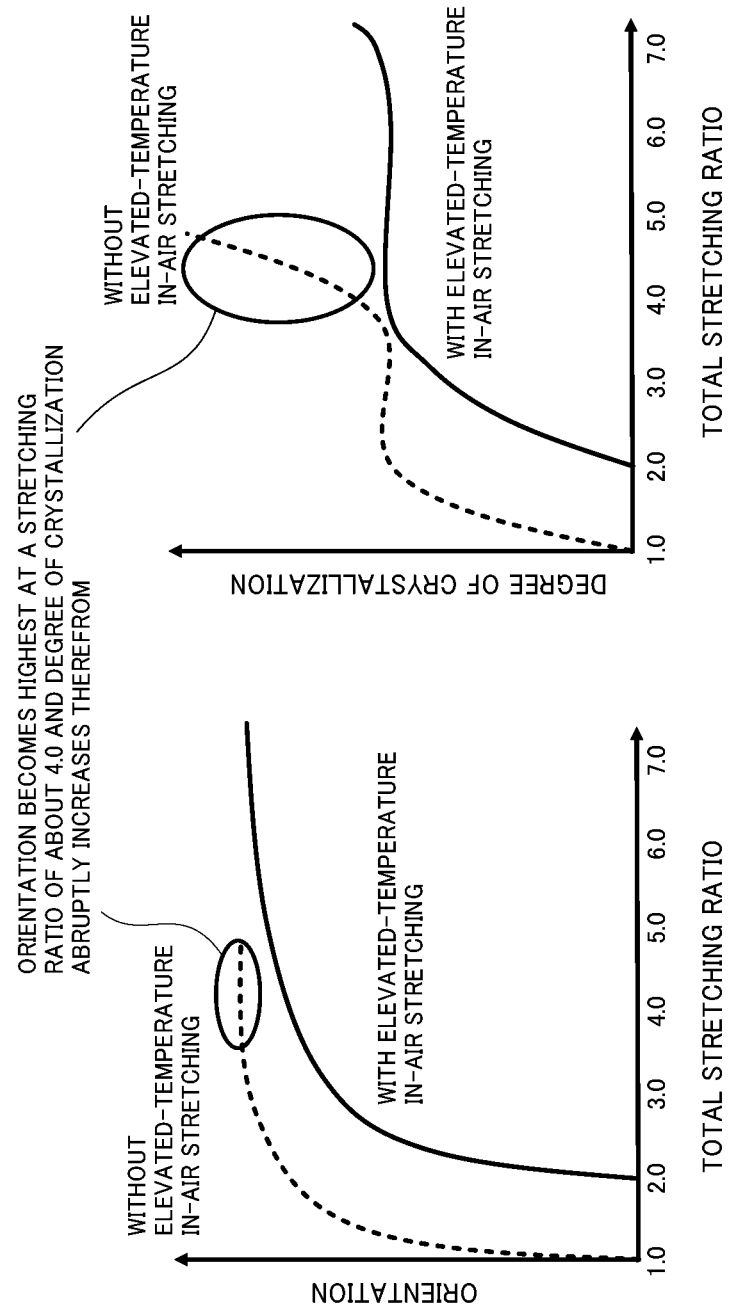
FIG. 22 is a graph illustrating a molecular orientation and a degree of crystallization with respect to a total stretching ratio, in PET to be used as a thermoplastic resin substrate.

A solution to the first technical problem can be explained based on FIG. 22. FIG. 22 includes two related graphs, one being a diagram illustrating a molecular orientation of a PET used as the thermoplastic resin substrate, and the other illustrating a degree of crystallization of the PET, wherein the horizontal axis commonly represents the total stretching ratio obtained through the elevated temperature in-air stretching and the in-boric-acid-solution stretching. Each of the dotted lines in FIG. 22 indicates the total stretching ratio obtained through only the in-boric-acid-solution stretching. Regardless of whether crystallizable or non-crystallizable, the extent of crystallization of the PET is sharply increased at a total stretching ratio of 4.0 to 5.0. Thus, even in cases where the in-boric-acid-solution stretching is employed, the stretching ratio is limited to up to 5.0 or 5.5. At this stretching ratio, the molecular orientation is maximized, and there will be a sharp increase in the stretching tension. As the result, stretching becomes no longer possible.

On the other hand, the solid lines in FIG. 22 illustrate the result of the 2-stage stretching in which the elevated temperature in-air end-free uniaxial stretching is performed at a stretching temperature of 110° C. to attain a stretching ratio of 2.0, and then the in-boric-acid-solution stretching is performed at a stretching temperature of 65° C. Regardless of whether crystallizable or non-crystallizable, the extent of crystallization of the PET is never sharply increased, differently from the cases where only the in-boric-acid-solution stretching is performed. This allows the total stretchable ratio to be increased up to 7.0. At this total stretchable ratio, the molecular orientation is maximized, and the stretching tension is sharply increased. As is clear from FIG. 21, this would result from employing the elevated temperature in-air end-free uniaxial stretching as the first-stage stretching. In contrast, if the elevated temperature in-air stretching is performed simultaneously constraining the contraction in the direction perpendicular to the direction of the stretching, i.e., based on a so-called "end-fixed uniaxial stretching process", as described later, the total attainable stretching ratio can be increased up to 8.5.

Figure 23:
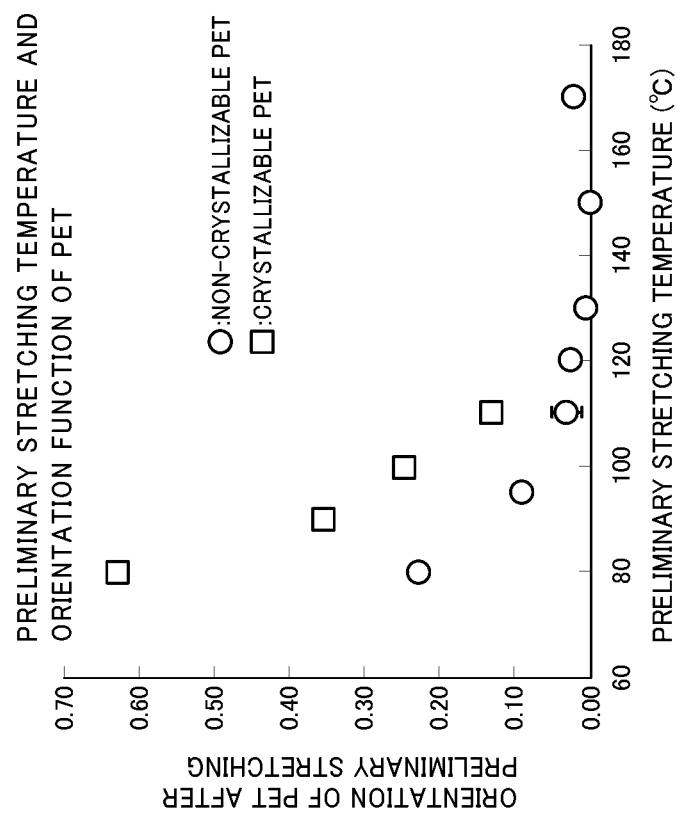
FIG. 23 is a graph illustrating a relationship between a preliminary stretching temperature during preliminary in-air stretching at a stretching ratio of 1.8, and an orientation function of PET after the preliminary in-air stretching.

The relationship between the molecular orientation and the extent of crystallization of the PET used as a material for the thermoplastic resin substrate, illustrated in FIG. 22, shows that crystallization of the PET can be suppressed, regardless of whether crystallizable or non-crystallizable, by performing a preliminary stretching based on the elevated temperature in-air stretching. However, referring to FIG. 23 which illustrates the relationship between the preliminary stretching temperature and the molecular orientation of the PET, it is noted that, in the cases where a crystallizable PET is used as a material for the thermoplastic resin substrate, the molecular orientation of the crystallizable PET after the preliminary stretching is 0.30 or more at 90° C., 0.20 or more at 100° C., and 0.10 or more even at 110° C. If the molecular orientation of the PET becomes equal to or greater than 0.10, there will be an increase in the stretching tension in the second-stage stretching performed within a boric acid aqueous solution, and there will be a consequent increase in the load imposed on a stretching apparatus, which is undesirable in terms of production conditions. FIG. 23 shows that it is preferable to use, as a material for the thermoplastic resin substrate, a non-crystallizable PET, more preferably a non-crystallizable PET having an orientation function of 0.10 or less, particularly preferably a non-crystallizable PET having an orientation function of 0.05 or less.

FIG. 23 illustrates experimental data indicating the relationship between the stretching temperature in the elevated temperature in-air stretching at a stretching ratio of 1.8 and the orientation function of the PET used as a material for the thermoplastic resin substrate. As is clear from FIG. 23, the PET having an orientation function of 0.10 or less and allowing a stretched laminate to be stretched within a boric acid aqueous solution at a high stretching ratio is a non-crystallizable PET. Particularly, in the cases where the orientation function is 0.05 or less, the non-crystallizable PET can be steadily stretched at a high stretching ratio without subjecting the stretching apparatus to a substantial load which may cause, for example, an increase in the stretching tension, during the second-stage in-boric-acid-solution stretching. This feature can also be easily understood from values of the orientation function in the Examples 1 to 18 and the reference samples 1 to 3 in FIG. 29.

By solving the first technical problem, it has become possible to eliminate restrictions to the stretching ratio which would otherwise be caused by the PET substrate, and increase the total stretching ratio to improve the molecular orientation of the PVA type resin. Thus, optical characteristics of the polarizing film can be significantly improved. However, an improvement in the optical characteristics achieved by the inventors is not limited thereto. Further improvement will be achieved by solving the second technical problem.

Figure 24:
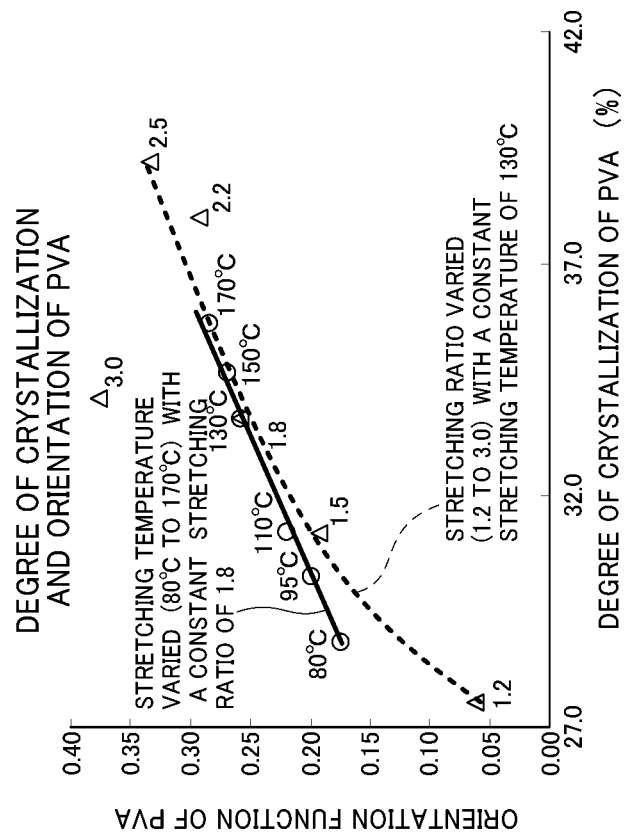
FIG. 24 is a graph illustrating a relationship between a degree of crystallization and a orientation function of PVA.
Figure 25:
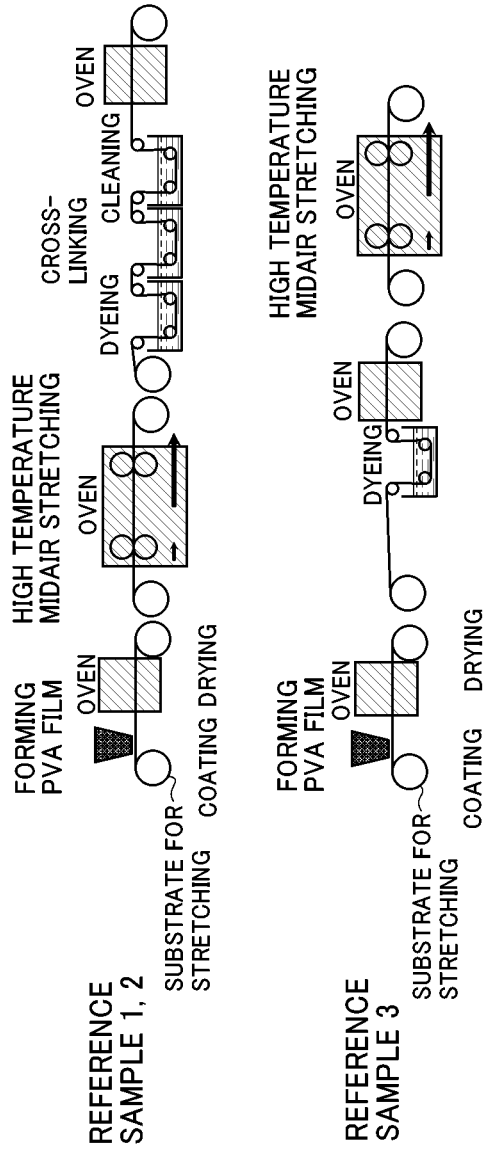
FIG. 25 is a schematic diagram illustrating a production process of producing a polarizing film using a thermoplastic resin substrate.

The second technical problem will further be discussed in the followings. One of the features inherent to a PVA type resin and a crystallizable resin such as PET as a material for the thermoplastic resin substrate is that, in general, polymer molecules are orderly arranged by heating and stretching/orienting and thereby crystallization is progressed. Stretching of the PVA type resin is restricted by crystallization of the PVA type resin which is a crystallizable resin. Crystallization and stretchability are mutually incompatible physical properties, and it has been commonly recognized that progress in crystallization of the PVA type resin hinders the molecular orientation of the PVA type resin. This is the second technical problem. Means for solving the second technical problem can be explained based on FIG. 24. In FIG. 24, each of the solid line and the dotted line indicates the relationship between the extent of crystallization or the crystallization degree and the orientation function of the PVA type resin, calculated based on two experimental results.

The solid line in FIG. 24 indicates the relationship between the extent of crystallization and the orientation function of a PVA type resin in each of six samples provided in the following manner. Firstly, six laminates each comprising a non-crystallizable PET substrate and a PVA type resin layer formed on the substrate were prepared under the same conditions. The prepared six laminates each including the PVA type resin layer were subjected to the elevated temperature in-air stretching, respectively, at different stretching temperatures of 80° C., 95° C., 110° C., 130° C., 150° C. and 170° C., to attain the same stretching ratio of 1.8, so as to obtain six stretched laminates each including a PVA type resin layer. Then, the extent or degree of crystallization of the PVA type resin layer included in each of the stretched laminates and an orientation function of the PVA type resin were measured and analyzed. Details of methods of the measurement and analysis will be described later.

Similarly, the dotted line in FIG. 24 indicates the relationship between the extent or degree of crystallization and the orientation function of a PVA type resin layer in each of six samples provided in the following manner. Firstly, six laminates each comprising a non-crystallizable PET substrate and a PVA type resin layer formed on the substrate were prepared under the same conditions. The prepared six laminates each including the PVA type resin layer were stretched by the elevated temperature in-air stretching at the same stretching temperature of 130° C. to attain different stretching ratios of 1.2, 1.5, 1.8, 2.2, 2.5 and 3.0, respectively, so as to obtain six stretched laminates each including a PVA type resin layer. Then, the extent of crystallization of the PVA type resin layer included in each of the stretched laminates and the orientation function of the PVA type resin were measured and analyzed by the methods which will be described later.

The solid line in FIG. 24 shows that the molecular orientation of the PVA type resin included in the stretched laminate is improved as the stretching temperature during the elevated temperature in-air stretching is set to a higher value. Further, the dotted line in FIG. 24 shows that the molecular orientation of the PVA type resin included in the stretched laminate is improved as the stretching ratio during the elevated temperature in-air stretching is set to a higher value. In other words, in advance of the second-stage in-boric-acid-solution stretching, the molecular orientation of the PVA type resin is improved, i.e., the extent of crystallization of the PVA type resin is increased. This leads to improvement in molecular orientation of the PVA type resin after the in-boric-acid-solution stretching. In addition, the improvement in molecular orientation of the PVA type resin leads to an improvement in orientation of polyiodide ions. This can be ascertained from the T-P graphs of the Examples as described later.

As above, it has been possible to attain an unanticipated remarkable result in that the orientation of PVA molecules in the PVA type resin layer formed by the second-stage in-boric-acid-solution stretching can be further improved by setting the stretching temperature or the stretching ratio during the first-stage elevated temperature in-air stretching to a higher value.

Reference will now be made to the crystallization degree or extent of crystallization (horizontal axis) of the PVA type resin illustrated in FIG. 24. Preferably, the extent of crystallization of PVA type resin layer should be 27% or more so as to allow a dyed laminate to be formed without causing a problem such as dissolution of the PVA type resin layer, in a dyeing step of immersing the stretched laminate including the PVA type resin layer in a dyeing aqueous solution. This makes it possible to dye the PVA type resin layer without causing dissolution of the PVA type resin layer. The crystallization degree of the PVA type resin layer may be set to 30% or more. In this case, the stretching temperature during the in-boric-acid-solution stretching can be increased. This makes it makes it possible to stably perform the stretching of the dyed laminate and stably produce a polarizing film.

On the other hand, if the crystallization degree of the PVA type resin layer is 37% or more, dyeability of the PVA type resin layer will be deteriorated, and thereby it is necessary to increase a concentration of the dyeing aqueous solution, so that an amount of material to be used, and a required time for the dyeing, will be increased, which is likely to cause deterioration in productivity. If the crystallization degree of the PVA type resin layer is 40% or more, another problem, such as breaking of the PVA type resin layer during the in-boric-acid-solution stretching, is likely to occur. Therefore, the extent of crystallization of the PVA type resin is preferably determined in the range of 27% to 40%, more preferably in the range of 30% to 37%.

Reference is now made to the orientation function (vertical axis) of the PVA type resin layer illustrated in FIG. 24. Preferably, the orientation function of the PVA resin layer is set to 0.05 or more so as to allow a highly functional polarizing film to be prepared using a non-crystallizable PET resin substrate. The orientation function of the PVA type resin layer may be set to 0.15 or more. In this case, the stretching ratio during the in-boric-acid-solution stretching for the dyed laminate including the PVA type resin layer can be reduced. This makes it possible to prepare a polarizing film having a larger width.

On the other hand, if the orientation function of the PVA type resin layer is set to 0.30 or more, the dyeability will be deteriorated, and thereby it is necessary to increase the concentration of the dyeing aqueous solution, so that an amount of material to be used, and a required time for the dyeing, will be increased, which is likely to cause deterioration in productivity. If the orientation function of the PVA type resin layer is set to 0.35 or more, another problem, such as breaking of the PVA type resin layer during the in-boric-acid-solution stretching, is likely to occur. Therefore, the orientation function of the PVA type resin is preferably set in the range of 0.05 to 0.35, more preferably in the range of 0.15 to 0.30.

Means for solving the first technical problem is to auxiliarily or preliminarily stretch a laminate comprising a non-crystallizable PET substrate and a PVA type resin layer formed on the substrate by the first-stage elevated temperature in-air stretching, whereby the PVA type resin layer can be stretched at a higher stretching ratio by the second-stage in-boric-acid-solution stretching without being restricted by the stretching ratio of the non-crystallizable PET substrate, so that the molecular orientation of the PVA is sufficiently improved.

Means for solving the second technical problem is to auxiliarily or preliminarily set the stretching temperature during the first-stage elevated temperature in-air stretching to a higher value, or auxiliarily or preliminarily set the stretching ratio during the first-stage elevated temperature in-air stretching to a higher value, whereby an unanticipated result has been provided that the orientation of PVA molecules in the PVA type resin layer formed by the second-stage in-boric-acid-solution stretching is further improved. In either case, the first-stage elevated temperature in-air stretching can be regarded as auxiliary or preliminary in-air stretching means for the second-stage in-boric-acid-solution stretching. The "first-stage elevated temperature in-air stretching" will hereinafter be referred to as "preliminary in-air stretching", in contrast to the second-stage in-boric-acid-solution stretching.

In particular, a mechanism for solving the second technical problem by performing the "preliminary in-air stretching" can be assumed as follows. As is ascertained in FIG. 24, the molecular orientation of the PVA type resin after the preliminary in-air stretching is improved as the preliminary in-air stretching is performed at a higher temperature or a higher ratio. It is assumed that this is because the stretching is performed in a more progressed state of crystallization of the PVA type resin as the stretching temperature or rate becomes higher. Consequently, the molecular orientation of the PVA type resin is improved. In this manner, the molecular orientation of the PVA type resin is improved by the preliminary in-air stretching in advance of the in-boric-acid-solution stretching. In this case, it is assumed that, when the PVA type resin is immersed in a boric acid aqueous solution, boric acid can be easily cross-linked with the PVA type resin, and the stretching is performed under a condition that nodes are being formed by the boric acid. Consequently, the molecular orientation of the PVA type resin is further improved after the in-boric-acid-solution stretching.

Considering all the above factors together, a polarizing film having a thickness of 10 nm or less and optical characteristics satisfying the following condition (1) or (2) can be obtained by performing stretching based on the 2-stage stretching consisting of a preliminary in-air stretching and an in-boric-acid-solution stretching:

$P > -(10^{0.929T-42.4}-1) \times 100$ (where $T<42.3$); and $P \geq 99.9$ (where $T \geq 42.3$), or     Condition (1)

$T \geq 42.5$; and $P \geq 99.5$     Condition (2)

wherein T is a single layer transmittance, and P is a polarization rate. The dichroic material may be iodine or a mixture of iodine and an organic dye.

A polarizing film having optical characteristics in which the single layer transmittance T and the polarization rate P fall within the ranges represented by the above conditions fundamentally has performance required for use in a display device for a liquid-crystal television using a large-sized display element, or performance required for use in an organic EL display device. Specifically, for liquid-crystal televisions, it is possible to produce an optical display device having a contrast ratio of 1000:1 or more, and, a maximum luminance of 500 cd/m² or more. In this specification, this performance will be referred to as "required performance". This polarizing film can also be used in an optically functional film laminate to be laminated to a viewing side of an organic EL display panel.

When used with a liquid-crystal display panel, a polarizing film to be disposed on one of a backlight and viewing sides of the liquid-crystal display panel must have polarization performance satisfying at least the above optical characteristics. Further, in cases where a polarizing film having a polarization rate of 99.9% or less is disposed on one of the backlight and viewing sides, it will become difficult to achieve the required performance, even if a polarizing film having highest possible polarization performance is disposed on the other side.

Reference will now be made to FIG. 1 illustrating the result of verification on whether the thickness of a non-crystallizable ester type thermoplastic resin substrate and the coating thickness of a PVA type resin layer (a thickness of a polarizing film) are likely to pose a certain problem. In FIG. 1, the horizontal axis represents the thickness of the thermoplastic resin substrate designated in units of μm, and the vertical axis represents the thickness of the PVA type resin layer coated on the substrate. On the vertical axis, the numeral in parentheses indicates the thickness of a polarizing film formed by subjecting the PVA type resin layer on the substrate to stretching and dyeing. As illustrated in FIG. 1, if the thickness of the substrate is 5 times or less the thickness of PVA type resin layer, a problem is likely to occur in terms of transportability or feedability. On the other hand, if the thickness of the polarizing film obtained through the stretching and dyeing becomes equal to or greater than 10 μm, a problem is likely to occur in terms of crack resistance of the polarizing film.

As a material for the thermoplastic resin substrate, it is preferable to use a non-crystallizable ester type resin. This type of thermoplastic resin may be non-crystallizable polyethylene terephthalate comprising polyethylene terephthalate copolymerized with one selected from the group consisting of isophthalic acid, cyclohexanedimethanol and other crystallization inhibitor. The substrate may be made of a transparent resin.

Preferably, a dichroic material for dyeing a polyvinyl alcohol type resin is iodine, or a mixture of iodine and an organic dye.

In the present invention, a separator may be releasably laminated or attached to a surface of the thermoplastic resin substrate on a side opposite to surface on which the PVA type resin layer is formed, through an adhesive layer. In this case, the thermoplastic resin substrate, e.g., a non-crystallizable ester type thermoplastic resin substrate, may be used to serve as a protective film for a polarizing film, and for this purpose, the resin substrate must be optically transparent.

In another embodiment of the present invention, an optical film laminate may be formed by laminating an optically functional film to a surface of the thermoplastic resin substrate such as a non-crystallizable ester type thermoplastic resin substrate, on which the PVA type resin layer is not formed, and releasably attaching a separator onto the optically functional film through an adhesive layer. In this case, the optically functional film may be formed as a biaxial phase difference film which has three-dimensional anisotropy of refraction index and satisfies the following relationship: nx>ny>nz, wherein, nx and ny are refractive indexes in in-plane x-axis and y-axis directions, respectively, and nz is a refractive index in a thickness direction.

As is evidenced from FIG. 1, the thickness of the thermoplastic resin substrate, such as the non-crystallizable ester type thermoplastic resin substrate is preferably 6 times or more, more preferably 7 times or more, the thickness of the PVA type resin layer formed on the substrate. In cases where the thickness of the non-crystallizable ester type thermoplastic resin substrate is 6 times or more with respect to the PVA type resin layer, it becomes possible to prevent the occurrence of problems in terms of transformability or feedability, e.g., breaking during transportation or feeding in a production process due to excessively low film strength, or problems in terms of curling and transferability of the polarizing film when it is disposed on one of backlight and viewing sides of a liquid-crystal display device.

Preferably, the non-crystallizable ester type thermoplastic resin substrate is non-crystallizable polyethylene terephthalate comprising polyethylene terephthalate copolymerized with one selected from the group consisting of isophthalic acid, cyclohexanedimethanol and other crystallization inhibitor, wherein the non-crystallizable polyethylene terephthalate is set to have an orientation function of 0.10 or less and subjected to the elevated temperature in-air stretching. The substrate may be made of a transparent resin.

In implementation of the method of the present invention, wherein a polarizing film comprising a PVA type resin, using a thermoplastic resin substrate, an insolubilization process for insolubilizing the PVA type resin is regarded as a key technical problem as will be specifically described below.

In cases where the PVA type resin layer formed on the thermoplastic resin substrate is subjected to stretching, it is not easy to cause iodine to be impregnated in the PVA type resin layer, while preventing the PVA type resin layer included in a stretched intermediate product or a stretched laminate from being dissolved in a dyeing solution. In a production process of a polarizing film, a step of causing iodine to be absorbed in a thinned PVA type resin layer is essential. In a conventional dyeing step, an amount of iodine to be absorbed in the PVA type resin layer is adjusted by using a plurality of dyeing solutions having different iodine concentrations ranging from 0.12 to 0.25 wt %, and keeping an immersion time constant. In such a conventional dyeing step, dissolution of the PVA type resin layer will occur during production of a polarizing film to preclude dyeing. As used here, the term "concentration" means a mixing ratio with respect to a total amount of the solution. Further, the term "iodine concentration" means a mixing ratio of iodine to a total amount of the solution, wherein an amount of iodine added as an iodide such as potassium iodide is not included therein. In the following description, the terms "concentration" and "iodine concentration" will be used as the same meanings.

As is clear from the test result illustrated in FIG. 6, the above technical problem can be solved by setting a concentration of iodine as the dichroic material to 0.3 wt % or more. Specifically, a plurality of polarizing films having various polarization performances can be produced by subjecting the stretched laminate including a stretched intermediate product comprising a PVA type resin layer to dyeing process using dyeing solutions different in iodine concentration, while adjusting an immersion time for the dyeing to form various dyed laminates each including a dyed intermediate product, and then subjecting the dyed laminates to the in-boric-acid-solution stretching.

Reference will now be made to FIG. 7 wherein here is shown that there is no significant difference in polarization performance between the polarizing films formed by adjusting the iodine concentration to 0.2 wt %, 0.5 wt % and 1.0 wt %, respectively. Meanwhile, in order to realize dyeing excellent in uniformity during formation of a dyed laminate including a dyed intermediate product, it is preferable to reduce the iodine concentration so as to ensure a stable immersion time, rather than increasing the iodine concentration so as to perform the dyeing within a shorter immersion time.

Referring to FIG. 8, there is shown that two different insolubilizations during implementation of the present invention (hereinafter referred to as "first and second insolubilizations") also have influences on optical characteristics of the target polarizing film. FIG. 8 can be considered as a result of analysis on functions of the first and second insolubilizations for the thinned PVA type resin layer. FIG. 8 illustrates respective optical characteristics of polarizing films produced based on the four Examples 1 to 4, each satisfying the required performance for a display device of a liquid-crystal television using a large-sized display element.

The Example 1 indicates optical characteristics of polarizing films produced without conducting the first and the second insolubilization steps. The Example 2 indicates optical characteristics of polarizing films produced by performing only the second insolubilization step without performing the first insolubilization step, and the Example 3 indicates optical characteristics of polarizing films produced by performed only the first insolubilization step without performing the second insolubilization step. The Example 4 indicates optical characteristics of polarizing films produced by performing both the first and second insolubilization steps.

In the present invention, a polarizing film satisfying the required performance can be produced without conducting the first and the second insolubilization steps which will be described later. However, as is clear from FIG. 8, the optical characteristics of the non-insolubilized polarizing films in the Example 1 are inferior to those of the polarizing films in the Examples 2 to 4. Comparing respective optical characteristics of the Examples 1 to 4, the level of the optical characteristics becomes higher in the following order: Example 1<Example 3<Example 2<Example 4. In each of the Examples 1 and 2, a dyeing solution having an iodine concentration of 0.3 wt % and a potassium iodide concentration of 2.1 wt % was used. Differently, in the Examples 3 and 4, a plurality of types of dyeing solutions set to have a iodine concentration ranging from 0.12 to 0.25 wt % and a potassium iodide concentration ranging from 0.84 to 1.75 wt % were used. A significant difference between the group of the Examples 1 and 3 and the group of the Examples 2 and 4 is that the dyed intermediate product in the former group is not subjected to the insolubilization, whereas the dyed intermediate product in the latter group is subjected to the insolubilization. In the Example 4, not only the dyed intermediate product but also the stretched intermediate product before the dyeing are subjected to the insolubilization. Through the first and second insolubilizations, optical characteristics of the polarizing film could be significantly improved.

As is clear from FIG. 7, the mechanism for improving optical characteristics of a polarizing film is not based on the iodine concentration of the dyeing solution, but based on functions of the first and second insolubilizations. This finding can be regarded as means for solving a third technical problem in the production method of the present invention.

In one embodiment of the present invention, the first insolubilization is designed to prevent dissolution of the thinned PVA type resin layer included in the stretched intermediate product (or stretched laminate). On the other hand, the second insolubilization included in the cross-linking step is designed to stabilize dyeing so as to prevent iodine absorbed in the PVA type resin layer included in the dyed intermediate product (or a dyed laminate) from being eluted during the in-boric-acid-solution stretching at a solution temperature of 75° C. in a subsequent step, and prevent dissolution of the thinned PVA type resin layer.

If the second insolubilization is omitted, elution of iodine impregnated in the PVA type resin layer will be progressed during the in-boric-acid-solution stretching at a solution temperature of 75° C., so that the PVA resin layer will be acceleratedly dissolved. The elution of iodine and dissolution of the PVA type resin layer can be avoided by lowering a temperature of the boric acid aqueous solution. For example, it is necessary to stretch a dyed intermediate product (or dyed laminate) while immersing it in the boric acid aqueous solution at a solution temperature of less than 65° C. However, this reduces the effect of the plasticizing function of water, so that softening of the PVA type resin layer included in the dyed intermediate product (or dyed laminate) is not sufficiently obtained. This results in deterioration in stretching performance, so that the dyed intermediate product (or dyed laminate) is likely to break during the course of the in-boric-acid-solution stretching. It should be understood that an intended total stretching ratio of the PVA type resin layer cannot be attained.

[Outline of Production Process]

With reference to the drawings, one example of a process of producing a polarizing film for use in the present invention will be described below.

Referring to FIG. 9, there is shown a schematic diagram illustrating a production process for an optical film laminate 10 comprising a polarizing film 3, without an insolubilization step. In the following, descriptions will be made on a process of producing an optical film laminate 10 comprising a polarizing film 3 in accordance with the Example 1.

As a thermoplastic resin substrate, there has been prepared a continuous web of substrate made of isophthalic acid-co-polymerized polyethylene terephthalate copolymerized with isophthalic acid in an amount of 6 mol % (hereinafter referred to as "non-crystallizable PET"). A laminate 7 comprising a continuous web of non-crystallizable PET substrate 1 having a glass transition temperature Tg of 75° C., and a PVA layer 2 having a glass transition temperature Tg of 80° C. was prepared in the following manner.

(Laminate Preparation Step (A))

Firstly, a non-crystallizable PET substrate 1 having a thickness of 200 μm, and a PVA solution prepared by dissolving a PVA powder having a polymerization degree of 1000 or more and a saponification degree of 99% or more, in water to have a concentration of 4 to 5 wt % were prepared. Then, in a laminate forming apparatus 20 equipped with a coating unit 21, a drying unit 22 and a surface modifying unit 23, the PVA solution was applied to the non-crystallizable PET substrate 1 having a thickness of 200 μm, and dried at a temperature of 50 to 60° C., to form a 7 μm-thick PVA layer 2 on the non-crystallizable PET substrate 1. The thickness of the PVA layer can be appropriately changed, as described later. The laminate obtained in the above manner will hereinafter be referred to as a "laminate 7 comprising a non-crystallizable PET substrate and a PVA layer formed on the substrate", or as a "PVA layer-including laminate 7", or simply as a "laminate 7".

A laminate 7 including a PVA layer will be produced in the form of a 3 μm-thick polarizing film 3 having a final thickness of 3 μm through the following processes including a 2-stage stretching step consisting of preliminary in-air stretching and in-boric-acid-solution stretching. While the present invention is intended to use a polarizing film having a thickness of 10 μm or less, any polarizing film having an arbitrary thickness of 10 μm or less can be formed by appropriately changing the thickness of a PVA type resin layer to be formed on the PET substrate 1.

(Preliminary In-Air Stretching Step (B))

In a first-stage preliminary in-air stretching step (B), the laminate 7 including the 7 μm-thick PVA layer 2 was stretched together with the non-crystallizable PET substrate 1 to form a "stretched laminate 8" including a 5 μm-thick PVA layer 2. Specifically, in a preliminary in-air stretching apparatus 30 having stretching means 31 provided within an oven 33, the laminate 7 including the 7 μm-thick PVA layer 2 was fed to pass through the stretching means 31 within the oven 33 set to a temperature environment of 130° C., so that it was subjected to an end-free uniaxial stretching to attain a stretching ratio of 1.8 to thereby form a stretched laminate 8. At this stage, the stretched laminate 8 may be wound on a take-up unit 32 provided in side-by-side relation to the oven 33, to produce a roll 8' of the stretched laminate 8.

Now, "end-free stretching" and "end-fixed stretching" will be generally described. When a film of substantial length is stretched in a transportation or feeding direction, the film is reduced in size in a direction perpendicular to the direction of the stretching, i.e. in a widthwise direction of the film. The end-free stretching means a technique of performing stretching without suppressing such reduction in width. "Longitudinal uniaxial stretching" is a technique of performing stretching only in a longitudinal direction of the film. The end-free uniaxial stretching is generally used in contrast with the end-fixed uniaxial stretching which is a technique of performing stretching while suppressing the shrinkage which would otherwise occur in a direction perpendicular to the stretching direction. Through the end-free uniaxial stretching, the 7 μm-thick PVA layer 2 included in the laminate 7 is converted into a 5 μm-thick PVA layer 2 in which PVA molecules are oriented in the stretching direction.

(Dyeing Step (C))

Then, in a dyeing step (C), a dyed laminate 9 was formed in which iodine as a dichroic material is absorbed in the 5 μm-thick PVA layer 2 having the oriented PVA molecules. Specifically, in a dyeing apparatus 40 equipped with a dyeing bath 42 of a dyeing solution 41 containing iodine and potassium iodide, the stretched laminate 8 unrolled from a feeding unit 43 provided in side-by-side relation to the dyeing apparatus 40 and loaded with the roll 8' was immersed in the dyeing solution 41 at a solution temperature of 30° C., for an appropriate time, to allow a PVA layer making up a target polarizing film 3 (to be finally formed) to have a single layer transmittance of 40 to 44%. In this manner, a dyed laminate 9 was formed in which iodine is absorbed in the molecularly oriented PVA layer 2 of the stretched laminate 8.

In the above step, in order to prevent dissolution of the PVA layer 2 included in the stretched laminate 8, the dyeing solution 41 was formed as an aqueous solvent having an iodine concentration of 0.30 wt %. Further, the dyeing solution 41 was adjusted to allow a concentration of potassium iodide for allowing iodine to be dissolved in water to become 2.1 wt %. A ratio of the iodine concentration to the potassium iodide concentration was 1:7. More specifically, the laminate 8 was immersed in the dyeing solution 41 having an iodine concentration of 0.30 wt % and a potassium iodide concentration of 2.1 wt %, for 60 seconds, to form a dyed laminate 9 having iodine absorbed in the 5 μm-thick PVA layer 2 having the oriented PVA molecules. In the Example 1, the immersion time of the stretched laminate 8 in the dyeing solution 41 having an iodine concentration of 0.30 wt % and a potassium iodide concentration of 2.1 wt % was changed to adjust an amount of iodine to be absorbed, so as to allow a target polarizing film 3 to have a single layer transmittance of 40 to 44%, to form various dyed laminates 9 different in single layer transmittance and polarization rate.

(In-Boric-Acid-Solution Stretching Step (D))

In a second-stage in-boric-acid-solution stretching step (D), the dyed laminate 9 including the PVA layer 2 which was already dyed with molecularly oriented iodine was further stretched to form an optical film laminate 10 which includes the PVA layer having molecularly oriented iodine and making up a 3 μm-thick polarizing film 3. Specifically, in an in-boric-acid-solution stretching apparatus 50 equipped with stretching means 53 and a bath 52 of a boric acid aqueous solution 51 containing boric acid and potassium iodide, the dyed laminate 9 continuously fed from the dyeing apparatus 40 was immersed in the boric acid aqueous solution 51 set to a solution temperature environment of 65° C., and then fed to pass through the stretching means 53 provided in the in-boric-acid-solution stretching apparatus 50, so that it was subjected to an end-free uniaxial stretching to attain a stretching ratio of 3.3 to thereby form the optical film laminate 10.

More specifically, the boric acid aqueous solution 51 was adjusted to contain 4 weight parts of boric acid with respect to 100 weight parts of water, and 5 weight parts of potassium iodide with respect to 100 weight parts of water. In this step, the dyed laminate 9 having the absorbed iodine in an adjusted amount was first immersed in the boric acid aqueous solution 51 for 5 to 10 seconds. Then, the dyed laminate 9 was fed to directly pass through between a plurality of sets of rolls different in circumferential speed, as the stretching means 53 of the in-boric-acid-solution stretching apparatus 50, so that it was subjected to an end-free uniaxial stretching to attain a stretching ratio of 3.3 while taking a time of 30 to 90 seconds. Through this stretching, the PVA layer included in the dyed laminate 9 was changed into a 3 μm-thick PVA layer in which the absorbed iodine is highly oriented in one direction in the form of a polyiodide ion complex. This PVA layer makes up a polarizing film 3 of the optical film laminate 10.

As described above, in the Example 1, the laminate 7 comprising a non-crystallizable PET substrate 1 and a 7 μm-thick PVA layer 2 formed on the substrate 1 is subjected to preliminarily in-air stretching at a stretching temperature of 130° C. to form a stretched laminate 8, and then the stretched laminate 8 is subjected to dyeing to form a dyed laminate 9. Further, the dyed laminate 9 is subjected to in-boric-acid-solution stretching at a stretching temperature of 65° C. to form an optical film laminate 10 including a 3 μm-thick PVA layer stretched integrally with the non-crystallizable PET substrate to attain a total stretching ratio of 5.94. Through the above 2-stage stretching, it becomes possible to form an optical film laminate 10 including a 3 μm-thick PVA layer making up a polarizing film 3 in which iodine absorbed therein through dyeing is highly oriented in the form of a polyiodide ion complex. Preferably, the optical film laminate 10 will be completed through subsequent cleaning, drying and transfer steps. Details of the cleaning step (G), the drying step (H) and the transfer step (I) will be described in connection with a production process based on the Example 4 incorporating an insolubilization step.

[Outline of Other Production Process]

Figure 10:
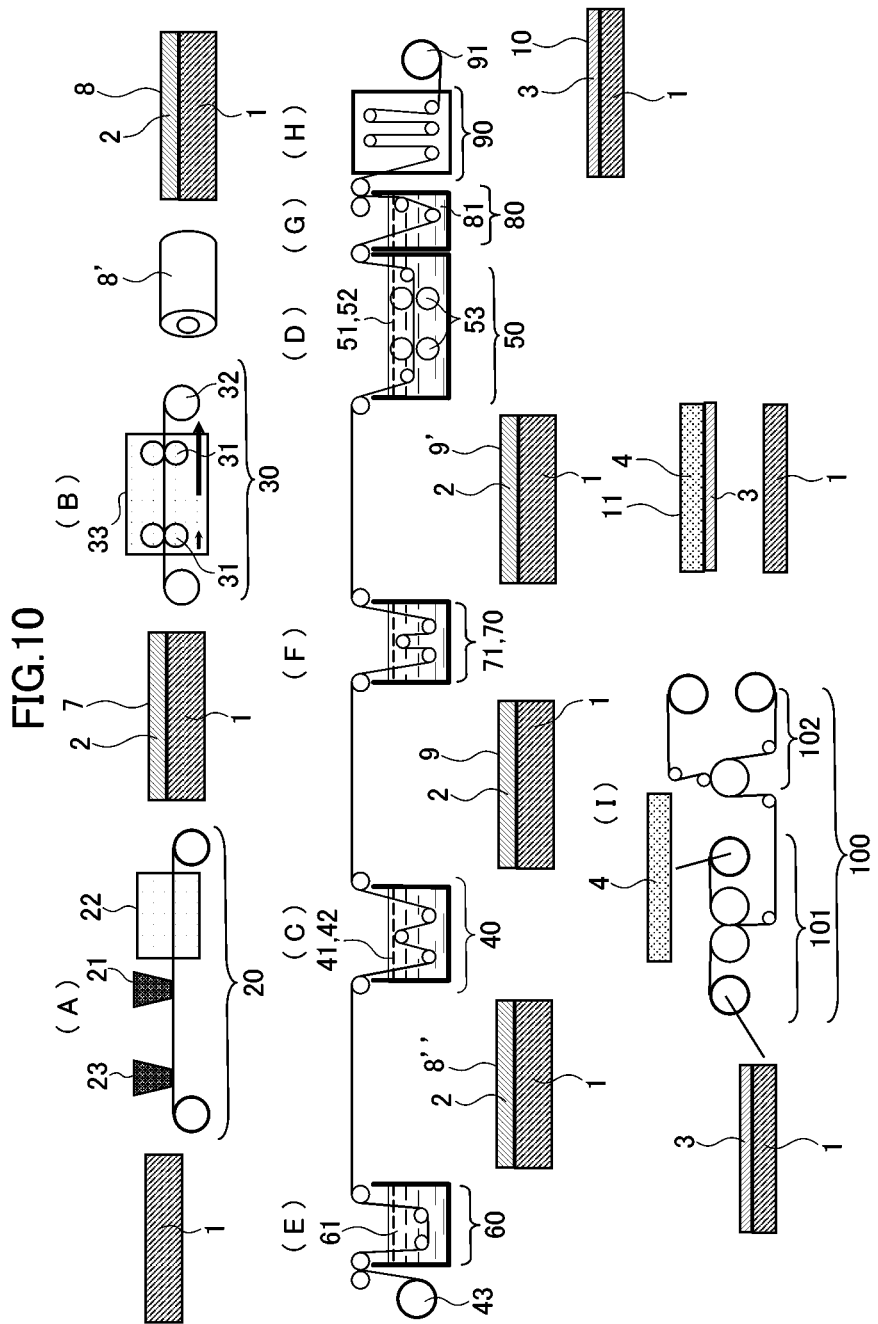
FIG. 10 is a schematic diagram illustrating a production process for producing an optical film laminate, wherein the process includes an insolubilization treatment.

Referring to FIG. 10, there is shown a schematic diagram illustrating a production process of an optical film laminate 10 including a polarizing film 3, which has an insolubilization step. The following description will be made about a production process of an optical film laminate 10 including a polarizing film 3 based on the Example 4. As is clear from FIG. 10, the production process based on the Example 4 may be assumed as a production process in which the first insolubilization step before the dyeing step and the cross-linking step including the second insolubilization before the in-boric-acid-solution stretching are incorporated into the production process based on the Example 1. A laminate preparation step (A), a preliminary in-air stretching step (B), a dyeing step (C) and an in-boric-acid-solution stretching step (D) incorporated in this process are the same as those in the production process based on the Example 1, except a difference in temperature of the boric acid aqueous solution for the in-boric-acid-solution stretching step. Thus, descriptions of this process will be simplified, and the first insolubilization step before the dyeing step and the cross-linking step including the second insolubilization before the in-boric-acid-solution stretching step will be primarily described.

(First Insolubilization Step (E))

The first insolubilization step is an insolubilization step (E) prior to the dyeing step (C). As with the production process based on the Example 1, in the laminate preparation step (A), a laminate 7 comprising a non-crystallizable PET substrate and a 7 μm-thick PVA layer 2 formed on the substrate is produced. Then, in the preliminary in-air stretching step (B), the laminate 7 including the 7 μm-thick PVA layer 2 is subjected to preliminary in-air stretching to form a stretched laminate 8 including a 5 μm-thick PVA layer 2. Subsequently, in the first insolubilization step (E), the stretched laminate 8 unrolled from the feeding unit 43 loaded with the roll 8' is subjected to insolubilization to form the insolubilized stretched laminate 8". It should be understood that the stretched laminate 8" insolubilized in this step includes an insolubilized PVA layer 2. This laminate 8" will hereinafter be referred to as an "insolubilized stretched laminate 8'".

Specifically, in an insolubilization apparatus 60 containing an insolubilizing boric acid aqueous solution 61, the stretched laminate 8 is immersed in the insolubilizing boric acid aqueous solution 61 at a solution temperature of 30° C., for 30 seconds. The insolubilizing boric acid solution 61 used in this step contains 3 weight parts of boric acid with respect to 100 weight parts of water (hereinafter referred to as "insolubilizing boric acid aqueous solution"). This step is intended to subject the stretched laminate 8 to insolubilization so as to prevent the 5 μm-thick PVA layer included in the stretched laminate 8 from being dissolved at least during the subsequent dyeing step (C).

After the insolubilization, the insolubilized stretched laminate 8 is transported to the dyeing step (C). Differently from the Example 1, in this dyeing step (C), a plurality of dyeing solutions are prepared by changing the iodine concentration in the range of 0.12 to 0.25 wt %. Then, various dyed laminates 9 different in single layer transmittance and polarization rate are formed by using the dyeing solutions while keeping the immersion time of the insolubilized stretched laminate 8" in each of the dyeing solutions constant, to adjust an amount of iodine to be absorbed, so as to allow a target polarizing film to have a single layer transmittance of 40 to 44%. Even after the immersion in the dyeing solutions having an iodine concentration of 0.12 to 0.25 wt %, the PVA layer in the insolubilized stretched laminate 8" is never dissolved.

(Cross-Linking Step including Second Insolubilization (F))

The following cross-linking step may be considered as including the second insolubilization step, in view of the following purpose. The cross-linking step is intended to achieve firstly insolubilization for preventing dissolution of the PVA layer included in the dyed laminate 9 during the subsequent in-boric-acid-solution stretching step (D), secondly stabilization in dyeing for preventing elution of iodine absorbed in the PVA layer; and thirdly formation of nodes by cross-linking of molecules in the PVA layer. The second insolubilization is intended to accomplish the results of the aforementioned first and second aims.

The cross-linking step (F) is performed as a pretreatment for the in-boric-acid-solution stretching step (D). The dyed laminate 9 formed in the dyeing step (C) is subjected to cross-linking to form a cross-linked dyed laminate 9'. The cross-linked dyed laminate 9' includes a cross-linked PVA layer 2. Specifically, in a cross-linking apparatus 70 containing an aqueous solution 71 comprising iodine and potassium iodide (hereinafter referred to as "cross-linking boric acid aqueous solution"), the dyed laminate 9 is immersed in the cross-linking boric acid solution 71 at 40° C., for 60 seconds, so as to cross-link the PVA molecules of the PVA layer having the absorbed iodine, to form a cross-linked dyed laminate 9'. The cross-linking boric acid aqueous solution 71 used in this step contains 3 weight parts of boric acid with respect to 100 weight parts of water, and 3 weight parts of potassium iodide with respect to 100 weight parts of water.

In the in-boric-acid-solution stretching step (D), the cross-linked dyed laminate 9' is immersed in the boric acid aqueous solution at 75° C., and subjected to an end-free uniaxial stretching to attain a stretching ratio of 3.3 to thereby form an optical film laminate 10. Through this stretching, the PVA layer 2 included in the dyed laminate 9' and having absorbed iodine is changed into a 3 μm-thick PVA layer 2 in which the absorbed iodine is highly oriented in one direction in the form of a polyiodide ion complex. This PVA layer makes up a polarizing film 3 of the optical film laminate 10.

In the Example 4, a 7 μm-thick PVA layer 2 is first formed on a non-crystallizable PET substrate 1 to form a laminate 7, and then the laminate 7 is subjected to preliminary in-air stretching at a stretching temperature of 130° C. based on an end-free uniaxial stretching process to attain a stretching ratio of 1.8 to thereby form a stretched laminate 8. Then, the formed stretched laminate 8 is immersed in the insolubilizing boric acid aqueous solution 61 at a solution temperature of 30° C. to insolubilize the PVA layer included in the stretched laminate. The resulting product is an insolubilized stretched laminate 8". The insolubilized stretched laminate 8" is immersed in a dyeing solution containing iodine and potassium iodide and having a temperature of 30° C. to form a dyed laminate 9 in which iodine is absorbed in the insolubilized PVA layer. Then, the dyed laminate 9 including the PVA layer with the absorbed iodine is immersed in the cross-linking boric acid aqueous solution 71 under a solution temperature of 40° C., for 60 seconds, to cross-link PVA molecules of the PVA layer with the absorbed iodine. The resulting product is a cross-linked dyed laminate 9'. The cross-linked laminate 9' is immersed in an in-boric-acid-solution stretching bath 51 containing boric acid and potassium iodide and having a temperature of 75° C., for 5 to 10 seconds, and then subjected to in-boric-acid-solution stretching based on an end-free uniaxial stretching process to attain a stretching ratio of 3.3 to thereby form an optical film laminate 10.

As described above, based on the 2-stage stretching consisting of the elevated temperature in-air stretching and the in-boric-acid-solution stretching, and the pre-treatments consisting of the insolubilization before immersion in the dyeing bath and the cross-linking before the in-boric-acid-solution stretching, the process in the Example 4 makes it possible to stably form an optical film laminate 10 including a 3 μm-thick PVA layer making up a polarizing film in which PVA molecules in a PVA layer 2 formed on a non-crystallizable PET substrate 1 are highly oriented, and iodine reliably absorbed in the PVA molecules through dyeing is highly oriented in one direction in the form of an polyiodide ion complex.

(Cleaning Step (G))

The dyed laminate 9 or the cross-linked dyed laminate 9' in the Example 1 or 4 is subjected to stretching in the in-boric-acid-solution stretching step (D), and then taken out of the boric acid aqueous solution 51. Preferably, the taken-out optical film 10 including the polarizing film 3 is directly fed to a cleaning step (G). The cleaning step (G) is intended to wash out unnecessary residuals adhered on a surface of the polarizing film 3. Alternatively, the cleaning step (G) may be omitted, and the optical film 10 including the polarizing film 3 may be directly fed to a drying step (H). However, if the cleaning is insufficient, boric acid is likely to precipitate from the polarizing film 3 after drying of the optical film laminate 10. Specifically, the optical film laminate 10 is fed to a cleaning apparatus 80 and immersed in a cleaning solution 81 containing potassium iodide having a temperature of 30° C., for 1 to 10 seconds, so as to prevent dissolution of PVA of the polarizing film 3. A potassium iodide concentration of the cleaning solution 81 may be in the range of about 0.5 to 10 weight %.

(Drying Step (H))

The cleaned optical film laminate 10 is fed to a drying step (H) and dried therein. Then, the dried optical film laminate 10 is wound on a take-up unit 91 provided in side-by-side relation to the drying apparatus 90, as a continuous web of optical film laminate 10, to form a roll of the optical film laminate 10 including the polarizing film 3. Any appropriate process, such as natural drying, blow drying and thermal drying, may be employed as the drying step (H). In each of the Examples 1 and 4, the drying was performed by warm air at 60° C., for 240 seconds in an oven type drying apparatus 90.

[Lamination and Transfer Step (I)]

As mentioned above, the present invention is directed to providing an optical display device using a polarizing film which consists of a polyvinyl alcohol type resin having a molecularly oriented dichroic material, wherein the polarizing film is formed to have optical characteristics satisfying the aforementioned required conditions, by being stretched through a 2-stage stretching consisting of a preliminary in-air stretching and an in-boric-acid-solution stretching.

In order to form such an optical display device, there is prepared an optical film laminate 10 including a polarizing film having a thickness of 10 μm or less, for example, the 3 μm-thick polarizing film 3 produced in the aforementioned Example, and formed on a thermoplastic resin substrate such as a non-crystallizable PET substrate, as a roll of the optical film laminate 10. Then, in a lamination/transfer step (I), the optical film laminate 10 unrolled from the roll may be simultaneously subjected to a lamination operation and a transfer operation as described in the followings.

The polarizing film 3 to be produced is reduced in thickness through the stretching to 10 μm, typically to only about 2 to 5 μm. Thus, it is difficult to handle such a thin polarizing film 3 in the form of a single layer. For this reason, the polarizing film 3 is handled, for example, in the form of an optical film laminate 10, i.e., under a condition that it is left on the non-crystallizable PET substrate, or, in the form of an optically functional film laminate 11 obtained by laminating or transferring the polarizing film to another optically functional film 4.

In the lamination/transfer step (I) illustrated in FIGS. 9 and 10, the polarizing film 3 included in the continuous web of an optical film laminate 10, and a separately prepared optically functional film 4 are laminated together and taken up. In this take-up step, the optically functional film laminate 11 is formed by transferring the polarizing film 3 to the optically functional film 4 while peeling the non-crystallizable PET substrate from the polarizing film 3. Specifically, the optical film laminate 10 is unrolled from the roll by an unrolling/laminating unit 101 included in a laminating/transferring apparatus 100, and the polarizing film 3 of the unrolled optical film laminate 10 is transferred to the optically functional film 4 by a taking-up/transferring unit 102. In the course of this operation, the polarizing film 3 is peeled from the substrate 1, and formed as the optically functional film laminate 11.

The optical film laminate 10 taken up into a roll by the take-up unit 91 in the drying step (H) or the optically functional film laminate 11 formed in the lamination/transfer step (I) may be achieved by various other structures or mechanisms.

[Optical Characteristics of Polarizing Films Produced Under Various Conditions]

(1) Improvement in Optical Characteristics of Polarizing Film by Insolubilization (Examples 1 to 4)

As already described based on FIG. 8, each of the polarizing films produced in accordance with the Examples 1 to 4 can overcome the aforementioned technical problems. The optical characteristics thereof can satisfy the required performance for an optical display device of a liquid-crystal television using a large-sized display element. Further, as is clear from FIG. 8, it is noted that the optical characteristics of the non-insolubilized polarizing films in the Example 1 are inferior to the optical characteristics of any polarizing film in the Examples 2 to 4 subjected to the first and/or second insolubilizations. Comparing respective optical characteristics of the Examples, the level of the optical characteristics becomes higher in the following order: (Example 1)<(Example 3 including only the first insolubilization)<(Example 2 including only the second insolubilization)<(Example 4 including the first and second insolubilizations). A polarizing film produced by a production process comprising the first and/or second insolubilization steps, in addition to the production process for the optical film laminate 10 including the polarizing film 3, can be significantly improved in optical characteristic.

(2) Impact of Thickness of PVA Type Resin Layer on Optical Characteristics of Polarizing Film (Example 5)

In the Example 4, the 3 μm-thick polarizing film was formed by stretching the 7 μm-thick PVA layer. On the other hand, in the Example 5, the 12 μm-thick PVA layer was first formed, and the 5 μm-thick polarizing film was formed by stretching this PVA layer. The remaining conditions for producing these polarizing films was the same.

(3) Influences of Difference in Material of Non-Crystallizable PET Substrate on Optical Characteristics of Polarizing Film (Example 6)

In the Example 4, a non-crystallizable PET substrate copolymerized with isophthalic acid was used, whereas, in the Example 6, a non-crystallizable PET substrate copolymerized with 1,4-cyclohexanedimethanol as a modifier group was used. In the Example 6, a polarizing film was produced under the same conditions as those in the Example 4, except the above difference.

Figure 13:
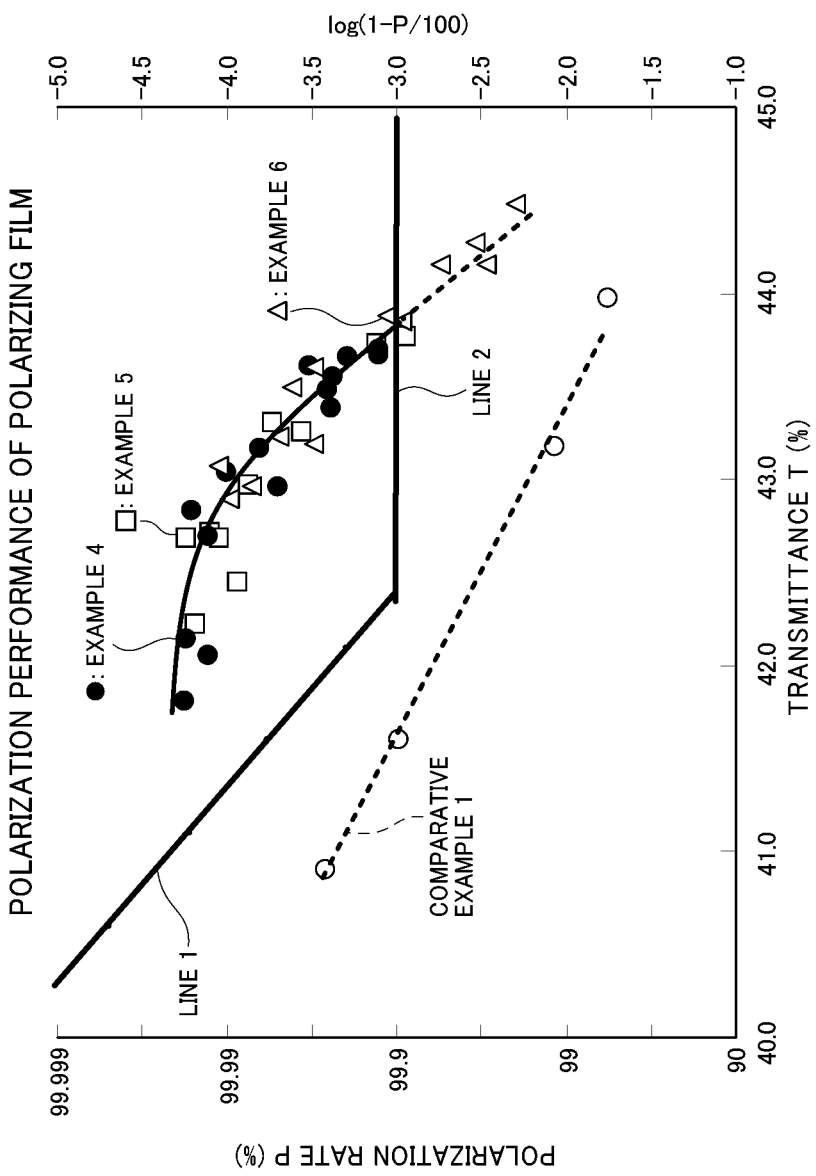
FIG. 13 is a graph comparatively illustrating polarization performances of polarizing films in a group of inventive examples.

Referring to FIG. 13, there is shown that there is no significant difference in optical characteristics between respective ones of the polarizing films produced based on the Examples 4 to 6. This would be considered that the thickness of the PVA type resin layer and the type of the non-crystallizable ester type thermoplastic resin do not have any recognizable impact on the optical characteristics.

(4) Improvement in Optical Characteristics of Polarizing Film by Stretching Ratio during Preliminary In-Air (Examples 7 to 9)

In the Example 4, the stretching ratio attained through the first-stage preliminary in-air stretching and that through the second-stage in-boric-acid-solution stretching were set to 1.8 and 3.3, respectively, whereas, in the Examples 7 to 9, the two stretching ratios were set to 1.2 and 4.9 for the Example 7, 1.5 and 4.0 for the Example 8, and 2.5 and 2.4 for the Example 9. In the Example 7 to 9, the polarizing film was produced under the same conditions as those in the Example 4, except the above difference. For example, the stretching temperature during the preliminary in-air stretching was 130° C., and the in-boric-acid-solution stretching was performed using a boric acid aqueous solution at a solution temperature of 75° C. The total stretching ratio in each of the Examples 8 and 9 was 6.0 which is similar to 5.94 which was obtained as a total stretching ratio when the stretching ratio in the preliminary in-air stretching in the Example 4 is set to 1.8. Differently, the total stretching ratio of the Example 7 was limited to up to 5.88. This is because the stretching ratio attained through the in-boric-acid-solution stretching could be set to 4.9 or more, which would be caused by the attainable stretching ratio of non-crystallizable PET having an impact on the relationship between the stretching ratio during the first-stage preliminary in-air stretching and the total stretching ratio, as described based on FIG. 20.

Figure 14:
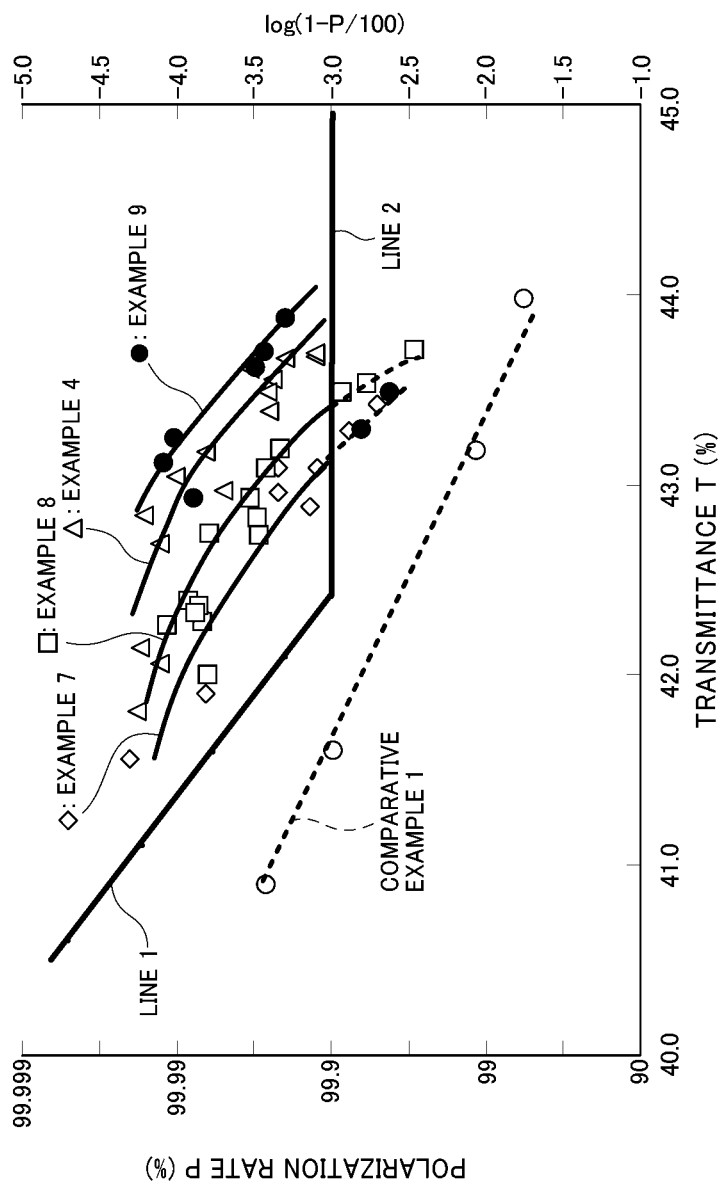
FIG. 14 is a graph comparatively illustrating polarization performances of polarizing films in another group of inventive examples.

Referring to FIG. 14, each of the polarizing films in accordance with the Examples 7 to 9 can overcome the technical problems concerning production of a polarizing film having a thickness of 10 μm or less and has optical characteristics satisfying the required performance for optical display devices, as with the Example 4. Comparing respective optical properties of these Examples, a level of the optical properties becomes higher in the following order: Example 7<Example 8<Example 4<Example 9. This shows that, in cases where the stretching ratio during the first-stage preliminary in-air stretching is set in the range of 1.2 to 2.5, even if a final total stretching ratio after the second-stage in-boric-acid-solution stretching is set to a similar value, the optical characteristics of the polarizing film become better as the stretching ratio during the first-stage preliminary in-air stretching is set to a higher value. Thus, in a production process of an optical film laminate 10 including a polarizing film 3, optical characteristics of the optical film or the optical film laminate 10 including the polarizing film can be further improved by setting the stretching ratio during the first-stage preliminary in-air stretching to a higher value.

(5) Improvement in Optical Characteristics of Polarizing Film by Stretching Temperature During Preliminary in-Air Stretching (Examples 10 to 12)

In the Example 4, the stretching temperature during the preliminary in-air stretching was 130° C., whereas in the Examples 10 to 12, the stretching temperatures during the preliminary in-air stretching were 95° C., 110° C., and 150° C., respectively, which are higher than the glass transition temperature Tg of PVA. In these Examples, the polarizing film was produced under the same conditions as those in the Example 4, except the above difference. For example, the stretching ratio during the preliminary in-air stretching was set to 1.8, and the stretching ratio during the in-boric-acid-solution stretching was set to 3.3. The stretching temperature during the preliminary in-air stretching in the Example 4 is 130° C. In these Examples including the Example 4, the production conditions are the same except that the stretching temperature is set to 95° C. for the Example 10, 110° C. for the Example 11, 130° C. for the Example 4 and 150° C. for the Example 12.

Figure 15:
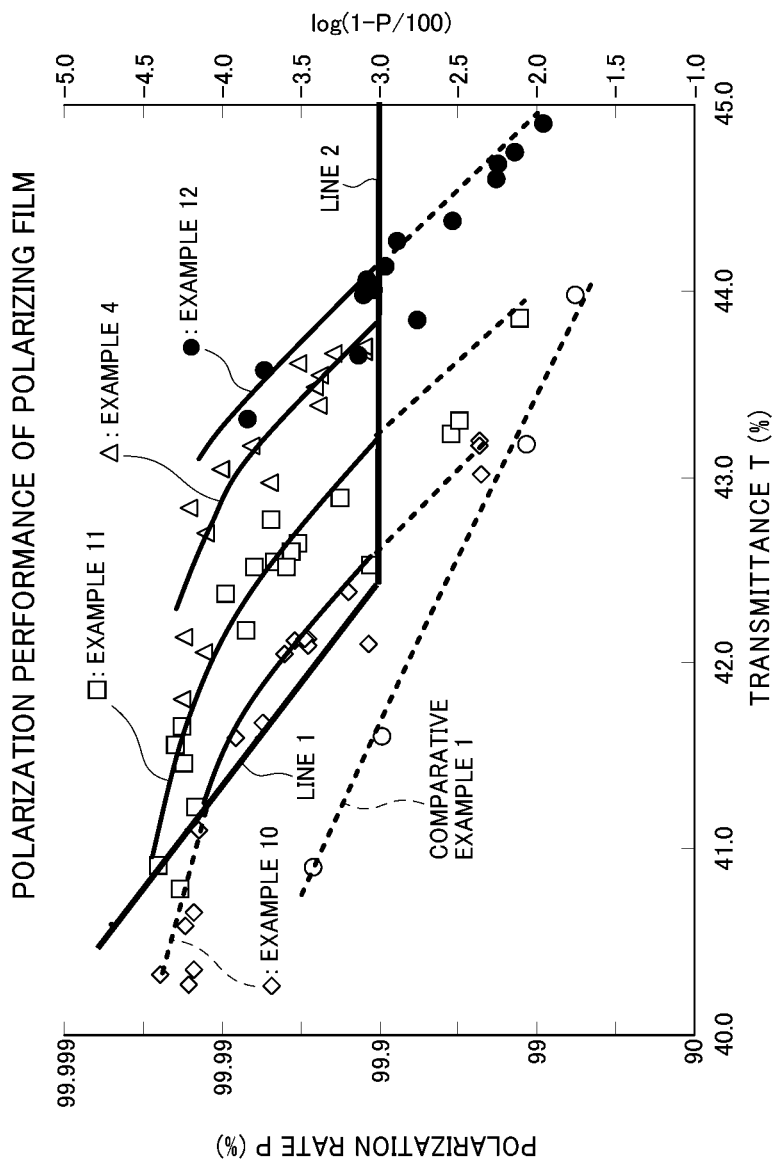
FIG. 15 is a graph illustrating polarization performances of polarizing films in yet another group of inventive examples.

Referring to FIG. 15, each of the polarizing films based on the Examples 4 and 10 to 12 can overcome the technical problems concerning production of a polarizing film having a thickness of 10 μm or less, and has optical characteristics satisfying the required performance for optical display devices. Comparing respective optical properties of these Examples, a level of the optical properties becomes higher in the following order: Example 10<Example 11<Example 4<Example 12. This shows that, in cases where the stretching temperature during the first-stage preliminary in-air stretching is set to a higher value than the glass transition temperature, and gradually increased from 95° C. to 150° C., even if a final total stretching ratio after the second-stage in-boric-acid-solution stretching is set to a similar value, the optical characteristics of the polarizing film become better as the stretching temperature during the first-stage preliminary in-air stretching is set to a higher value. Thus, in a production process of an optical film laminate 10 including a polarizing film 3, optical characteristics of the optical film or the optical film laminate 10 including the polarizing film can be further improved by setting the stretching temperature during the first-stage preliminary in-air stretching to a higher value.

(6) Improvement of Optical Characteristics of Polarizing Film by Total Stretching Ratio (Examples 13 to 15)

In the Example 4, the stretching ratio during the first-stage preliminary in-air stretching was 1.8, and the stretching ratio during the second-stage in-boric acid solution stretching was 3.3. On the other hand, in the Examples 13 to 15, only the stretching ratios during the second-stage in-boric acid solution stretching were changed to 2.1, 3.1 and 3.6, respectively. This means that the total stretching ratios in the Examples 13 to 15 are set to 5.04 (about 5.0), 5.58 (about 5.5) and 6.48 (about 6.5), respectively. The total stretching ratio in the Example 4 is 5.94 (about 6.0). In these Examples including the Example 4, the production conditions are the same except that the total stretching ratio is set to 5.0 for the Example 13, 5.5 for the Example 14, 6.0 for the Example 4 and 6.5 for the Example 15.

Figure 16:
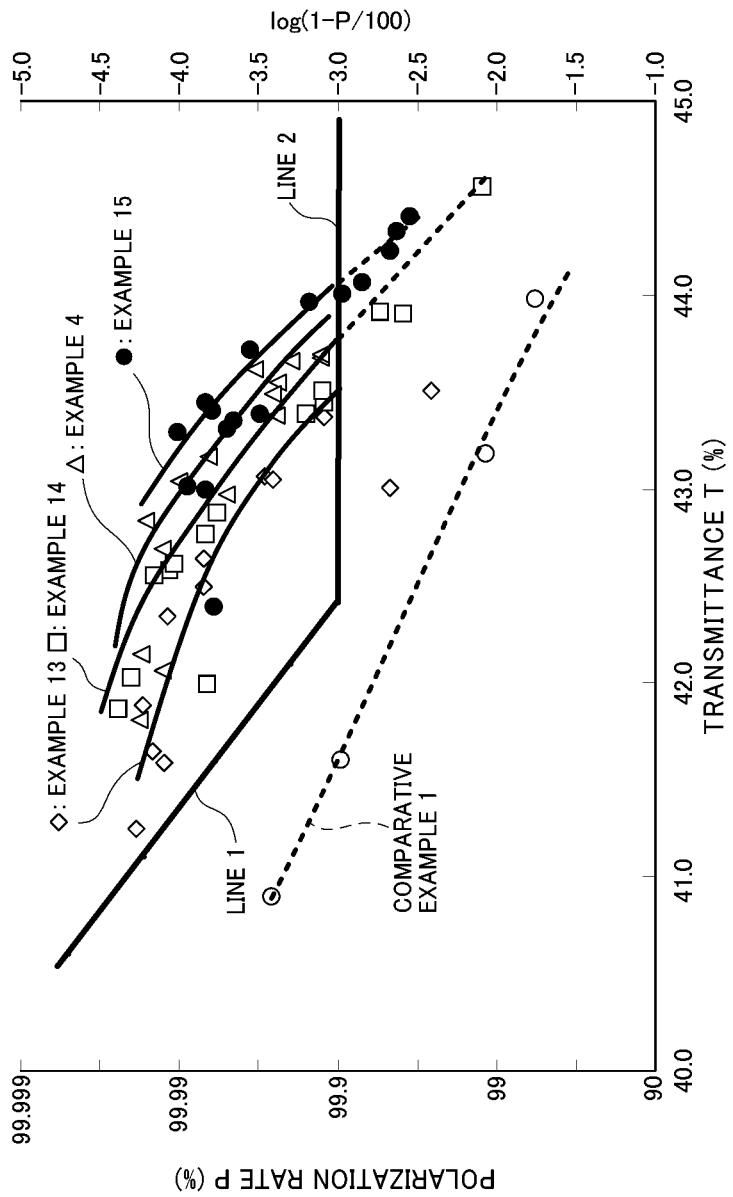
FIG. 16 is a graph illustrating polarization performances of polarizing films in still another group of inventive examples.

Referring to FIG. 16, each of the polarizing films in accordance with the Examples 4 and 13 to 15 can overcome the technical problems concerning production of a polarizing film having a thickness of 10 μm or less and has optical characteristics satisfying the required performance for optical display devices. Comparing respective optical properties of these Examples, a level of the optical properties becomes higher in the following order: Example 13<Example 14<Example 4<Example 15. This shows that, in cases where the stretching ratio during the first-stage preliminary in-air stretching is fixedly set to 1.8, and only the stretching ratio during the second-stage in-boric-acid-solution stretching is variably set to allow the total stretching ratio to be gradually increased to 5.0, 5.5, 6.0 and 6.5, the optical characteristics of the polarizing film become better as the final total stretching ratio is set to a higher value. Thus, in a production process of an optical film laminate 10 including a polarizing film 3, optical characteristics of the optical film or the optical film laminate 10 including the polarizing film can be further improved by setting the total stretching ratio during the first-stage preliminary in-air stretching and the second-stage in-boric-acid-solution stretching to a higher value.

(7) Improvement of Optical Characteristics of Polarizing Film by Total Stretching Ratio in End-Fixed Uniaxial Stretching (Examples 16 to 18)

In the Examples 16 to 18, optical film laminates were produced under the same conditions as those in the Example 4, except the following difference. The difference is a stretching scheme in the preliminary in-air stretching. In the example 4, a end-free uniaxial stretching process is employed, whereas in each of the Examples 16 to 18, a end-fixed uniaxial stretching process is employed. In each of these Examples, the stretching ratio during the first-stage preliminary in-air stretching was fixedly set to 1.8, and only the stretching ratio during the second-stage in-boric-acid-solution stretching was changed to 3.3, 3.9, 4.4, respectively. This means that the total stretching ratio was set to 5.94 (about 6.0) for the Example 16, 7.02 (about 7.0) for the Example 17 and 7.92 (about 8.0) for the Example 18, respectively. In the Examples 16 to 18, the production conditions are the same except the above difference.

Figure 17:
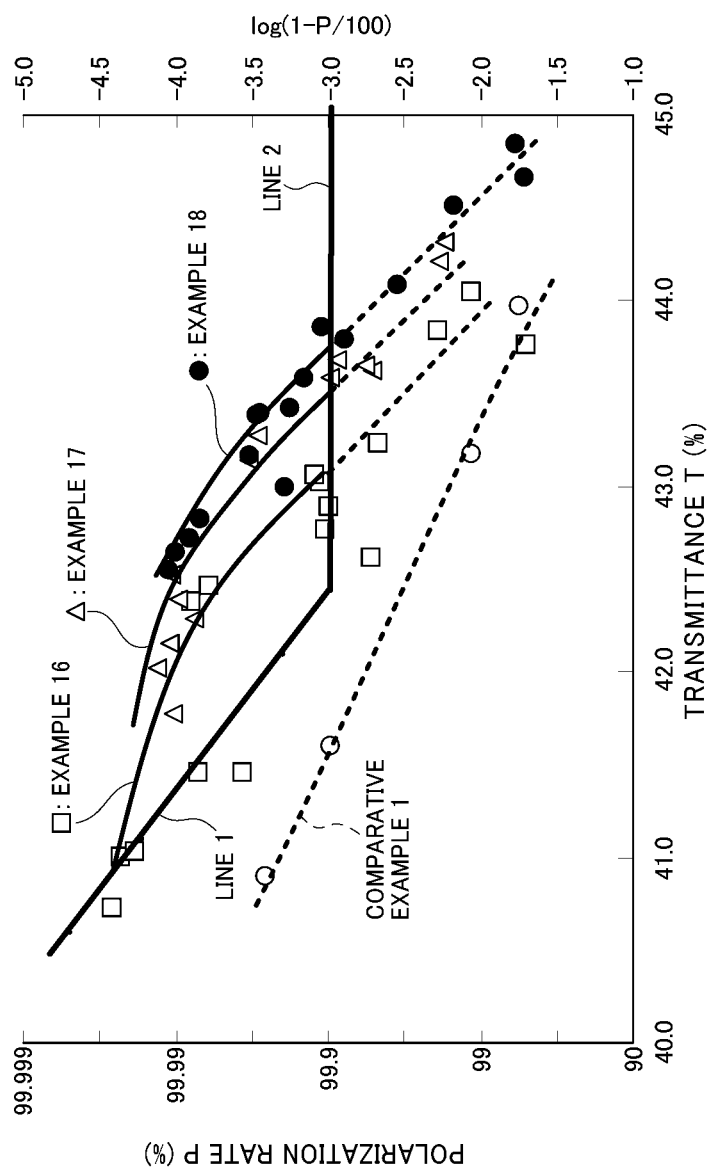
FIG. 17 is a graph illustrating polarization performances of polarizing films in yet still another group of inventive examples.

Referring to FIG. 17, each of the polarizing films in accordance with the Examples 16 to 18 can overcome the technical problems concerning production of a polarizing film having a thickness of 10 μm or less and has optical characteristics satisfying the required performance for optical display devices. Comparing respective optical properties of these Examples, a level of the optical properties becomes higher in the following order: Example 16<Example 17<Example 18. This shows that, in cases where the stretching ratio during the first-stage preliminary in-air stretching is fixedly set to 1.8, and only the stretching ratio during the second-stage in-boric-acid-solution stretching is variably set to allow the total stretching ratio to be gradually increased to 6.0, 7.0 and 8.0, the optical characteristics of the polarizing film being better with the final total stretching ratio having a higher value. Thus, in a production process of the optical film laminate 10 including the polarizing film 3, optical characteristics of the optical film or the optical film laminate 10 including the polarizing film can be further improved by setting the total stretching ratio during the first-stage preliminary in-air stretching based on a end-fixed uniaxial stretching process and the second-stage in-boric-acid-solution stretching to a higher value. It was also ascertained that, in cases where a end-fixed uniaxial stretching process is used in the first-stage preliminary in-air stretching, the final total stretching ratio can be increased as compared to cases where a end-free uniaxial stretching process is used in the first-stage preliminary in-air stretching.

Comparative Example 3

In the comparative example 3, under the same conditions as those in the comparative example 1, a PVA aqueous solution was applied on a 200 μm-thick PET substrate and dried to form a laminate including a 7 μm-thick PVA layer formed on the PET substrate. Then, the laminate was immersed in a dyeing solution containing iodine and potassium iodide and having a temperature of 30° C. to form a dyed laminate including a PVA layer having iodine absorbed therein. Specifically, the dyed laminate is formed by immersing the laminate in a dyeing solution containing 0.30 wt % of iodine and 2.1 wt % of potassium iodide at a solution temperature of 30° C., for an arbitrary time, to allow the PVA layer making up a target polarizing film (to be finally obtained) to have a single layer transmittance of 40 to 44%. Then, the dyed laminate including the PVA layer having the absorbed iodine was subjected to in-boric-acid-solution stretching at a stretching temperature of 60° C. based on a end-free uniaxial stretching process to attain a stretching ratio of 5.0. In this manner, various optical film laminates each including a 3 μm-thick PVA layer integrally stretched with the PET resin substrate were formed.

(Reference Sample 1)

In the reference sample 1, a continuous web of crystallizable polyethylene terephthalate (hereinafter referred to as "crystallizable PET") was used as a resin substrate, and a PVA aqueous solution was applied on a 200 μm-thick crystallizable PET substrate and dried to form a laminate including a 7 μm-thick PVA layer formed on the crystallizable PET substrate. A glass transition temperature of the crystallizable PET is 80° C. Then, the formed laminate was subjected to elevated temperature in-air stretching at a stretching temperature of 110° C. based on an end-free uniaxial stretching process to attain a stretching ratio of 4.0 to thereby form a stretched laminate. Through the stretching, the PVA layer included in the stretched laminate was changed into a 3.3 μm-thick PVA layer having oriented PVA molecules. In the reference sample 1, the laminate could not be stretched at a stretching ratio of 4.0 or more in the elevated temperature in-air stretching at a stretching temperature of 110° C.

In a subsequent dyeing step, the stretched laminate was formed as a dyed laminate in which iodine is absorbed in the 3.3 μm-thick PVA layer having oriented PVA molecules. Specifically, the dyed laminate was formed by immersing the stretched laminate in a dyeing solution containing iodine and potassium iodide and having a temperature of 30° C., for an arbitrary time to cause iodine to be absorbed in the PVA layer included in the stretched laminate, so as to allow the PVA layer making up a target polarizing film to have a single layer transmittance of 40 to 44%. An amount of iodine to be absorbed in the PVA layer having oriented PVA molecules was adjusted to produce various dyed laminates different in single layer transmittance and polarization rate. Then, the formed dyed laminate was subjected to cross-linking. Specifically, the dyed laminate was cross-linked by immersing it in a cross-linking boric acid aqueous solution containing 3 weight parts of boric acid with respect to 100 weight parts of water and 3 weight parts of potassium iodide with respect to 100 weight parts of water, at a solution temperature of 40° C. for 60 seconds. The cross-linked dyed laminate in the comparative example 1 corresponds to the optical film laminate in the Example 4. Thus, cleaning, drying and lamination and/or transfer steps in the comparative example 1 are the same as those in the Example 4.

(Reference Sample 2)

In the reference sample 2, a crystallizable PET was used as a resin substrate, and a laminate including a 7 μm-thick PVA layer formed on the crystallizable PET substrate was formed in the same manner as that in the reference sample 1. Then, the formed laminate was subjected to elevated temperature in-air stretching at a stretching temperature of 100° C. based on an end-free uniaxial stretching process to attain a stretching ratio of 4.5 to thereby form a stretched laminate. Through the stretching, the PVA layer included in the stretched laminate was changed into a 3.3 μm-thick PVA layer having oriented PVA molecules. In the reference sample 2, the laminate could not be stretched at a stretching ratio of 4.5 or more in the elevated temperature in-air stretching at a stretching temperature of 100° C.

Then, a dyed laminate was formed from the stretched laminate. The dyed laminate was formed by immersing the stretched laminate in a dyeing solution containing iodine and potassium iodide and having a temperature of 30° C., for an arbitrary time to cause iodine to be absorbed in the PVA layer included in the stretched laminate, so as to allow the PVA layer making up a target polarizing film to have a single layer transmittance of 40 to 44%. In the reference sample 2, an amount of iodine to be absorbed in the PVA layer having oriented PVA molecules was adjusted to produce various dyed laminates different in single layer transmittance and polarization rate, as with the reference sample 1.

(Reference Sample 3)

In the reference sample 3, a crystallizable PET was used as a resin substrate, and a laminate including a 7 μm-thick PVA layer formed on the crystallizable PET substrate was formed in the same manner as that in the reference sample 1 or 2. Then, the formed laminate was immersed in a dyeing solution containing iodine and potassium iodide and having a temperature of 30° C., for an arbitrary time to cause iodine to be absorbed in the PVA layer included in the laminate, so as to allow the PVA layer making up a target polarizing film to have a single layer transmittance of 40 to 44%, to form various dyed laminates each including the PVA layer having iodine absorbed therein. Subsequently, the formed dyed laminate was subjected to elevated temperature in-air stretching at a stretching temperature of 90° C. based on an end-free uniaxial stretching process to attain a stretching ratio of 4.5 to thereby form a stretched laminate. Through the stretching, the PVA layer included in the stretched laminate was changed into a 3.3 μm-thick PVA layer having oriented PVA molecules. In the reference sample 3, the laminate could not be stretched at a stretching ratio of 4.5 or more in the elevated temperature in-air stretching at a stretching temperature of 90° C.

Measurement Method (Thickness Measurement)

A thickness of each of the non-crystallizable PET substrate, the crystallizable PET substrate and the PVA layer was measured using a digital micrometer (KC-351C from Anritsu Electric Co., Ltd.).

(Measurement of Transmittance and Polarization Rate)

Each of the single layer transmittance T, the parallel transmittance Tp and the cross transmittance Tc of the polarizing film was measured using a UV-visible spectrophotometer (V7100 from JASCO Corporation). Each value of T, Tp and Tc is presented by a Y value measured according to JIS Z8701 (visual field of 2 degrees, C light source) and corrected for spectral luminous efficacy. The polarization rate P was calculated in accordance with the following formula using the above transmittance.

$$\text{Polarization rate } P = \{(Tp-Tc)/(Tp+Tc)\}^{1/2} \times 100$$

(Evaluation of Orientation Function of PET)

A Fourier Transform Infrared Spectrometer (FT-IR) (SPECTRUM 2000 from PerkinElmer, Inc.) was used as the measurement device. Attenuated total reflection (ATR) of polarizing light was measured to evaluate the surface of a PET resin layer. The orientation function was calculated in the following manner. Measurements were made on the polarizing light in the directions of 0° and 90° with respect to the stretching direction. Absorption intensity of the obtained spectral at 1340 cm$^{-1}$ was used to calculate the orientation function according to the Formula 4 (Non-Patent Document 4) described below. The condition of f=1 indicates a complete or perfect orientation, whereas the condition f=0 indicates a random orientation. The peak observed at 1340 cm$^{-1}$ is considered as indicating the absorption induced by a methylene in an ethylene glycol unit of PET.

$$\begin{aligned} f &= (3 \langle \cos^2\theta \rangle - 1)/2 \\ &= [(R-1)(R_0+2)]/[(R+2)(R_0-1)] \\ &= (1-D)/[c(2D+1)] \\ &= -2 \times (1-D)/(2D+1) \end{aligned} \quad \text{(Formula 4)}$$

where:
c=(3 cos$^2\beta$−1)/2;
β=90°, an angle of transition dipole moment with respect to an axis of molecular chain;
θ: an angle of molecular chain with respect to the stretching direction;
R$_0$=2 cot$^2\beta$;
1/R=D=(I⊥)/(I//) (A value of D becomes larger as PET is more highly molecularly oriented);
I⊥=absorption intensity measured when polarizing light is entered in a direction perpendicular to the stretching direction; and
I//=absorption intensity measured when polarizing light is entered in a direction parallel to the stretching direction.

(Evaluation of Orientation Function of PVA)

A Fourier Transform Infrared Spectrometer (FT-IR) (SPECTRUM 2000 from PerkinElmer, Inc.) was used as the measurement device. Attenuated total reflection (ATR) of polarizing light was measured to evaluate the surface of the PVA resin layer. The orientation function was calculated in the following manner. Measurements were made on the polarizing light in the directions of 0° and 90° with respect to the stretching direction. Absorption Intensity of the obtained spectral at 2941 cm$^{-1}$ was used to calculate the orientation function according to the above Formula 4. Intensity at 3330 cm$^{-1}$ was used as a reference peak, intensity at 2941 cm$^{-1}$/ intensity at 3330 cm$^1$ was calculated as the intensity I. The condition of f=1 indicates the complete or perfect orientation, whereas the condition f=0 indicates a random orientation. The peak observed at 2941 cm$^1$ is considered to be absorption induced by vibration of the main chain of PVA (—CH$_2$—).

(Evaluation of Crystallization Degree of PVA)

A Fourier Transform Infrared Spectrometer (FT-IR) (SPECTRUM 2000 from PerkinElmer, Inc.) was used as the measurement device. Attenuated total reflection (ATR) of polarizing light was measured to evaluate the surface of the PVA resin layer. The crystallization degree was calculated in the following manner. Measurements were made on the polarizing light in the directions of 0° and 90° with respect to the stretching direction. Intensities of the obtained spectral at 1141 cm$^1$ and at 1440 cm$^{-1}$ were used to calculate the crystallization degree. It was preliminarily ascertained that a level of the intensity at 1141 cm$^{-1}$ is correlated with an amount of crystal, and calculations were made using the intensity at 1440 cm$^{-1}$ as a reference peak to determine a crystallization index with the following equation (Formula 6). Further, a sample of PVA having a known crystallization degree was used to create a crystallization index and a calibration curve in advance, and the calibration curve was used to calculate the crystallization decree from the crystallization index (Formula 5).

$$\text{Crystallization degree} = 63.8 \times (\text{crystallization index}) - 44.8 \quad \text{(Formula 5)}$$

$$\text{Crystallization index} = ((I(1141 \text{ cm}^{-1})\ 0°+2 \times I(1141 \text{ cm}^{-1}))90°/3)/((I(1440 \text{ cm}^{-1})\ 0°+2 \times I(1440 \text{ cm}^{-1}))90°/3) \quad \text{(Formula 6)}$$

where:
I (1141 cm$^{-1}$) 0°=intensity at 1141 cm$^1$ when polarizing light is entered in a direction parallel to the stretching direction;

I (1141 cm$^{-1}$) 90°=intensity at 1141 cm$^1$ when polarizing light is entered in a direction perpendicular to the stretching direction;

I (1440 cm$^{-1}$) 0°=intensity at 1440 cm$^1$ when polarizing light is entered in a direction parallel to the stretching direction; and I (1440 cm$^{-1}$) 90°=intensity at 1440 cm$^1$ when polarizing light is entered in a direction perpendicular to the stretching direction.

Embodiments

FIGS. 11a to 11f and FIGS. 12a to 12j illustrate optical display devices each using the above polarizing film, according to various embodiments of the present invention.

Figure 11A:
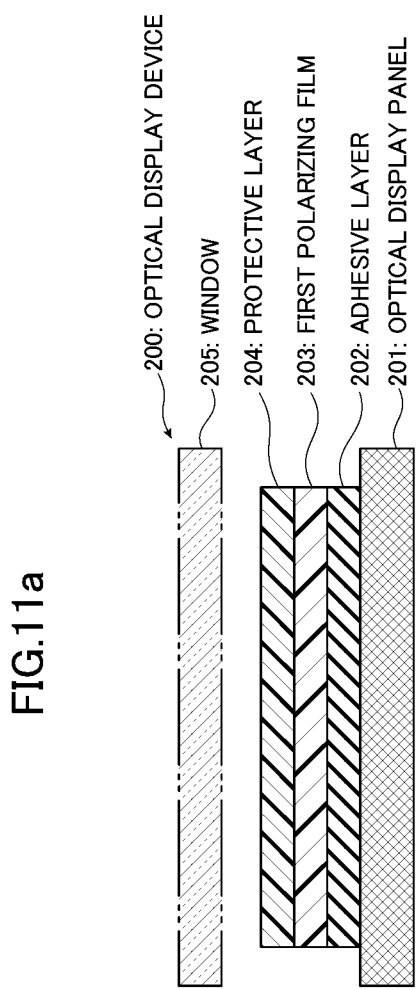
FIG. 11a is a sectional view illustrating an optical display device according to a first embodiment of the present invention.

FIG. 11a is a sectional view illustrating an optical display device according to a first embodiment of the present invention, wherein the optical display device has the most basic structure. This optical display device 200 comprises an optical display panel 201 which may be a liquid-crystal display panel or an organic EL display panel, and a polarizing film 203 joined to one of opposite surfaces of the display panel 201 through an optically transparent adhesive layer 202. A protective layer 204 made of an optically transparent resin material is bonded to an outer surface of the polarizing film 203. Optionally, a transparent window 205 as indicated by the dotted line may be disposed on an outer side of the protective layer 204, wherein the outer side of the protective layer 204 corresponds to a viewing side of the optical display device.

As a material for joining or bonding a layer, a film or the like to an object, it is possible to use, as a base polymer, at least one appropriately selected from the group consisting of acrylic-based polymer, silicone-based polymer, polyester, polyurethane, polyamide, polyether, fluorine or rubber-based polymer, isocyanate-based polymer, polyvinyl alcohol-based polymer, gelatin-based polymer, vinyl or latex-based polymer, and waterborne polyester.

As mentioned above, the polarizing film 203 is formed to have a thickness of 10 μm or less, and satisfy the aforementioned optical characteristics. This polarizing film 203 is extremely thin as compared to polarizing films used in this type of conventional optical display device, so that stress arising from expansion/contraction occurring depending on conditions of temperature or humidity becomes significantly smaller. Thus, it becomes possible to considerably reduce a risk that stress arising from expansion/contraction of the polarizing film causes deformation, such as warp, in the display panel 201 adjacent thereto, and drastically suppress deterioration in quality of display due to the deformation. In this structure, as the adhesive layer 202, a material having a diffusing function may be used, or a two-layer structure of an adhesive layer and a diffusion layer may be employed.

As a material for improving adhesion force of the adhesive layer 202, an anchor layer as disclosed, for example, in JP 2002-258269A (Patent Document 6), JP 2004-078143A (Patent Document 7) and JP 2007-171892A (Patent Document 8), may be provided. A binder resin is not limited to a particular type, as long as it is capable of improving anchoring force of the adhesive layer. Specifically, it is possible to use resin (polymer) having an organic reactive group, such as epoxy-based resins, polyurethane-based resins, polyester-based resins, polymers including an amino group in molecules, ester urethane-based resins, or acrylic-based resins including an oxazoline group.

Further, an antistatic agent as disclosed, for example, in JP 2004-338379A (Patent Document 9) may be added to the anchor layer to provide an antistatic capability thereto. The antistatic agent for providing an antistatic capability may includes an ionic surfactant-based material, a conductive polymer-based material such as polyaniline, polythiophene, polypyrrole or polyquinoxaline, and a metal oxide-based material such as tin oxide, antimony oxide or indium oxide. Particularly in view of optical characteristics, appearance, antistatic effect and stability of antistatic effects during heating or humidification, it is preferable to use the conductive polymer-based material. Among the conductive polymer-based materials, it is particularly preferable to use a water-soluble conductive polymer such as polyaniline or polythiophene, or a water-dispersible conductive polymer. When the water-soluble conductive polymer or the water-dispersible conductive polymer is used as a material for forming an antistatic layer, it becomes possible to suppress transformation of an optical film substrate due to an organic solvent during coating.

As a material of the protective layer 204, it is typical to use a thermoplastic resin having an excellent transparency, mechanical strength, thermal stability, water barrier properties, isotropy, etc. Specifically, the thermoplastic resin may include cellulosic resin such as triacetylcellulose, polyester resin, polyethersulfone resin, polysulphone resin, polycarbonate resin, polyamide resin, polyimide resin, polyolefin resin, (meta) acrylic resin, cyclic polyolefin resin (norbornene-based resin), polyarylate resin, polystyrene resin, and polyvinyl alcohol resin, and a mixture of two or more thereof.

A surface of the protective layer 204 to which the polarizing film 203 is not to be bonded may be subjected to a hard coat treatment, or an anti-reflection treatment, an anti-sticking treatment, or an optical diffusion or anti-glare treatment, to form a surface-treated layer therein or thereon. The surface-treated layer may contain an ultraviolet (UV) absorber. Preferably, in order to improve humidity resistance of the polarizing film, the surface-treated layer has a low moisture permeability. The hard coat treatment is intended to prevent damage to a surface of the polarizing film. For example, an appropriate UV-curable resin such as an acrylic or silicone-based resin may be applied to the surface of the transparent protective layer to form thereon a cured film (hard coat layer) excellent in hardness, slip characteristics, etc. The anti-reflection treatment is intended to prevent reflection of external light at a surface of the polarizing film. For example, an anti-reflection effect may be achieved by forming a thin layer for preventing reflection by utilizing a reflected-light attenuating or canceling effect based on an optical interference action, as disclosed in the Patent Document 10 (JP 2005-248173A), or a low reflecting layer having a microstructure capable of providing a low reflectance to a surface, as disclosed in the Patent Document 11 (JP 2011-002759A). The anti-sticking treatment is intended to prevent sticking with an adjacent layer (e.g., a diffuser plate on a backlight side). The anti-glare treatment is intended to prevent the external light from being reflected at a surface of the polarizing film to hinder viewing of light transmitted through the polarizing film, etc. For example, a microscopic undulating structure may be formed in the surface of the transparent protective layer by surface-roughening such as sandblasting or embossing, blending of transparent particles or any other appropriate technique. The anti-glare treatment may additionally serve as a diffusing layer for diffusing light transmitted through the polarizing film to widen a viewing angle (viewing-angle widening function, etc.). Preferably, the hard coat layer has a pencil hardness of 2H or more.

Figure 11B:
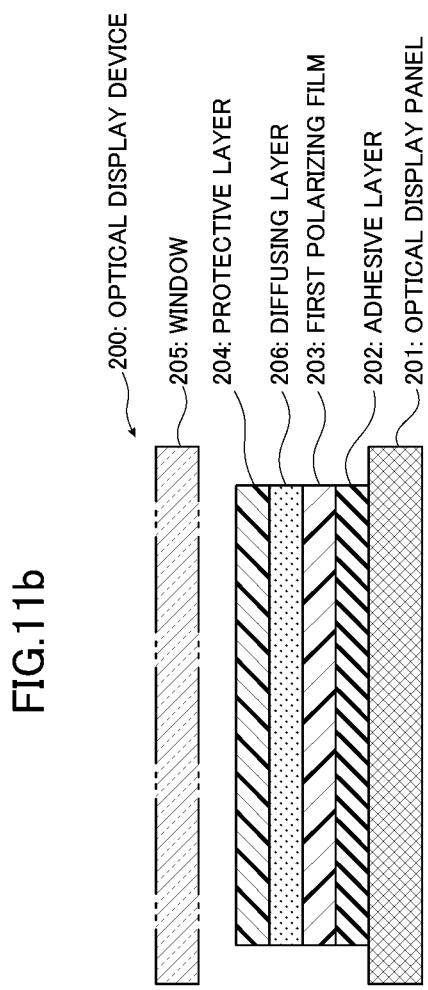
FIG. 11b is a sectional view illustrating an example of modification of the optical display device according to the first embodiment.
Figure 11C:
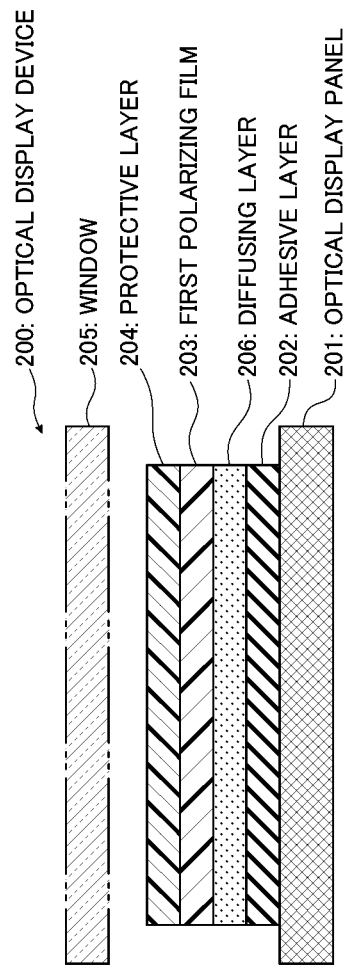
FIG. 11c is a sectional view illustrating another example of modification of the optical display device according to the first embodiment.

An optical display device illustrated in FIG. 11b has substantially the same structure as that illustrated in FIG. 11a, except that a diffusing layer 206 is disposed between the polarizing film 203 and the protective layer 204. In a structure illustrated in FIG. 11c, the diffusing layer 206 is disposed between the adhesive layer 202 and the polarizing film 203.

Figure 11D:
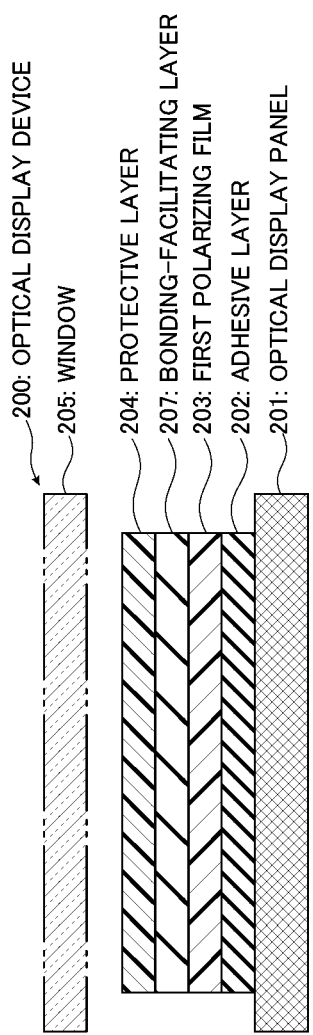
FIG. 11d is a sectional view illustrating yet another example of the modification of the optical display device according to the first embodiment.

An optical display device illustrated in FIG. 11d has fundamentally the same structure as that illustrated in FIG. 11a, except that the polarizing film 203 is bonded to the protective layer 204 through a bonding-facilitating layer 207. A material for use as the bonding-facilitating layer is commonly known to those skilled in the art.

Figure 11E:
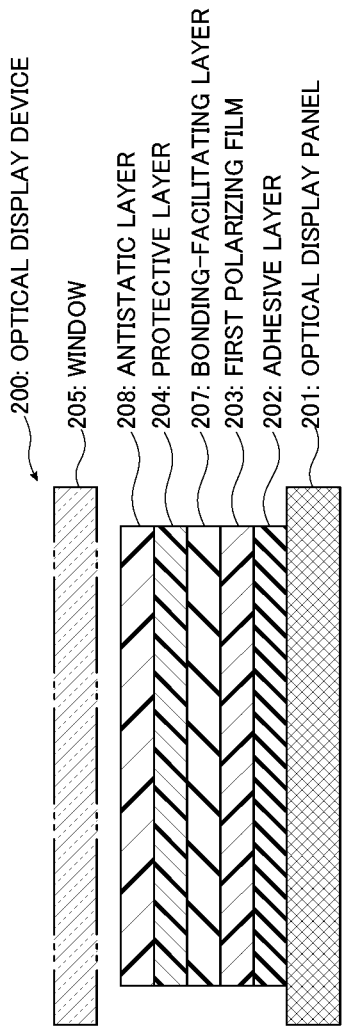
FIG. 11e is a sectional view illustrating still another example of the modification of the optical display device according to the first embodiment.

An optical display device illustrated in FIG. 11e is different from the optical display device illustrated in FIG. 11d, only in that an antistatic layer 208 is provided on an outer side of the protective layer 204. In an optical display device 200 illustrated in FIG. 11f, a ¼ wavelength phase difference layer 209 is disposed between the protective layer 204 and the antistatic layer 208 in the optical display device illustrated in FIG. 11e. Alternatively, the ¼ wavelength phase difference layer 209 may be disposed on the viewing side with respect to the antistatic layer 208. In this structure, the ¼ wavelength phase difference layer 209 is disposed on the viewing side with respect to the polarizing film 203, so that light emitted from the display panel 201 via the polarizing film 203 is converted into circularly-polarized light when it exits from the ¼ wavelength phase difference layer 209. The optical display device having this structure provides an advantage of being able to eliminate a problem with viewing even when a viewer wears a polarized sunglass.

Figure 12A:
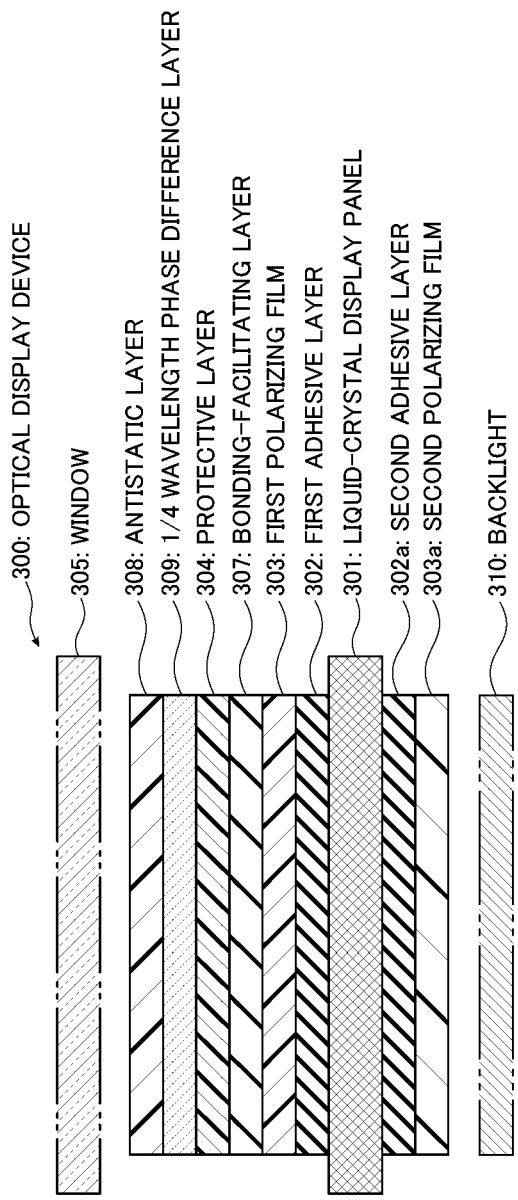
FIG. 12a is a sectional view illustrating an optical display device according to a second embodiment of the present invention.

FIG. 12a illustrates an optical display device 300 according to a second embodiment of the present invention, wherein the optical display device 300 has a transmission type liquid-crystal display panel 301 as an optical display panel. A structure of the optical display device 300 on the viewing side with respect to the liquid-crystal display panel 301 is substantially the same as that of the optical display device 200 illustrated in FIG. 11f. Specifically, a first polarizing film 303 is joined to a viewing-side surface of the liquid-crystal display panel 301 through a first adhesive layer 302, and a protective layer 304 is joined to the first polarizing film 303 through a bonding-facilitating layer 307. A ¼ wavelength phase difference film 309 is joined to the protective layer 304. Optionally, an antistatic layer 308 may be formed on the ¼ wavelength phase difference film 309. Optionally, a window 305 may also be disposed on an outer side of the ¼ wavelength phase difference film 309. In the second embodiment illustrated in FIG. 12a, a second polarizing film 303a is placed on the other surface of the liquid-crystal display panel 301 through a second adhesive layer 302a. As is commonly known in the field of transmission type liquid-crystal display devices, a backlight 310 is disposed on a back side of the second polarizing film 303a.

Figure 12B:
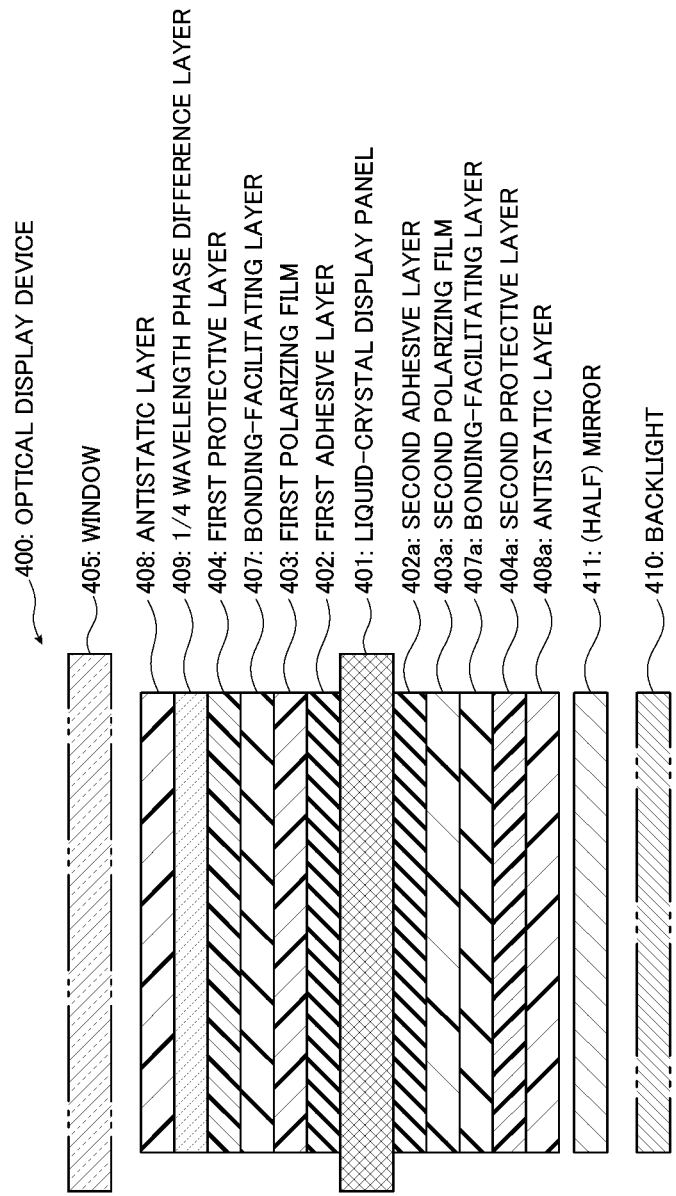
FIG. 12b is a sectional view illustrating an optical display device according to a third embodiment of the present invention.

FIG. 12b illustrates an optical display device 400 according to a third embodiment of the present invention, wherein the optical display device 400 has a reflection type liquid-crystal display panel 401 as an optical display panel. In the third embodiment, a structure of the optical display device 400 on the viewing side with respect to the liquid-crystal display panel 401 is substantially the same as that of the optical display device 300 illustrated in FIG. 12a. Specifically, a first polarizing film 403 is joined to a viewing-side surface of the liquid-crystal display panel 401 through a first adhesive layer 402, and a first protective layer 404 is joined to the first polarizing film 403 through a bonding-facilitating layer 407. A ¼ wavelength phase difference film 409 is joined to the first protective layer 404. Optionally, an antistatic layer 408 may be formed on the ¼ wavelength phase difference film 409. Optionally, a window 405 may also be disposed on an outer side of the ¼ wavelength phase difference film 409.

In the third embodiment illustrated in FIG. 12b, a second polarizing film 403a is joined to the other surface of the liquid-crystal display panel 401 through a second adhesive layer 402a, and a second protective layer 404a is joined to the second polarizing film 403a through a bonding-facilitating layer 407a. Optionally, an antistatic layer 408a may be formed on the second protective layer 404a. A minor 411 is disposed on a back side of the second protective layer 404a to reflect light transmitted through the liquid-crystal display panel 401, toward the liquid-crystal display panel 401. In this structure, external light entering from the viewing side is reflected by the minor 411 and, after being transmitted through the liquid-crystal display panel 401, emitted to the outside, so that a display can be viewed from the viewing side.

Figure 12C:
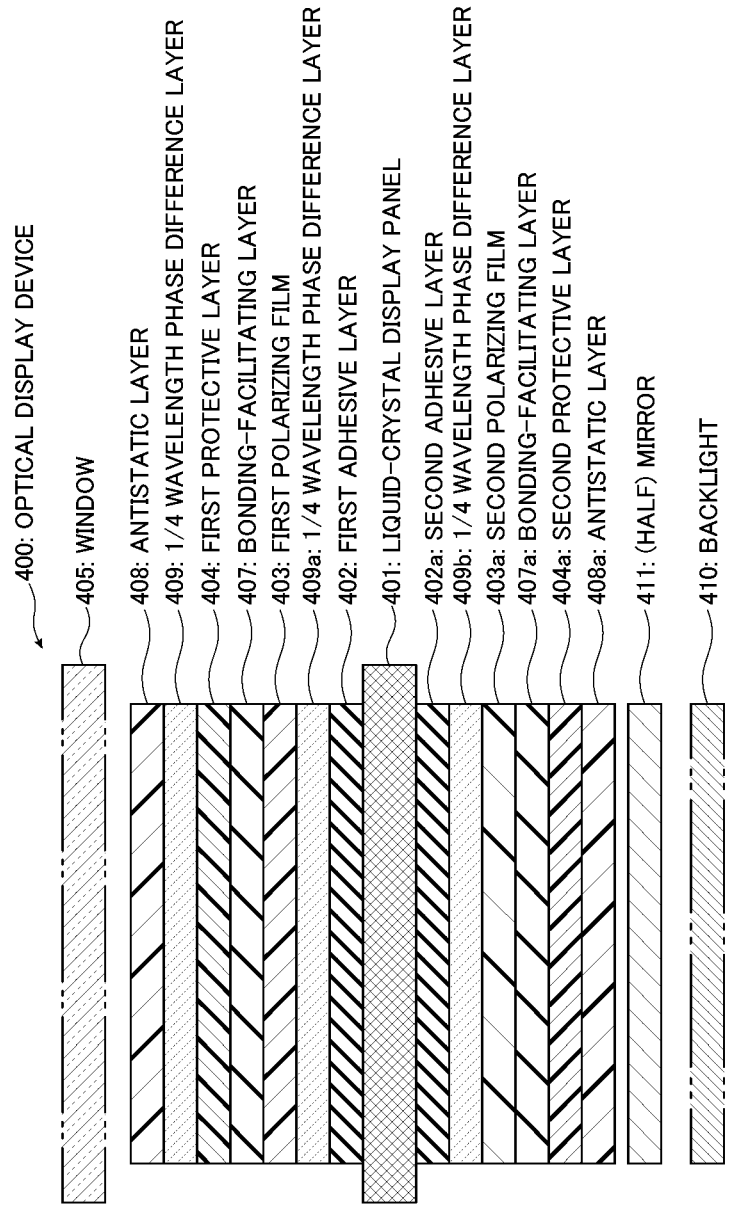
FIG. 12c is a sectional view illustrating an example of modification of the optical display device according to the third embodiment of the present invention.

In the third embodiment, the mirror 411 may be a half mirror adapted to transmit therethrough a part of incident light. In cases where the minor 411 is made up of a half minor, a backlight 410 is disposed on a back side of the minor 411, as indicated by the two-dot chain line in FIG. 12b. In this structure, when external light is dark, a display operation can be performed under a condition that the backlight 410 is turned on, FIG. 12c illustrates an example of modification of the optical display device 400 according to the third embodiment. An optical display device 400 illustrated in FIG. 12c is different from that illustrated in FIG. 12b, in that a ¼ wavelength phase difference layer 409a is disposed between the first polarizing film 403 and the liquid-crystal display panel 401, and a ¼ wavelength phase difference layer 409b is disposed between the second polarizing film 403a and the liquid-crystal display panel 401. Specifically, the ¼ wavelength phase difference layer 409a has one surface joined to the first polarizing film 403, and the other surface joined to a viewing-side surface of the liquid-crystal display panel 401 through the first adhesive layer 402. Similarly, the ¼ wavelength phase difference layer 409b has one surface joined to the second polarizing film 403a, and the other surface joined to a backlight-side surface of the liquid-crystal display panel 401 through the second adhesive layer 402a.

In this structure, each of the ¼ wavelength phase difference layer 409a and the ¼ wavelength phase difference layer 409b has a function of enhancing display luminance (brightness) of the display device.

In the first to third embodiments, the first or second protective layer may be made of any of the aforementioned materials. Further, in cases where the protective layer is directly joined to the polarizing film, the protective layer may be formed using a thermoplastic resin substrate subjected to stretching together with a PVA type resin layer during a process of forming the polarizing film. In this case, the thermoplastic resin substrate may be a non-crystallizable polyethylene terephthalate (PET) substrate.

Figure 12D:
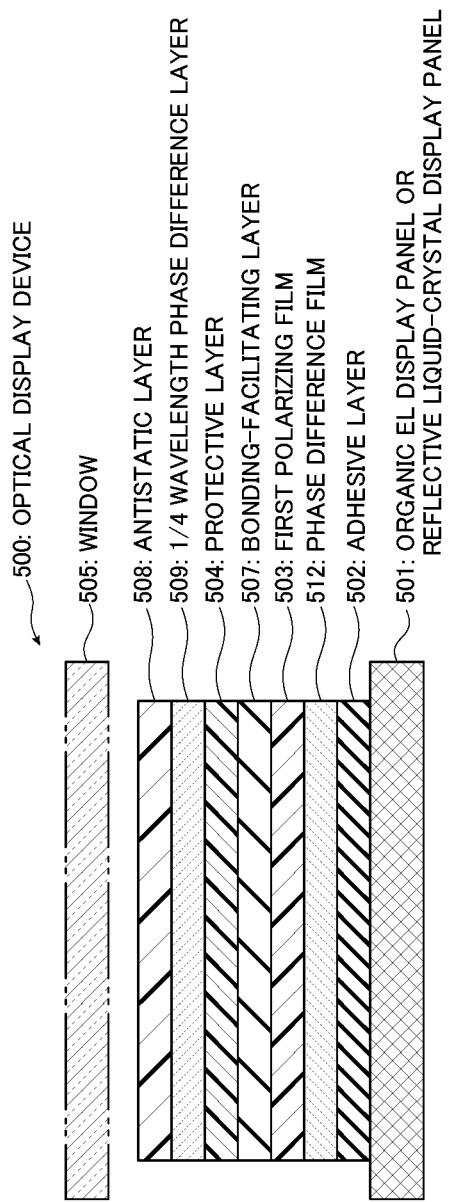
FIG. 12d is a sectional view illustrating an optical display device according to a fourth embodiment of the present invention.

FIG. 12d illustrates an optical display device 500 according to a fourth embodiment of the present invention, wherein the optical display device 500 has optical display panel 501 formed as an organic EL display panel or a reflection type liquid-crystal display panel. In the fourth embodiment, a phase difference film 512 is joined to a viewing-side surface of a display panel 501 through an adhesive layer 502, and a polarizing film 503 is joined to the phase difference film 512. The polarizing film 503 is joined to a protective layer 504 through a bonding-facilitating layer 507, and a ¼ wavelength phase difference film 509 is joined to the protective layer 504. Optionally, an antistatic layer 508 may be formed on the ¼ wavelength phase difference film 509. Optionally, a window

505 may also be disposed on an outer side of the ¼ wavelength phase difference film 509. The phase difference film 512 is used to prevent the occurrence of a situation where light entered from a viewing-side surface of the polarizing film 503 into an inside thereof is internally reflected and emitted toward the viewing side.

The phase difference film 512 disposed between the polarizing film 503 and the display panel 501 may be formed as a ¼ wavelength phase difference layer. In this case, the phase difference film may be formed as a biaxial phase difference film satisfying the following relationship: nx>nz>ny, wherein: nx is a refractive index in a slow axis direction; ny is a refractive index in an in-plane direction perpendicular to the slow axis direction; and nz is a refractive index in a thickness direction. In this structure, the phase difference film 512 is disposed to allow the slow axis to be located at 45 degrees with respect to an absorption axis of the polarizing film 503. This structure makes it possible to additionally obtain an internal reflection-blocking effect in an oblique direction. Generally, a mirror is disposed, but not illustrated, on the back side of the display panel 501.

Figure 12E:
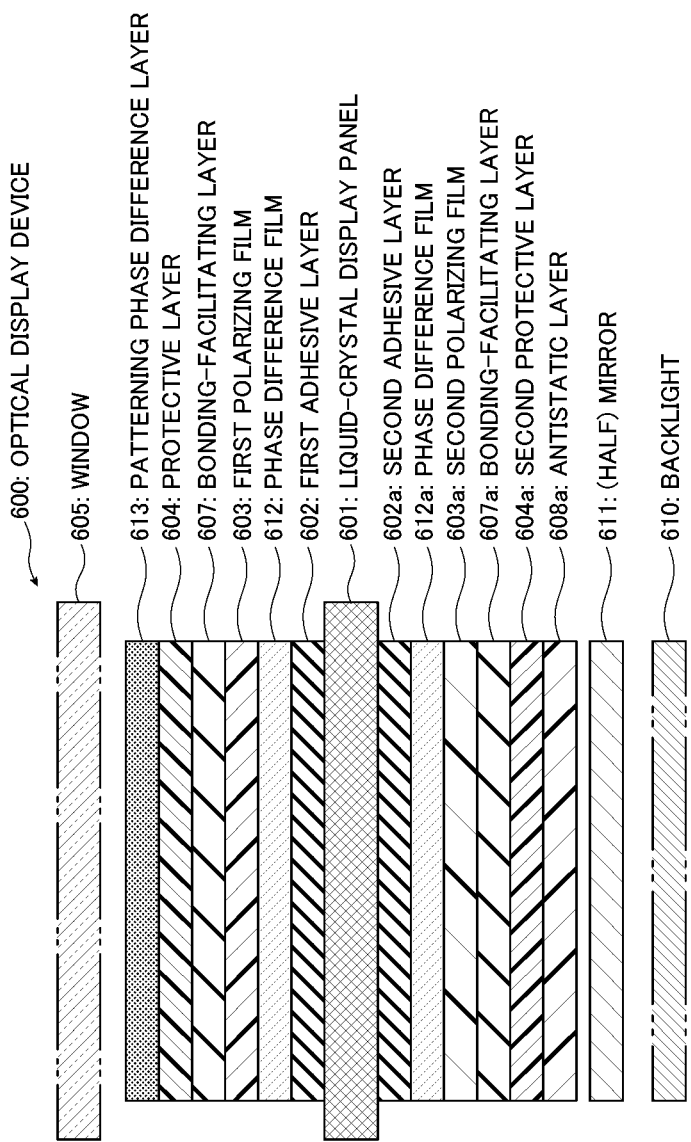
FIG. 12e is a sectional view illustrating an optical display device according to a fifth embodiment of the present invention.

FIG. 12e illustrates an optical display device 600 according to a fifth embodiment of the present invention. In the fourth embodiment, an optical display panel is composed of a transmission type IPS liquid-crystal display panel 601. A phase difference film 612 is joined to a viewing-side surface of the display panel 601 through a first adhesive layer 602, and a first polarizing film 603 is joined to the phase difference film 612. The polarizing film 603 is joined to a first protective layer 604 through a bonding-facilitating layer 607, and the first protective layer 604 is joined to a patterning phase difference layer 613. The patterning phase difference layer 613 has a function of allow respective polarization states of an image for right eye and an image for left eye output from the display panel to become different from each other. Optionally, a window 605 may be disposed on an outer side of the patterning phase difference layer 613.

A phase difference film 612a is joined to a back surface of the liquid-crystal display panel 610 through a second adhesive layer 602a, and a second polarizing film 603a is joined to the phase difference film 612a. A second protective layer 604a is joined to the second polarizing film 603a through a bonding-facilitating layer 607a. Optionally, an antistatic layer 608a may be formed on the second protective layer 604a. In cases where liquid-crystal display panel 601 is a reflection type display panel, a mirror 611 is disposed on a back side of the second protective layer 604a to reflect light transmitted through the liquid-crystal display panel 601, toward the liquid-crystal display panel 601. Further, when the minor 611 is formed as a half mirror, a backlight 610 is disposed behind the mirror 611. In cases where liquid-crystal display panel 610 is a transmission type display panel, the mirror 611 is omitted, and only the backlight 610 is disposed.

In the fifth embodiment, each or one of the phase difference films 612, 612a may be formed as a biaxial phase difference film satisfying the following relationship: nx>nz>ny, wherein: nx is a refractive index in a slow axis direction; ny is a refractive index in an in-plane direction perpendicular to the slow axis direction; and nz is a refractive index in a thickness direction. Further, the phase difference film 612a may have a two-layer structure consisting of a first biaxial phase difference film satisfying the relationship of nx>nz>ny, and a second biaxial phase difference film satisfying the relationship of nx>ny>nz. In these structures, the phase difference film is disposed to allow the slow axis to be located at 0 or 90 degrees with respect to an absorption axis of the associated polarizing film. This arrangement is effective in correcting a crossed axes angle of the polarizing films when viewing from an oblique angle.

The structure illustrated in FIG. 12e may also be used when the liquid-crystal display panel 601 is a transmission type VA liquid-crystal display panel. In this case, each of the phase difference films 612, 612a is formed as a biaxial phase difference film satisfying the following relationship: nx>nz>ny, or a biaxial phase difference film satisfying the following relationship: nx>ny>nz. Alternatively, each of the phase difference films 612, 612a may be formed as a phase difference film satisfying the following relationship: nx>ny≈nz, or a phase difference film satisfying the following relationship: nx≈ny>nz. In either case, the phase difference film is disposed to allow the slow axis to be located at 0 or 90 degrees with respect to an absorption axis of the associated polarizing film. This arrangement is effective in compensation of thicknesswise phase difference in liquid crystal, in addition to correction of a crossed axes angle of the polarizing films when viewing from an oblique angle.

Figure 12F:
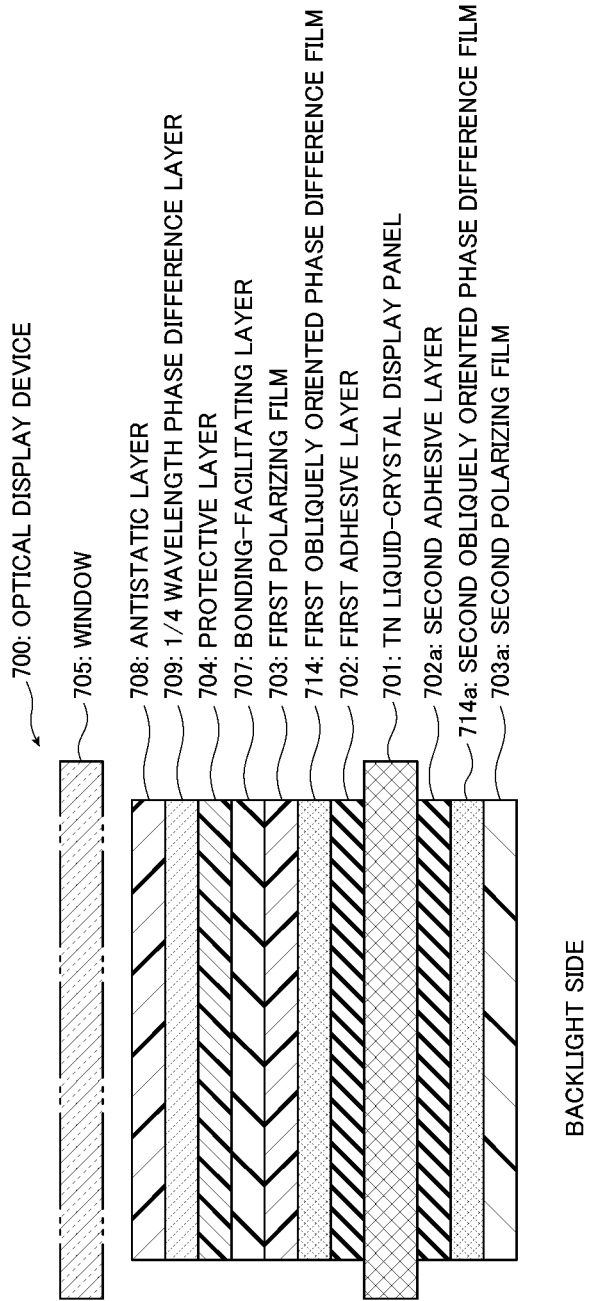
FIG. 12f is a sectional view illustrating an optical display device according to a sixth embodiment of the present invention.

FIG. 12f illustrates an optical display device 700 according to a sixth embodiment of the present invention, wherein an optical display panel 701 is formed using TN liquid crystal. The structure in the sixth embodiment is fundamentally the same as that illustrated in FIG. 12a, except that, due to the TN liquid-crystal display panel 701, a first obliquely oriented phase difference film 714 and a second obliquely oriented phase difference film 714a are disposed between a first adhesive layer 720 and a first polarizing film 703 and between a second adhesive layer 720a and a second polarizing film 703a, respectively. The first and second obliquely oriented phase difference films 714, 714a carry out a function of viewing angle compensation in an ON state of TN liquid crystal. The viewing angle compensation of the obliquely oriented phase difference film is described in the Non-Patent Document 2.

FIG. 12g illustrates an optical display device 800 according to a seventh embodiment of the present invention. In the seventh embodiment, the optical display device 800 has a reflection type liquid-crystal display panel 810. A phase difference film 809 is joined to one of opposite surfaces of the liquid-crystal display panel 801 through an adhesive layer 802, and a polarizing film 803 is joined to the phase difference film 809. The polarizing film 803 is joined to a protective layer 804 through a bonding-facilitating layer 807. Optionally, an antistatic layer 808 is formed on the protective layer 804. Optionally, a window 805 may be disposed on a viewing side of the protective layer 804. The phase difference film 809 in the seventh embodiment is designed to convert linearly-polarized light from the polarizing film 803 into circularly-polarized light to thereby prevent the occurrence of a situation where reflected light from a surface of the liquid-crystal display panel 801 is emitted from a viewing side. Typically, a ¼ wavelength phase difference film is used as the phase difference film 809.

Figure 12H:
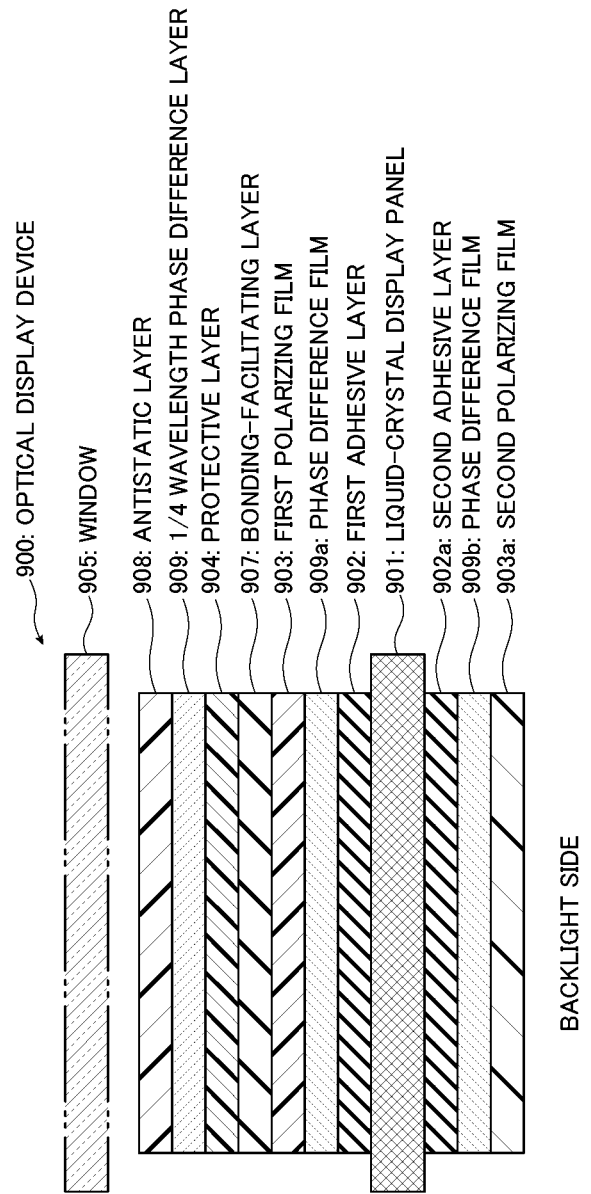
FIG. 12h is a sectional view illustrating an optical display device according to an eighth embodiment of the present invention.

FIG. 12h illustrates an optical display device 900 according to an eighth embodiment of the present invention, wherein the optical display device 900 has a transmission type liquid-crystal display panel 910. A phase difference film 909a is joined to the liquid-crystal display panel 901 through a first optically transparent adhesive layer 902, and a first polarizing film 903 is joined to the phase difference film 909a. The first polarizing film 903 is joined to a protective layer 904 through a bonding-facilitating layer 907. A ¼ wavelength phase difference film 909 is joined to the protective layer 904. Optionally, an antistatic layer 908 is formed on the ¼ wavelength phase difference film 909. Optionally, a window 905 may be disposed on a viewing side of the ¼ wavelength phase difference film 909. A phase difference film 909b is joined to a back surface of the liquid-crystal display panel 901 through a second optically transparent adhesive layer 902a. In the eighth embodiment, the phase difference films 909a, 909b carry out a function of blocking internal reflection and a function of viewing angle compensation.

FIG. 12i illustrates an optical display device 1000 according to a ninth embodiment of the present invention, wherein the optical display device 1000 has a touch input sensor function. A structure of a device body of the optical display device 1000 is substantially the same as that illustrated in FIG. 12h. Thus, a corresponding element is defined by the same reference numeral or code as that in FIG. 12h, and its description will be omitted. In the ninth embodiment, a touch panel laminate 1001 is disposed between a ¼ wavelength phase difference film 909 and a window 905. The touch panel laminate 1001 may be a capacitive touch panel or may be a resistive touch panel. In the capacitive tough panel, as illustrated in FIG. 12i, an upper patterned electrode 1001a and a lower patterned electrode 1001b are disposed opposed to each other while interposing a dielectric layer 1001c therebetween. As the capacitive touch panel laminate, any conventional structure may be employed as well as the illustrated structure. In cases where the touch panel laminate 1001 is formed as a resistive type, a spacer may be disposed between an upper electrode and a lower electrode to define an air gap between the two electrodes. Various configurations of such a touch panel laminate are known, and any one of them may be employed in this embodiment.

FIG. 12j illustrates an optical display device 1100 according to a tenth embodiment of the present invention, wherein the optical display device 1100 has a touch input sensor function. As with the ninth embodiment, a structure of a device body of the optical display device 1100 is substantially the same as that illustrated in FIG. 12h. Thus, a corresponding element is defined by the same reference numeral or code as that in FIG. 12h, and its description will be omitted. In the tenth embodiment, a touch panel laminate 1101 is disposed between a liquid-crystal display panel 901 and a phase difference film 909a. As with the ninth embodiment illustrated FIG. 12i, the touch panel laminate 1101 in the tenth embodiment may be a capacitive touch panel or may be a resistive touch panel.

EXPLANATION OF CODES

| | |
|---|---|
| 1: | Substrate |
| 2: | PVA type resin layer |
| 3: | Polarizing film |
| 4: | Optically functional film |
| 5: | Second optically functional film |
| 7: | PVA resin layer-including laminate |
| 8: | Stretched laminate |
| 8': | Roll of stretched laminate |
| 8": | Insolubilized stretched laminate |
| 9: | Dyed laminate |
| 9': | Cross-linked dyed laminate |
| 10: | Optical film laminate |
| 11: | Optically functional film laminate |
| 20: | Laminate forming apparatus |
| 21: | Coating means |
| 22: | Drying means |
| 23: | Surface modifying unit |
| 30: | Preliminary in-air stretching apparatus |
| 31: | Stretching means |
| 32: | Take-up unit |
| 33: | Oven |
| 40: | Dyeing apparatus |
| 41: | Dyeing solution |
| 42: | Dyeing bath |
| 43: | Feeding unit |
| 50: | In-boric-acid-solution stretching apparatus |
| 51: | Boric acid aqueous solution |
| 52: | Boric acid aqueous solution bath |
| 53: | Stretching means |
| 60: | Insolubilization apparatus |
| 61: | Insolubilizing boric acid aqueous solution |
| 70: | Cross-linking apparatus |
| 71: | Cross-linking boric acid aqueous solution |
| 80: | Cleaning apparatus |
| 81: | Cleaning solution |
| 90: | Drying apparatus |
| 91: | Take-up unit |
| 100: | Lamination/transfer apparatus |
| 101: | Unrolling/laminating apparatus |
| 102: | Take-up/transfer apparatus |
| (A): | Laminate preparation step |
| (B): | Preliminary in-air stretching step |
| (C): | Dyeing step |
| (D): | In-boric-acid-solution stretching step |
| (E): | First insolubilization step |
| (F): | Cross-linking step including second insolubilization |
| (G): | Cleaning step |
| (H): | Drying step |
| (I): | Laminating/transfer process |

What is claimed is:

1. An optical display device comprising:
a first polarizing film made of comprising a layer of a polyvinyl alcohol type resin, said layer of polyvinyl alcohol type resin including dichroic material impregnated therein in a molecularly oriented dichroic material therein state, said first polarizing film having a thickness of 10 μm or less with oriented molecules of the polyvinyl alcohol type resin layer, the dichroic material impregnated in the polyvinyl alcohol type resin layer being iodine present in the form of poly-iodine ion complex oriented in the polyvinyl alcohol type resin layer substantially in one direction, the first polarizing film having optical properties and satisfying conditions expressed by the following formulas:

$P > -(10^{0.929T-42.4}-1) \times 100$ (where $T < 42.3$); and
$P \geq 99.9$ (where $T \geq 42.3$), wherein T is a single layer transmittance, and P is a polarization rate;
a display panel having a first surface and a second surface opposite the first surface;
an optically transparent adhesive layer configured to join a first surface of the first polarizing film the first surface display panel; and
a protective layer, the first polarizing film having a second surface, opposite the first surface, joined to the protective layer.

2. The optical display device of claim 1, wherein the protective layer comprises an ultraviolet curable resin selected from the group consisting of acrylic resins and silicone-based resins.

3. The optical display device of claim 1, wherein the protective layer has a pencil hardness of at least 2H.

4. The optical display device of claim 1, further comprising a diffusion layer between the first polarizing film and the protective layer.

5. The optical display device of claim 1, wherein the optically transparent adhesive is a diffusion layer.

6. The optical display device of claim 1, further comprising a quarter wavelength phase difference layer over the second surface of the first polarizing film, the protective layer disposed between the quarter wavelength phase difference layer and the first polarizing film.

7. The optical display device of claim 6, wherein the quarter wavelength phase difference layer is configured to convert light from the display panel into circularly polarized light.

8. The optical display device of claim 1, further comprising an antistatic layer over the second surface of the first polarizing film, the protective layer disposed between the antistatic layer and the first polarizing film.

9. The optical display device of claim 1, further comprising a second polarizing film attached to the second surface of the display panel.

10. An optical display device comprising:
a first polarizing film made of comprising a layer of a polyvinyl alcohol type resin, said layer of polyvinyl alcohol type resin including dichroic material impregnated therein in a molecularly oriented dichroic material therein state, said first polarizing film having a thickness ranging from 3 µm to 5 µm with oriented molecules of the polyvinyl alcohol type resin layer, the dichroic material impregnated in the polyvinyl alcohol type resin layer being iodine present in the form of poly-iodine ion complex oriented in the polyvinyl alcohol type resin layer substantially in one direction, the first polarizing film having optical properties and satisfying conditions expressed by the following formulas:

$P > -(10^{0.929T-42.4}-1) \times 100$ (where $T<42.3$); and
$P \geq 99.9$ (where $T \geq 42.3$), wherein T is a single layer transmittance, and P is a polarization rate;
a display panel having a first surface and a second surface opposite the first surface;
an optically transparent adhesive layer configured to join a first surface of the first polarizing film the first surface of display panel; and
a protective layer, the first polarizing film having a second surface, opposite the first surface, joined to the protective layer.

11. The optical display device of claim 10, wherein the protective layer comprises an ultraviolet curable resin selected from the group consisting of acrylic resins and silicone-based resins.

12. The optical display device of claim 10, wherein the protective layer has a pencil hardness of at least 2H.

13. The optical display device of claim 10, further comprising a diffusion layer between the first polarizing film and the protective layer.

14. The optical display device of claim 10, wherein the optically transparent adhesive is a diffusion layer.

15. The optical display device of claim 10, further comprising a quarter wavelength phase difference layer over the second surface of the first polarizing film, the protective layer disposed between the quarter wavelength phase difference layer and the first polarizing film.

16. The optical display device of claim 15, wherein the quarter wavelength phase difference layer is configured to convert light from the display panel into circularly polarized light.

17. The optical display device of claim 10, further comprising an antistatic layer over the second surface of the first polarizing film, the protective layer disposed between the antistatic layer and the first polarizing film.

18. The optical display device of claim 10, further comprising a second polarizing film attached to the second surface of the display panel.

19. An optical display device comprising:
a first polarizing film made of comprising a layer of a polyvinyl alcohol type resin, said layer of polyvinyl alcohol type resin including dichroic material impregnated therein in a molecularly oriented dichroic material therein state, said first polarizing film having a thickness of 10 µm or less with oriented molecules of the polyvinyl alcohol type resin layer, the dichroic material impregnated in the polyvinyl alcohol type resin layer being iodine present in the form of poly-iodine ion complex oriented in the polyvinyl alcohol type resin layer substantially in one direction, the first polarizing film having optical properties and satisfying conditions expressed by the following formulas:

$P > -(10^{0.929T-42.4}-1) \times 100$ (where $T<42.3$); and
$P \geq 99.9$ (where $T \geq 42.3$), wherein T is a single layer transmittance, and P is a polarization rate;
a display panel having a first surface and a second surface opposite the first surface;
an optically transparent adhesive layer configured to join a first surface of the first polarizing film the first surface display panel;
a protective layer, the first polarizing film having a second surface, opposite the first surface, joined to the protective layer; and
a quarter wavelength phase difference layer over the second surface of the first polarizing film, the protective layer disposed between the quarter wavelength phase difference layer and the first polarizing film, wherein the quarter wavelength phase difference layer is configured to convert light from the display panel into circularly polarized light.

20. The optical display device of claim 19, further comprising:
a second polarizing film attached to the second surface of the display panel; and
a backlight configured to emit light incident on the second surface of the display panel, wherein the second polarizing film is disposed between the backlight and the display panel.

* * * * *